US012596461B2

(12) United States Patent
Han et al.

(10) Patent No.: US 12,596,461 B2
(45) Date of Patent: Apr. 7, 2026

(54) ELECTRONIC DEVICE

(71) Applicant: Samsung Display Co., Ltd., Yongin-si (KR)

(72) Inventors: Jeongyun Han, Yongin-si (KR); Gyeongnam Bang, Yongin-si (KR); Hayeong Nam, Yongin-si (KR); Yeri Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/963,092

(22) Filed: Nov. 27, 2024

(65) Prior Publication Data

US 2025/0208739 A1 Jun. 26, 2025

Related U.S. Application Data

(63) Continuation of application No. 18/821,995, filed on Aug. 30, 2024, now Pat. No. 12,197,687.

(30) Foreign Application Priority Data

Dec. 22, 2023 (KR) ........................ 10-2023-0189453
Jun. 14, 2024 (KR) ........................ 10-2024-0077741

(51) Int. Cl.
*G06F 3/044* (2006.01)
*G06F 3/041* (2006.01)
*H10K 59/40* (2023.01)

(52) U.S. Cl.
CPC .......... *G06F 3/0446* (2019.05); *G06F 3/0412* (2013.01); *G06F 3/04164* (2019.05);
(Continued)

(58) Field of Classification Search
CPC .. G06F 3/0446; G06F 3/0412; G06F 3/04164; G06F 3/0443; G06F 2203/04111;
(Continued)

(56) References Cited

U.S. PATENT DOCUMENTS

| | | | | |
|---|---|---|---|---|
| 9,519,174 B2 * | 12/2016 | Kim | ...................... | G06F 3/0446 |
| 9,740,344 B2 * | 8/2017 | Huang | .................. | G06F 3/0445 |

(Continued)

FOREIGN PATENT DOCUMENTS

| | | |
|---|---|---|
| EP | 2725463 A2 | 4/2014 |
| EP | 3493038 A1 | 6/2019 |

(Continued)

OTHER PUBLICATIONS

Partial European Search Report dated Apr. 15, 2025, issued in European Patent Application No. 24221860.0, 22 pages.

*Primary Examiner* — Amy Onyekaba
(74) *Attorney, Agent, or Firm* — Womble Bond Dickinson (US) LLP

(57) ABSTRACT

A sensor layer includes: first sensing electrodes extending in a first direction; second sensing electrodes extending in a second direction; and first electrodes extending in the first direction. The first sensing electrodes includes first sub electrodes, and the first electrodes includes second sub electrodes. The first sub electrodes includes first patterns, and a first bridge pattern electrically connected to the first patterns. Two first sub electrodes are electrically connected to each other at one end via a first connection line. Two second sub electrodes overlapping with the two first sub electrodes are connected to each other at a second end via a second connection line. The second connection line and another adjacent second connection line are electrically connected to each other via a third connection line. The first connection line is electrically connected to a first pad, and the third connection line is electrically connected to a second pad.

20 Claims, 43 Drawing Sheets

(52) U.S. Cl.
CPC .. *G06F 3/0443* (2019.05); *G06F 2203/04111*
(2013.01); *G06F 2203/04112* (2013.01); *H10K*
*59/40* (2023.02)

(58) Field of Classification Search
CPC ........ G06F 2203/04112; G06F 3/0445; G06F
3/046; G06F 2203/04104; G06F
2203/04106; H10K 59/40; H10K 59/131
See application file for complete search history.

(56) References Cited

U.S. PATENT DOCUMENTS

| | | | | |
|---|---|---|---|---|
| 10,025,435 | B2 * | 7/2018 | Chen ..................... | G06F 3/0445 |
| 11,474,639 | B2 * | 10/2022 | Kim ..................... | G06F 3/0412 |
| 11,625,118 | B2 * | 4/2023 | Kim ..................... | G06F 3/0412 |
| | | | | 345/173 |
| 11,782,550 | B2 | 10/2023 | Cho et al. | |
| 2013/0027348 | A1 | 1/2013 | Oh et al. | |
| 2014/0111709 | A1 * | 4/2014 | Kim .................... | G02F 1/13338 |
| | | | | 349/12 |
| 2015/0193050 | A1 | 7/2015 | Chai et al. | |
| 2015/0242025 | A1 | 8/2015 | Cok | |
| 2016/0011694 | A1 * | 1/2016 | Lin ....................... | G06F 3/0412 |
| | | | | 345/174 |
| 2016/0041638 | A1 * | 2/2016 | Xie ....................... | G06F 3/0412 |
| | | | | 345/173 |
| 2019/0302942 | A1 | 10/2019 | Kim et al. | |
| 2020/0117304 | A1 * | 4/2020 | Lee ....................... | G06F 3/0443 |
| 2020/0125196 | A1 * | 4/2020 | Okuno .................. | G06F 3/0418 |
| 2021/0358996 | A1 * | 11/2021 | Lee ....................... | H01Q 1/243 |
| 2021/0373705 | A1 * | 12/2021 | Lee ....................... | G06F 3/0412 |
| 2021/0405818 | A1 * | 12/2021 | Kim ....................... | H10K 59/40 |
| 2022/0075481 | A1 * | 3/2022 | Kim ..................... | G06F 3/04166 |
| 2022/0147194 | A1 * | 5/2022 | Wang .................... | G06F 3/0448 |
| 2022/0391042 | A1 | 12/2022 | Xiang et al. | |
| 2022/0397980 | A1 | 12/2022 | Moon et al. | |
| 2022/0413656 | A1 * | 12/2022 | Wang .................... | G06F 3/0443 |
| 2023/0128245 | A1 * | 4/2023 | Huang ................ | G02F 1/13338 |
| | | | | 345/173 |
| 2023/0165112 | A1 * | 5/2023 | Yang .................... | H10K 59/131 |
| | | | | 257/91 |
| 2023/0214053 | A1 | 7/2023 | Lim | |
| 2023/0259238 | A1 * | 8/2023 | Kim .................. | G06V 40/1318 |
| | | | | 345/173 |
| 2023/0315224 | A1 * | 10/2023 | Lee ....................... | G06F 3/0416 |
| | | | | 345/175 |
| 2023/0341984 | A1 * | 10/2023 | Pang .................... | G06F 3/0446 |
| 2024/0012525 | A1 * | 1/2024 | Zhang .................. | G06F 3/0443 |
| 2024/0103671 | A1 | 3/2024 | Choi et al. | |
| 2024/0118766 | A1 | 4/2024 | Jeong et al. | |
| 2024/0220051 | A1 | 7/2024 | Han et al. | |
| 2024/0248571 | A1 | 7/2024 | Kim et al. | |

FOREIGN PATENT DOCUMENTS

| | | | |
|---|---|---|---|
| EP | 3767445 | A1 | 1/2021 |
| EP | 3869263 | A1 | 8/2021 |
| KR | 10-2011-0113035 | A | 10/2011 |
| KR | 10-2014-0096462 | A | 8/2014 |
| KR | 10-2016-0005596 | A | 1/2016 |
| KR | 10-2020-0060601 | A | 6/2020 |
| KR | 10-2022-0062191 | A | 5/2022 |
| KR | 10-2453868 | B1 | 10/2022 |
| WO | 2019/114053 | A1 | 6/2019 |

* cited by examiner

204dm
240
240t
220
220t

DR2
DR1
DR3

230-dpa  211a  230rt2  210t

DR2

DR3 DR1

ELECTRONIC DEVICE

CROSS-REFERENCE TO RELATED APPLICATIONS

The present application is a continuation of U.S. patent application Ser. No. 18/821,995, filed on Aug. 30, 2024, which claims priority to and the benefit of Korean Patent Application No. 10-2023-0189453, filed on Dec. 22, 2023, and Korean Patent Application No. 10-2024-0077741, filed on Jun. 14, 2024, in the Korean Intellectual Property Office, the entire disclosures of all of which are incorporated by reference herein.

BACKGROUND

1. Field

Aspects of embodiments of the present disclosure relate to an electronic device capable of sensing an input by a pen.

2. Description of Related Art

Multimedia electronic devices, such as a television, a mobile phone, a tablet computer, a navigation unit, and a game console, include a display device for displaying an image. The electronic devices may include a sensor layer (e.g., an input sensor) capable of providing a touch-based input method that allows a user to easily input information or a command in an intuitive and convenient manner, in addition to a general input method, such as a button, a keyboard, or a mouse. The sensor layer may sense a touch or a pressure of the user.

The usage of a pen has been increasingly demanded from users who are familiar with inputting information using the pen, or from users who are familiar with a more precise touch input for a particular application program (e.g., an application program for sketching or drawing).

The above information disclosed in this Background section is for enhancement of understanding of the background of the present disclosure, and therefore, it may contain information that does not constitute prior art.

SUMMARY

One or more embodiments of the present disclosure may be directed to an electronic device capable of sensing an input by a pen.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a plurality of first sensing electrodes extending in a first direction; a plurality of second sensing electrodes extending in a second direction crossing the first direction; and a plurality of first electrodes extending in the first direction. Each of the first sensing electrodes includes a plurality of first sub electrodes, and each of the plurality of first electrodes includes a plurality of second sub electrodes, each having a first end and a second end. Each of the plurality of first sub electrodes includes first patterns, and a first bridge pattern electrically connected to the first patterns. Two adjacent first sub electrodes from among the plurality of first sub electrodes are electrically connected to each other at one end via a first connection line, and two adjacent second sub electrodes overlapping with the two adjacent first sub electrodes from among the plurality of second sub electrodes are connected to each other at the second end via a second connection line. The second connection line and another adjacent second connection line are electrically connected to each other via a third connection line. The first connection line is electrically connected to a first pad, and the third connection line is electrically connected to a second pad.

In an embodiment, two adjacent first electrodes from among the plurality of first electrodes may be electrically connected to each other at the first end via a first loop trace line.

In an embodiment, the plurality of first electrodes may be electrically connected to each other at the second end via a second loop trace line.

In an embodiment, a first end of the second loop trace line may be connected to one third pad, and a second end opposite to the first end of the second loop trace line may be connected to another third pad. In a charging driving mode, the second pad may be configured to receive a first signal, and one of the third pads may be configured to receive a second signal.

In an embodiment, the second signal may have a reverse phase signal of the first signal.

In an embodiment, some of the second sensing electrodes may be electrically connected to some fourth pads from one end of the second sensing electrodes, and others of the second sensing electrodes may be electrically connected to other fourth pads from an opposite end of the second sensing electrodes.

In an embodiment, in a mutual capacitance detection mode, the first pad may be configured to receive a transmission signal, and the fourth pads may be configured to transmit a reception signal.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode extending in a first direction, and including first patterns, and a first bridge pattern electrically connected to the first patterns; a second sensing electrode extending in a second direction crossing the first direction, and crossing the first sensing electrode; a first electrode extending in the first direction; and a first dummy pattern insulated with the first sensing electrode. At least one first pattern of the first patterns includes a first portion, a second portion opposite to the first portion, and a third portion connected to an end of the first portion and an end of the second portion. The first dummy pattern is located between the first portion and the second portion, and the first electrode overlaps with the first dummy pattern, and the first and second portions of the at least one first pattern. The first electrode and the first bridge pattern are located at a first layer, and the first patterns, the second sensing electrode, and the first dummy pattern are located at a second layer different from the first layer.

In an embodiment, the first dummy pattern may be entirely surrounded by an opening defined by the first, second, and third portions of the at least one first pattern.

In an embodiment, the first dummy pattern may include a plurality of patterns, and the plurality of patterns may be entirely surrounded by one opening defined by the first, second, and third portions of the at least one first pattern.

In an embodiment, the plurality of patterns may be electrically floated to be electrically separated from each other.

In an embodiment, the first dummy pattern may include a plurality of mesh lines.

In an embodiment, the first electrode may include second patterns, and a second bridge pattern electrically connected to the second patterns and located at a same layer as that of the first bridge pattern.

In an embodiment, the sensor layer may further include a second electrode extending in the second direction, and including second patterns, and a second bridge pattern electrically connected to the second patterns and crossing the first bridge pattern.

In an embodiment, the second bridge pattern may include: mesh lines that cross each other to define at least one closed hole therebetween; and mesh lines that cross each other without defining any closed holes therebetween. The first bridge pattern may cross a part of the mesh lines of the second bridge pattern that cross each other without defining any closed holes therebetween.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode; a second sensing electrode crossing the first sensing electrode; a first electrode overlapping with the first sensing electrode; and a second electrode overlapping with the second sensing electrode. The first sensing electrode includes first patterns, and a first bridge pattern electrically connected to the first patterns. The second electrode includes second patterns, and a second bridge pattern electrically connected to the second patterns. The first bridge pattern and the second bridge pattern cross each other, and each of the first bridge pattern and the second bridge pattern includes first mesh lines, and second mesh lines crossing the first mesh lines. The second bridge pattern has at least one closed hole surrounded by the first mesh lines and the second mesh lines, and the first bridge pattern has a smaller number of closed holes than that of the second bridge pattern, where the number is an integer greater than or equal to 0. The first electrode and the first bridge pattern are located at a first layer, and the first patterns, the second sensing electrode, and the second bridge pattern are located at a second layer different from the first layer.

In an embodiment, the first bridge pattern may have no closed holes.

In an embodiment, the second bridge pattern may include: the first and second mesh lines that cross each other to define the at least one closed hole therebetween; and the first and second mesh lines that cross each other without defining any closed holes therebetween.

In an embodiment, the first bridge pattern may cross a part of the first and second mesh lines of the second bridge pattern that cross each other without defining any closed holes.

In an embodiment, the first electrode may include: third patterns; and a third bridge pattern electrically connected to the third patterns.

In an embodiment, the third bridge pattern may include a first bridge portion, and a second bridge portion opposite to the first bridge portion.

In an embodiment, the first bridge pattern may be located between the first bridge portion and the second bridge portion.

In an embodiment, the first bridge pattern and the third bridge pattern may be located at the same first layer as each other.

According to one or more embodiments of the present disclosure, an electronic device includes: a substrate; a circuit layer on the substrate, and including a transistor; a light emitting element layer on the circuit layer, and including a light-emitting element electrically connected to the transistor; and a sensor layer on the light emitting element layer, and including: a first sensing electrode including first patterns, and a first bridge pattern electrically connected to the first patterns; a second sensing electrode crossing the first sensing electrode; a first electrode overlapping with the first sensing electrode, and including second patterns, and a second bridge pattern electrically connected to the second patterns; and a second electrode overlapping with the second sensing electrode. The second bridge pattern includes a first bridge portion, and a second bridge portion opposite to the first bridge portion. The first bridge pattern is located between the first bridge portion and the second bridge portion. The first electrode, the first bridge pattern, and the second bridge pattern are located at a first layer, and the first patterns and the second sensing electrode are located at a second layer different from the first layer.

In an embodiment, the second electrode may include: third patterns; and a third bridge pattern electrically connected to the third patterns.

In an embodiment, the first bridge pattern and the third bridge pattern may cross each other.

In an embodiment, each of the first bridge pattern and the third bridge pattern may include first mesh lines, and second mesh lines crossing the first mesh lines.

In an embodiment, the third bridge pattern may have at least one closed hole surrounded by the first mesh lines and the second mesh lines, and the first bridge pattern may have a smaller number of closed holes than that of the third bridge pattern, where the number may be an integer greater than or equal to 0.

In an embodiment, the first bridge pattern and the third bridge pattern may be located at different layers from each other.

In an embodiment, at least one first pattern of the first patterns may include a first portion, a second portion opposite to the first portion, and a third portion connected to an end of the first portion and an end of the second portion. A first dummy pattern may be insulated with the at least one first pattern, and may be located between the first portion and the second portion.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1A:
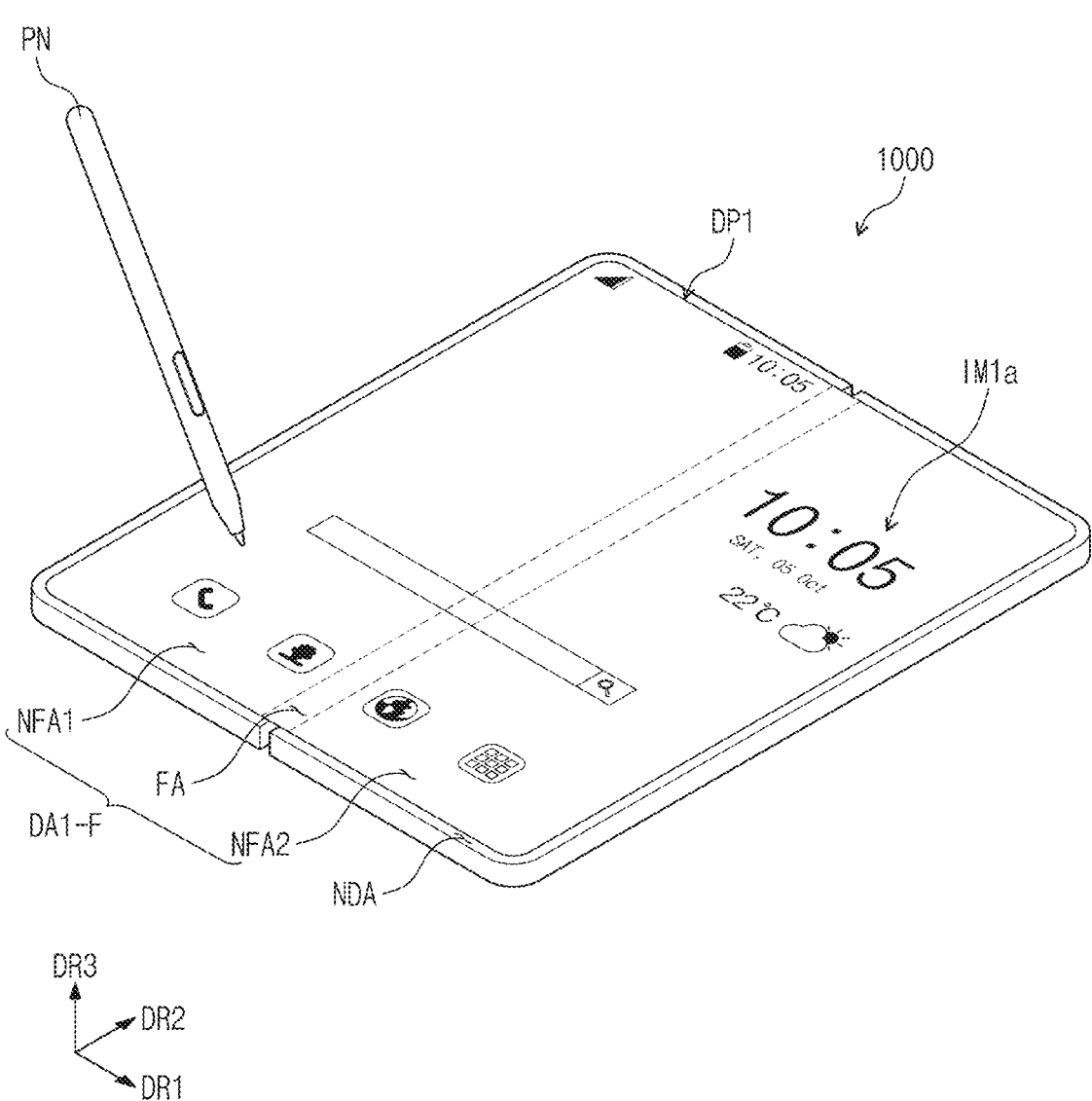
FIG. 1A is a perspective view illustrating an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Further, as would be understood by a person having ordinary skill in the art, in view of the present disclosure in its entirety, each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner, unless otherwise stated or implied.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it should be expected that the shapes shown in the figures may vary in practice depending, for example, on tolerances and/or manufacturing techniques. Accordingly, the embodiments of the present disclosure should not be construed as being limited to the specific shapes shown in the figures, and should be construed considering changes in shapes that may occur, for example, as a result of manufacturing. As such, the shapes shown in the drawings may not depict the actual shapes of areas of the device, and the present disclosure is not limited thereto.

In the figures, the x-axis (e.g., DR1-axis), the y-axis (e.g., DR2-axis), and the z-axis (e.g., DR3-axis) are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. For example, a first direction shown in the figures may be referred to as a second direction in the claims, and vice versa.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

As used herein, the terms "part" and "unit" may refer to a software component or hardware component that performs a specific function. The hardware component may include, for example, a field-programmable gate array (FPGA) or an application-specific integrated circuit (ASIC). The software component may refer to executable code and/or data used by the executable code in an addressable storage medium. Thus, the software components may be, for example, object-oriented software components, class components, and/or operation components, and may include processes, functions, properties, procedures, subroutines, program code segments, drivers, firmware, micro-codes, circuits, data, databases, data structures, tables, arrays, and/or variables.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
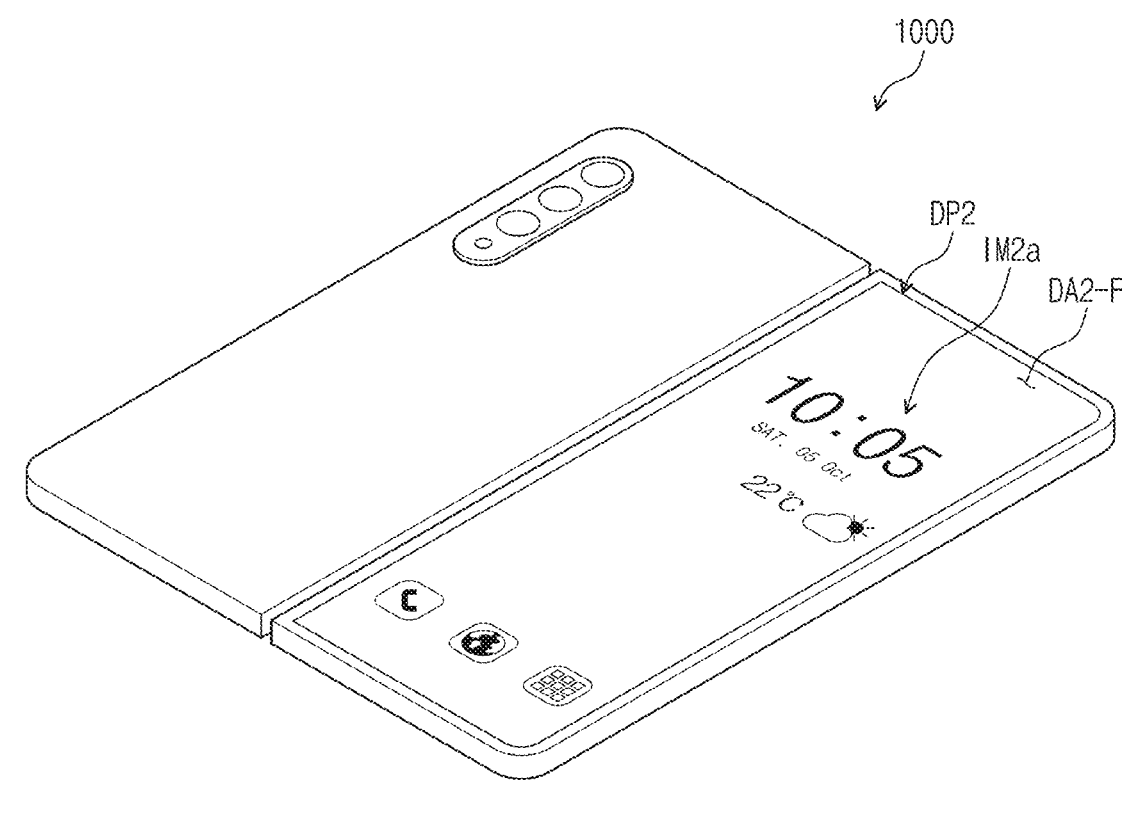
FIG. 1B is a rear perspective view illustrating the electronic device according to an embodiment of the present disclosure.

FIG. 1A is a perspective view illustrating an electronic device 1000 according to an embodiment of the present disclosure. FIG. 1B is a rear perspective view illustrating the electronic device 1000 according to an embodiment of the present disclosure.

Referring to FIGS. 1A and 1B, the electronic device 1000 may be activated by an electrical signal. For example, the electronic device 1000 may display an image, and may sense inputs (e.g., external inputs) applied from the outside. The external input may be an input of a user. The input of the user may include various suitable kinds of inputs, such as a portion of a user's body, a pen PN, light, heat, or pressure.

The electronic device 1000 may include a first display panel DP1 and a second display panel DP2. The first display panel DP1 and the second display panel DP2 may be spaced apart (e.g., may be separated) from each other. The first display panel DP1 may be referred to as a main display panel. The second display panel DP2 may be referred to as an auxiliary display panel or an external display panel.

The first display panel DP1 may include a first display part DA1-F, and the second display panel DP2 may include a second display part DA2-F. The second display panel DP2 may have an area less than that of the first display panel DP1. The first display part DA1-F may have an area greater than that of the second display part DA2-F in correspondence to sizes of the first display panel DP1 and the second display panel DP2.

The first display part DA1-F may have a plane that is parallel to or substantially parallel to a first direction DR1 and a second direction DR2 in an unfolded state of the electronic device 1000. The first direction DR1 and the second direction DR2 may cross each other. The electronic device 1000 may have a thickness direction that is parallel to or substantially parallel to a third direction DR3 crossing the first direction DR1 and the second direction DR2. Thus, a front surface (e.g., a top surface) and a rear surface (e.g., a bottom surface) of the members constituting the electronic device 1000 may be defined based on the third direction DR3.

The first display panel DP1 and/or the first display part DA1-F may include a folding area FA that may be folded and unfolded, and a plurality of non-folding areas NFA1 and NFA2 that are spaced apart from each other with the folding area FA therebetween. The second display panel DP2 may overlap with one of the plurality of non-folding areas NFA1 or NFA2. For example, the second display panel DP2 may overlap with the first non-folding area NFA1.

A display direction of a first image IM1a displayed on a portion of the first display panel DP1 (e.g., on the first non-folding area NFA1) may be opposite to a display direction of the second image IM2a displayed on the second display panel DP2. For example, the first image IM1a may be displayed in the third direction DR3, and the second image IM2a may be displayed in the fourth direction DR4 opposite to the third direction DR3.

In an embodiment of the present disclosure, the folding area FA may be bent based on a folding axis extending in a direction parallel to or substantially parallel to a long side of the electronic device 1000 (e.g., extending in a direction parallel to or substantially parallel to the second direction DR2). The folding area FA has a curvature (e.g., a predetermined curvature) and a radius of curvature in a state in which the electronic device 1000 is folded. The first non-folding area NFA1 and the second non-folding area NFA2 may face each other when the electronic device 1000 is folded, and the electronic device 1000 may be inner-folded so that the first display part DA1-F is not exposed to the outside.

In an embodiment of the present disclosure, the electronic device 1000 may be outer-folded so that the first display part DA1-F is exposed to the outside. In an embodiment of the present disclosure, the electronic device 1000 may perform the inner-folding and/or the outer-folding from an unfolded state. However, the present disclosure is not limited thereto.

Although one folding area FA is defined (e.g., provided or included) in the electronic device 1000 illustrated in FIG. 1A, the present disclosure is not limited thereto. For example, a plurality of folding axes and a plurality of folding areas corresponding to the folding axes may be defined in the electronic device 1000, and the electronic device 1000 may be inner-folded and/or out-folded in each of the plurality of folding areas from the unfolded state.

According to an embodiment of the present disclosure, at least one of the first display panel DP1 and/or the second display panel DP2 may sense an input by the pen PN, even though the display panel may not include a digitizer. Thus, because the digitizer for sensing the pen PN may be omitted, an increase in a thickness and a weight of, and a reduction in a flexibility of, the electronic device 1000, which may be caused by the addition of the digitizer, may be prevented or substantially prevented (e.g., may not occur). Accordingly, in some embodiments, not only the first display panel DP1, but also the second display panel DP2, may be designed to sense the pen PN.

Figure 2:
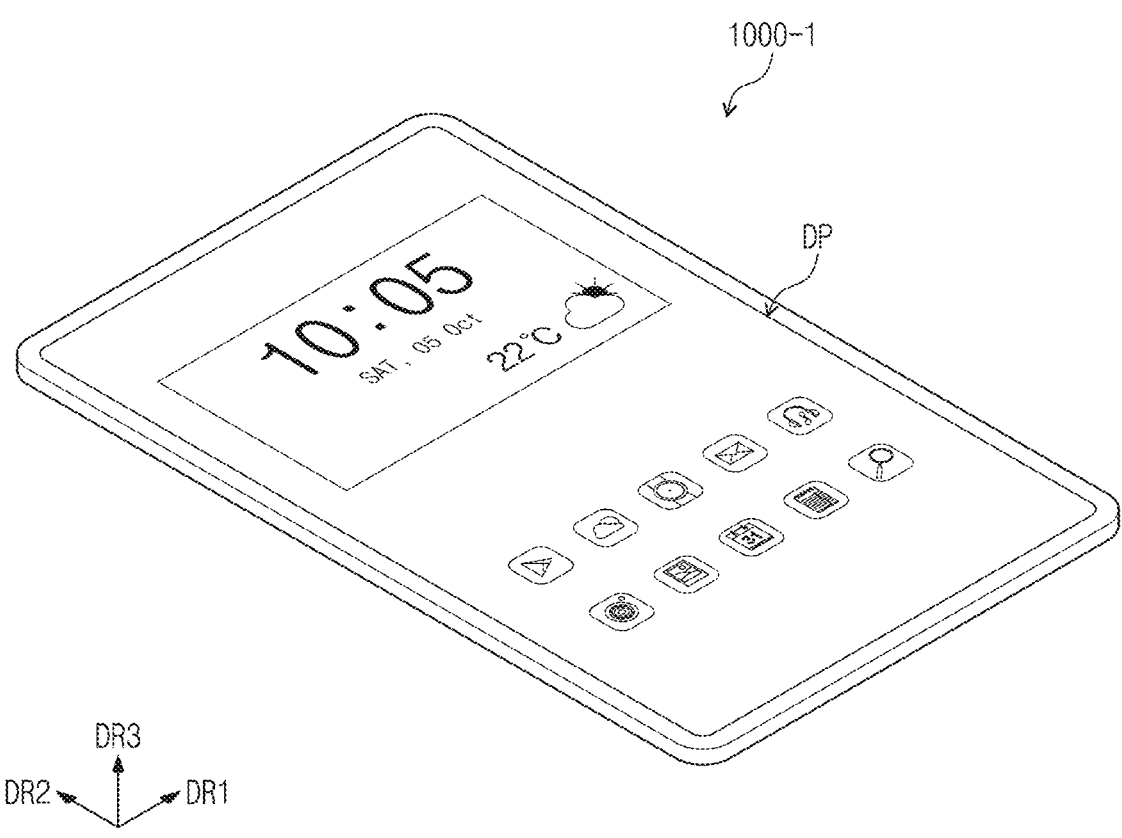
FIG. 2 is a perspective view illustrating the electronic device according to an embodiment of the present disclosure.
Figure 3:
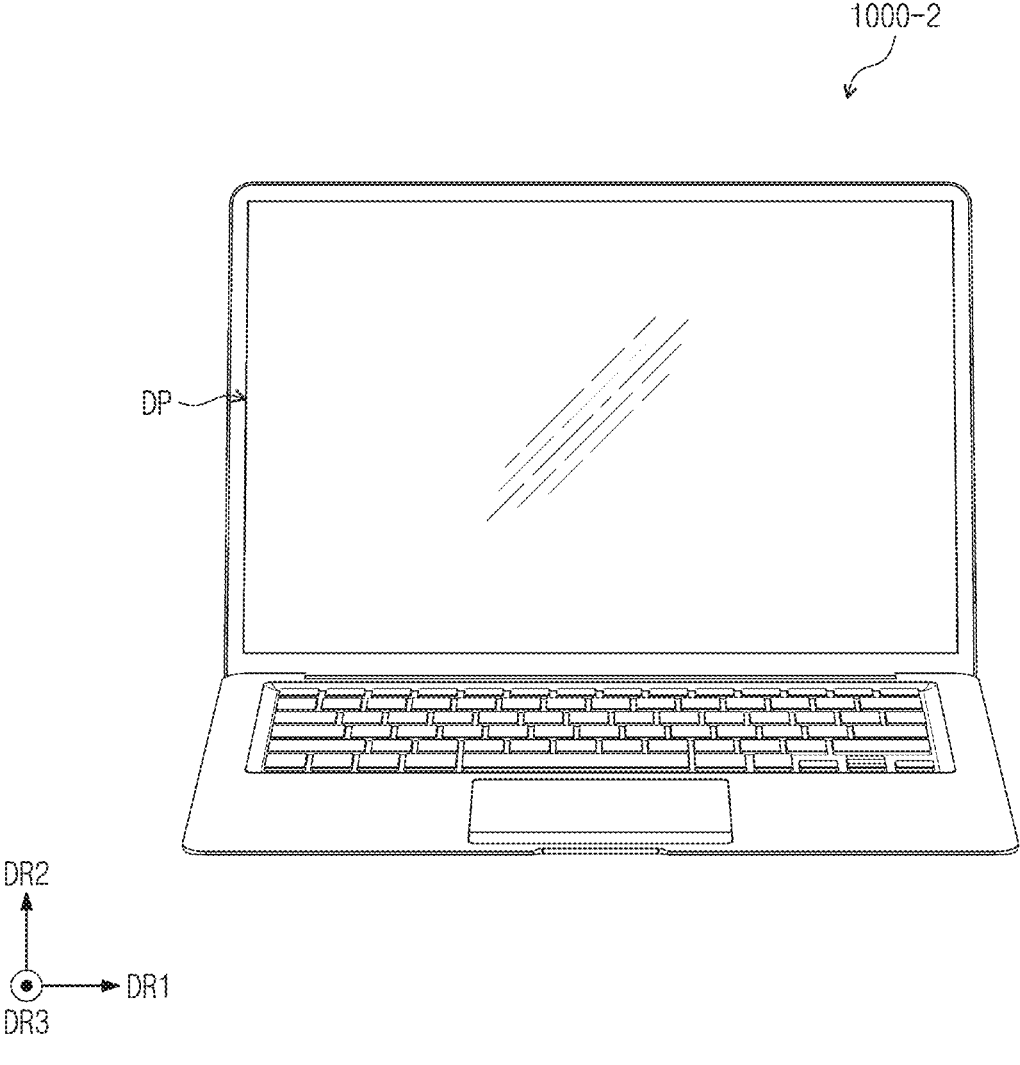
FIG. 3 is a perspective view illustrating the electronic device according to an embodiment of the present disclosure.

FIG. 2 is a perspective view illustrating an electronic device 1000-1 according to an embodiment of the present disclosure. FIG. 3 is a perspective view illustrating an electronic device 1000-2 according to an embodiment of the present disclosure.

In FIG. 2, the electronic device 1000-1 is illustrated as a mobile phone as an example. The electronic device 1000-1 may include a display panel DP. In FIG. 3, the electronic device 1000-2 is illustrated as a notebook computer as an example. The electronic device 1000-2 may include a display panel DP. Although FIG. 3 is the perspective view of an electronic device 1000-2, the coordinate axes included in FIG. 3 are displayed based on the display panel DP within the electronic device 1000-2.

In an embodiment of the present disclosure, the display panel DP may sense various inputs (e.g., external inputs) applied from the outside. The external input may be the input of the user. The input of the user may include various suitable kinds of inputs, such as a portion of the user's body, the pen PN (e.g., refer to FIG. 1A), light, heat, or pressure.

According to an embodiment of the present disclosure, the display panel DP may sense the input by the pen PN even though the display panel DP may not include a digitizer. Accordingly, because the digitizer for sensing the pen PN may be omitted, an increase in a thickness and a weight of, and a reduction in a flexibility of, the electronic devices 1000-1 and 1000-2, which may be caused by the addition of the digitizer, may be prevented or substantially prevented (e.g., may not occur).

Although a foldable-kind of electronic device 1000 is illustrated in FIG. 1A as an example, and a bar-kind of electronic device 1000-1 is illustrated in FIG. 2 as an example, the present disclosure is not limited thereto. For example, the embodiments described herein may be applied to various suitable kinds of electronic devices, such as a rollable-kind of electronic device, a slidable-kind of electronic device, and/or a stretchable-kind of electronic device.

Figure 4:
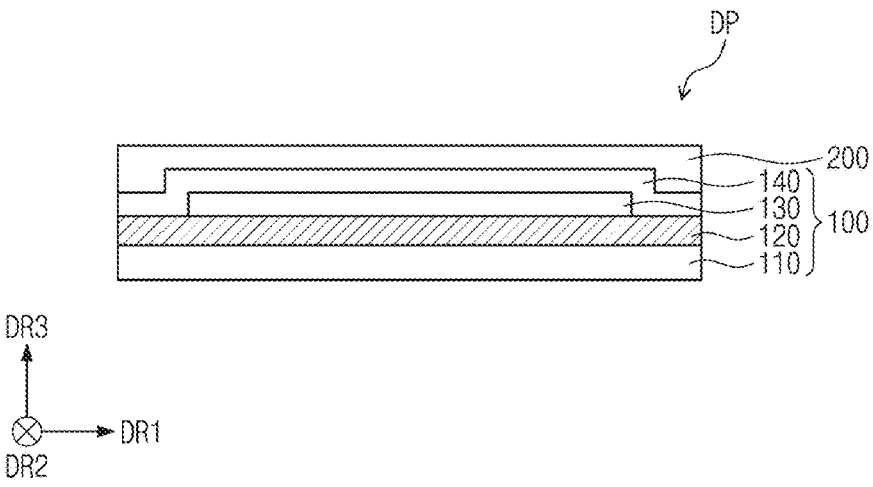
FIG. 4 is a schematic cross-sectional view illustrating a display panel according to an embodiment of the present disclosure.

FIG. 4 is a schematic cross-sectional view illustrating a display panel DP according to an embodiment of the present disclosure.

Referring to FIG. 4, the display panel DP may include a display layer 100 and a sensor layer 200.

The display layer 100 may be a component that generates or substantially generates an image. The display layer 100 may be a light emitting display layer. For example, the display layer 100 may be an organic light emitting display layer, an inorganic light emitting display layer, an organic-inorganic light emitting display layer, a quantum dot display layer, a micro-LED display layer, or a nano-LED display layer. The display layer 100 may include a base layer 110, a circuit layer 120, a light emitting element layer 130, and an encapsulation layer 140.

The base layer 110 may be a member for providing a base surface on which the circuit layer 120 is disposed. The base layer 110 may have a multi-layered structure or a single-layer structure. For example, the base layer 110 may include (e.g., may be) a glass substrate, a metal substrate, a silicon substrate, or a polymer substrate, but the present disclosure is not limited thereto.

The circuit layer 120 may be disposed on the base layer 110. The circuit layer 120 may include an insulation layer, a semiconductor pattern, a conductive pattern, and a signal line. The insulation layer, a semiconductor layer, and a conductive layer may be provided on the base layer 110 by a suitable method, such as coating and deposition, and then may be selectively patterned through a plurality of photolithography processes.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign substances, such as moisture, oxygen, and/or dust particles.

The sensor layer 200 may be disposed on the display layer 100. The sensor layer 200 may sense an external input applied from the outside. The sensor layer 200 may be an integrated sensor that is provided continuously during a manufacturing process of the display layer 100, or may be an external sensor that is attached to the display layer 100. The sensor layer 200 may be referred to as a sensor, an input sensing layer, an input sensing panel, or an electronic device for sensing input coordinates.

According to an embodiment of the present disclosure, the sensor layer 200 may sense all suitable kinds of inputs from a passive type input unit, such as a body of the user, and an input device that generates a magnetic field having a resonant frequency (e.g., a predetermined resonant frequency). The input device may be referred to as a pen, an input pen, a magnetic pen, a stylus pen, or an electromagnetic resonance pen.

Figure 5:
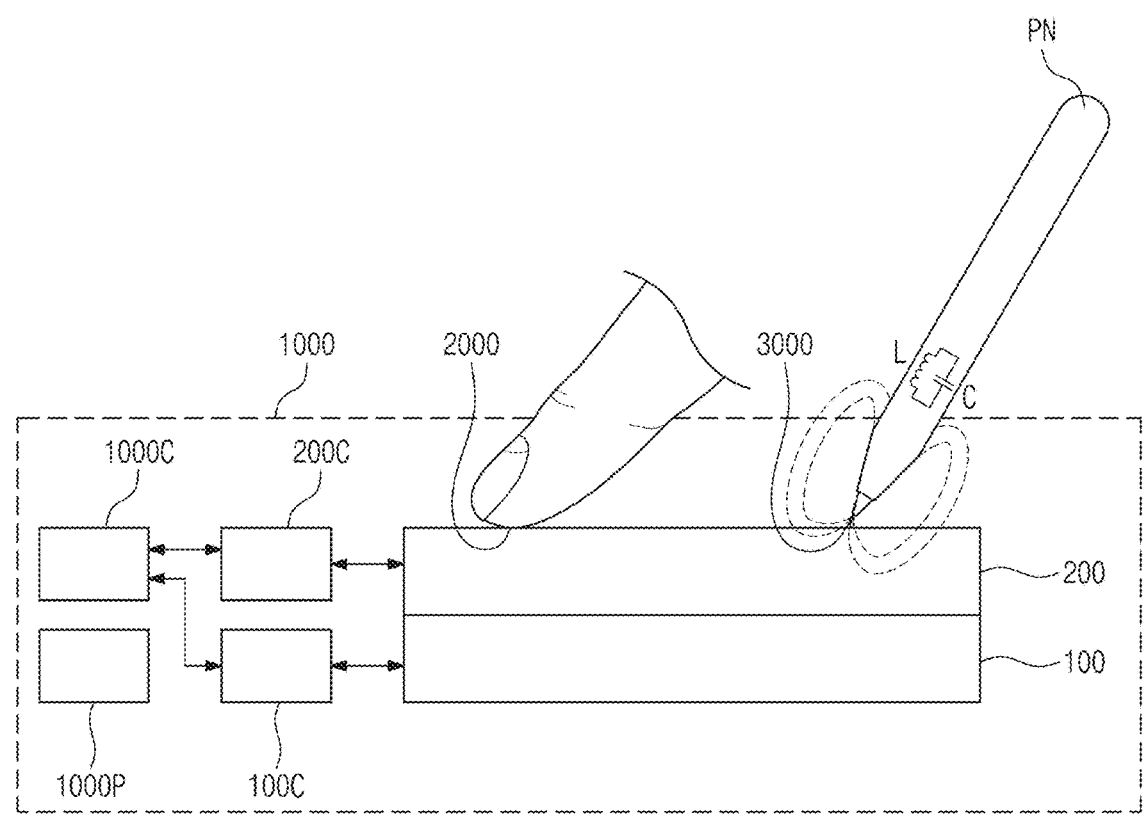
FIG. 5 is a schematic view illustrating an operation of the electronic device according to an embodiment of the present disclosure.

FIG. 5 is a schematic view illustrating an operation of the electronic device 1000 according to an embodiment of the present disclosure.

Referring to FIG. 5, the electronic device 1000 may include a display layer 100, a sensor layer 200, a display driver 100C (e.g., a first driver circuit), a sensor driver 200C (e.g., a second driver circuit), a main driver 1000C (e.g., a third circuit), and a power circuit 1000P.

The sensor layer 200 may sense a first input 2000 or a second input 3000 applied from the outside. Each of the first input 2000 and the second input 3000 may be an input (e.g., an input unit) capable of providing a variation in a capacitance of the sensor layer 200, or an input (e.g., an input unit) capable of causing an induced current in the sensor layer 200. For example, the first input 2000 may be a passive kind of input (e.g., a passive input unit) such as the body of the user. The second input 3000 may be an input by the pen PN, or an input by an RFIC tag. For example, the pen PN may be a passive kind of pen or an active kind of pen.

In an embodiment of the present disclosure, the pen PN may be a device that generates a magnetic field having a resonant frequency (e.g., a predetermined resonant frequency). The pen PN may transmit an output signal based on an electromagnetic resonance method. The pen PN may be referred to as an input device, an input pen, a magnetic pen, a stylus pen, or an electromagnetic resonance pen.

The pen PN may include an RLC resonant circuit, and the RLC resonant circuit may include an inductor L and a capacitor C. In an embodiment of the present disclosure, the RLC resonant circuit may be a variable resonant circuit that varies a resonance frequency. In this case, the inductor L may be a variable inductor and/or the capacitor C may be a variable capacitor. However, the present disclosure is not limited thereto.

The inductor L generates a current by a magnetic field provided in the electronic device 1000 (e.g., in the sensor layer 200). However, the present disclosure is not limited thereto. For example, when the pen PN operates as an active kind of pen, the pen PN may generate a current even when the pen PN does not receive a magnetic field from the outside. The generated current is transmitted to the capacitor C. The capacitor C charges the current transmitted from the inductor L, and discharges the charged current to the inductor L. Thereafter, the inductor L may emit a magnetic field having a resonance frequency. An induced current may flow through the sensor layer 200 due to the magnetic field emitted by the pen PN, and the induced current may be transmitted to the sensor driver 200C as a received signal (e.g., as a sensing signal).

The main driver 1000C may control the overall operations of the electronic device 1000. For example, the main driver 1000C may control operations of the display driver 100C and the sensor driver 200C. The main driver 1000C may include at least one microprocessor, and may further include a graphics controller. The main driver 1000C may be referred to as an application processor, a central processing unit, or a main processor.

The display driver 100C may drive the display layer 100. The display driver 100C may receive image data and control signals from the main driver 1000C. The control signals may include various suitable signals. For example, the control signal may include an input vertical synchronization signal, an input horizontal synchronization signal, a main clock signal, and a data enable signal.

The sensor driver 200C may drive the sensor layer 200. The sensor driver 200C may receive a control signal from the main driver 1000C. The control signal may include a clock signal of the sensor driver 200C. Also, the control signal may further include a mode decision signal that determines a driving mode of the sensor driver 200C and the sensor layer 200.

The sensor driver 200C may be realized as an integrated circuit (IC), and may be electrically connected to the sensor layer 200. For example, the sensor driver 200C may be mounted directly on a suitable area (e.g., a predetermined area) of the display panel, or may be mounted on a separate printed circuit board in a chip on film (COF) method and electrically connected to the sensor layer 200.

The sensor driver 200C and the sensor layer 200 may selectively operate in a first mode or a second mode. For example, the first mode may be a mode for sensing a touch input (e.g., the first input 2000). The second mode may be a mode for sensing a pen input (e.g., the second input 3000). The first mode may be referred to as a touch sensing mode, and the second mode may be referred to as a pen sensing mode.

Switching between the first mode and the second mode may be performed using various suitable methods. For example, the sensor driver 200C and the sensor layer 200 may be driven in a time division manner as the first mode and the second mode to sense the first input 2000 and the second input 3000. As another example, the switching between the first mode and the second mode may occur by a selection or a specific action (e.g., an input) of the user, or one of the first mode and/or the second mode may be activated or deactivated by activating or deactivating a specific application. As another example, switching from one mode to the other mode may occur. As another example, while the sensor driver 200C and the sensor layer 200 are operating alternately in the first mode and the second mode, the first mode may be maintained or substantially maintained when the first input 2000 is sensed, or the second mode may be maintained or substantially maintained when the second input 3000 is sensed.

The sensor driver 200C may calculate coordinate information of an input based on a signal received from the sensor layer 200, and may provide a coordinate signal having the coordinate information to the main driver 1000C. The main driver 1000C executes an operation corresponding to the input of the user based on the coordinate signal. For example, the main driver 1000C may operate the display driver 100C so that a new application image is displayed on the display layer 100.

The power circuit 1000P may include a power management integrated circuit (PMIC). The power circuit 1000P may generate a plurality of driving voltages for driving the display layer 100, the sensor layer 200, the display driver 100C, and the sensor driver 200C. For example, the plurality of driving voltages may include a gate high voltage, a gate low voltage, a first driving voltage (e.g., an ELVSS voltage), a second driving voltage (e.g., an ELVDD voltage), and an initialization voltage. However, the present disclosure is not limited thereto.

Figure 6A:
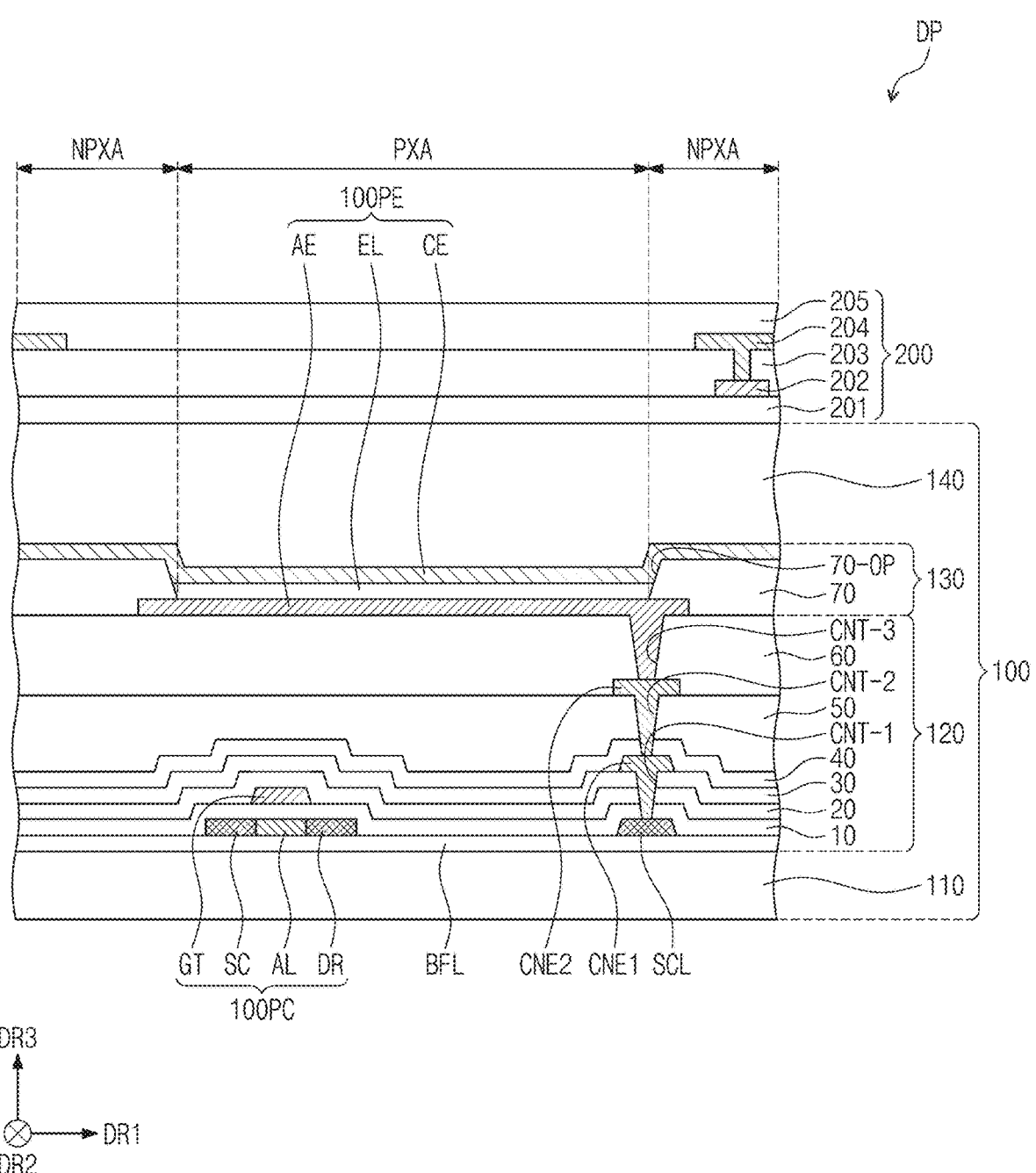
FIG. 6A is a cross-sectional view illustrating the display panel according to an embodiment of the present disclosure.

FIG. 6A is a cross-sectional view illustrating the display panel DP according to an embodiment of the present disclosure.

Referring to FIG. 6A, at least one buffer layer BFL is provided on a top surface of a base layer 110. The buffer layer BFL may improve a coupling force between the base layer 110 and a semiconductor pattern. The buffer layer BFL may have multiple layers. As another example, the display layer 100 may further include a barrier layer. The buffer layer BFL may include at least one of silicon oxide, silicon nitride, and/or silicon oxynitride. For example, the buffer layer BFL may have a suitable structure in which a silicon oxide layer and a silicon nitride layer are alternately laminated.

A semiconductor pattern SC, AL, DR, and SCL may be disposed on the buffer layer BFL. The semiconductor pattern SC, AL, DR, and SCL may include polysilicon. However, the present disclosure is not limited thereto. The semiconductor pattern SC, AL, DR, and SCL may include amorphous silicon, a low-temperature polycrystalline silicon, or an oxide semiconductor.

FIG. 6A illustrates a portion of the semiconductor pattern SC, AL, DR, and SCL, and the semiconductor pattern may be further disposed in other areas. The semiconductor pattern SC, AL, DR, and SCL may be arranged over a plurality of pixels based on a suitable rule (e.g., a particular or predetermined rule). The semiconductor pattern SC, AL, DR, and SCL may have an electrical property that is different according to whether or not it is doped. The semiconductor pattern SC, AL, DR, and SCL may include a first area SC, DR, and SCL having a high (e.g., a relatively higher) conductivity, and a second area AL having a low (e.g., a relatively lower) conductivity. The first area SC, DR, and SCL may be doped with an n-type dopant or a p-type dopant. A p-type transistor may include a doped area that is doped with the p-type dopant, and an n-type transistor may include a doped area that is doped with the n-type dopant. The second area AL may be a non-doped area, or a doped area having a concentration less than that of the first area SC, DR, and SCL.

The first area SC, DR, and SCL may have a conductivity greater than that of the second area AL, and may serve or substantially serve as an electrode or a signal line. The second area AL may correspond to or substantially correspond to an active area (e.g., a channel) AL of the transistor 100PC. In other words, a portion AL of the semiconductor pattern SC, AL, DR, and SCL may be the active area AL of the transistor 100PC, another portion SC and DR may be a source area SC or a drain area DR of the transistor 100PC, and another portion SCL may be a connection electrode or a connection signal line SCL.

Each of the pixels may have an equivalent circuit including a plurality of transistors, at least one capacitor, and at least one light emitting element. The equivalent circuit of the pixel may be deformed into various suitable shapes. In FIG. 6A, one transistor 100PC and one light emitting element 100PE contained in a corresponding pixel are illustrated as an example.

The source area SC, the active area AL, and the drain area DR of the transistor 100PC may be provided from the semiconductor pattern SC, AL, DR, and SCL. The source area SC and the drain area DR may extend in opposite directions from each other from the active area AL on a cross-section (e.g., in a cross-sectional view). FIG. 6A illustrates a portion of the connection signal line SCL provided from the semiconductor pattern SC, AL, DR, and SCL. However, the connection signal line SCL may be connected to the drain area DR of the transistor 100PC on a plane (e.g., in a plan view).

A first insulation layer 10 may be disposed on the buffer layer BFL. The first insulation layer 10 may overlap with a plurality of pixels in common, and may cover the semiconductor pattern SC, AL, DR, and SCL. The first insulation layer 10 may be an inorganic layer and/or an organic layer, and may have a single-layer structure or a multi-layered structure. The first insulation layer 10 may include at least one of aluminum oxide, titanium oxide, silicon oxide, silicon nitride, silicon oxynitride, zirconium oxide, and/or hafnium oxide. In the present embodiment, the first insulation layer 10 may be a single-layer of a silicon oxide layer. Also, an insulation layer of the circuit layer 120, which will be described in more detail below, may be an inorganic layer and/or an organic layer, like that of the first insulation layer 10, and may have a single-layer structure or a multi-layered structure. Although the inorganic layer may include at least one of the above-described inorganic materials, the present disclosure is not limited thereto.

A gate GT of the transistor 100PC may be disposed on the first insulation layer 10. The gate GT may be a portion of a metal pattern. The gate GT overlaps with the active area AL. The gate GT may serve as a mask in a process of doping or reducing the semiconductor pattern SC, AL, DR, and SCL.

A second insulation layer 20 may be disposed on the first insulation layer 10 to cover the gate GT. The second insulation layer 20 may overlap with the pixels in common. The second insulation layer 20 may be an inorganic layer and/or an organic layer, and may have a single-layer structure or a multi-layered structure. The second insulation layer 20 may include at least one of silicon oxide, silicon nitride, and/or silicon oxynitride. In the present embodiment, the second insulation layer 20 may have a multi-layered structure including a silicon oxide layer and a silicon nitride layer.

A third insulation layer 30 may be disposed on the second insulation layer 20. The third insulation layer 30 may have a single-layer structure or a multi-layered structure. For example, the third insulation layer 30 may have a multi-layered structure including a silicon oxide layer and a silicon nitride layer.

A first connection electrode CNE1 may be disposed on the third insulation layer 30. The first connection electrode CNE1 may be connected to the connection signal line SCL through a contact hole CNT-1 passing through (e.g., penetrating) the first, second, and third insulation layers 10, 20, and 30.

A fourth insulation layer 40 may be disposed on the third insulation layer 30. The fourth insulation layer 40 may be a single-layer of a silicon oxide layer. A fifth insulation layer 50 may be disposed on the fourth insulation layer 40. The fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 passing through the fourth and fifth insulation layers 40 and 50.

A sixth insulation layer 60 may be disposed on the fifth insulation layer 50 to cover the second connection electrode CNE2. The sixth insulation layer 60 may be an organic layer.

A light emitting element layer 130 may be disposed on the circuit layer 120. The light emitting element layer 130 may include the light emitting element 100PE. For example, the light emitting element layer 130 may include an organic light emitting material, an inorganic light emitting material, an organic-inorganic light emitting material, a quantum dot, a quantum rod, a micro-LED, or a nano-LED. Hereinafter, for convenience of illustration, the light emitting element 100PE may be described in more detail in the context of an organic light emitting element as an example, but the present disclosure is not limited thereto.

The light emitting element 100PE may include a first electrode AE, a light emitting layer EL, and a second electrode CE.

The first electrode AE may be disposed on the sixth insulation layer 60. The first electrode AE may be connected to the second connection electrode CNE2 through a contact hole CNT-3 passing through (e.g., penetrating) the sixth insulation layer 60.

A pixel defining layer 70 may be disposed on the sixth insulation layer 60 to cover a portion of the first electrode AE. An opening 70-OP is defined in the pixel defining layer 70. The opening 70-OP of the pixel defining layer 70 exposes at least a portion of the first electrode AE.

Figure 1B:
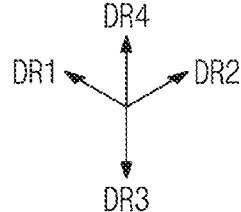

The first display part DA1-F (e.g., refer to FIG. 1) may include a light emitting area PXA, and a non-light emitting area NPXA disposed adjacent to the light emitting area PXA. The non-light emitting area NPXA may surround (e.g., around a periphery of) the light emitting area PXA. In the present embodiment, the light emitting area PXA is defined in correspondence to a partial area of the first electrode AE exposed by the opening 70-OP.

The light emitting layer EL may be disposed on the first electrode AE. The light emitting layer EL may be disposed on an area corresponding to the opening 70-OP. Although the light emitting layer EL is disposed in the opening 70-OP as an example as illustrated in FIG. 6A, the present disclosure is not limited thereto. For example, the light emitting layer EL may extend to cover a portion of a top surface of the pixel defining layer 70 and a side surface of the pixel defining layer 70 that defines the opening 70-OP.

In an embodiment of the present disclosure, the light emitting layer EL may be separately provided for each of the pixels. When the light emitting layer EL is separately provided for each of the pixels, each of the light emitting layers EL may emit light having at least one color from among blue, red, and/or green. However, the present disclosure is not limited thereto. For example, the light emitting layer EL may have an integrated shape, and may be provided in common to the plurality of pixels. In this case, the light emitting layer EL may provide blue light or white light.

The second electrode CE may be disposed on the light emitting layer EL. The second electrode CE may be included in a plurality of pixels in common, while having an integral shape.

In an embodiment of the present disclosure, a hole control layer may be disposed between the first electrode AE and the light emitting layer EL. The hole control layer may be disposed on the light emitting area PXA and the non-light emitting area NPXA in common. The hole control layer may include a hole transport layer, and may selectively further include a hole injection layer. An electron control layer may be disposed between the light emitting layer EL and the second electrode CE. The electron control layer may include an electron transport layer, and may selectively further include an electron injection layer. The hole control layer and the electron control layer may be provided to the plurality of pixels in common by using an open mask or an inkjet process.

The encapsulation layer 140 may be disposed on the light emitting element layer 130. The encapsulation layer 140 may include an inorganic layer, an organic layer, and an inorganic layer, which are sequentially laminated, but the present disclosure is not limited to the layers constituting the encapsulation layer 140. The inorganic layers may protect the light emitting element layer 130 from moisture and oxygen, and the organic layer may protect the light emitting element layer 130 from foreign substances, such as dust particles. The inorganic layers may include a silicon nitride layer, a silicon oxynitride layer, a silicon oxide layer, a titanium oxide layer, or an aluminum oxide layer. The organic layer may include an acrylic-based organic layer, but the present disclosure is not limited thereto.

The sensor layer 200 may include a base layer 201, a first conductive layer 202, an intermediate insulation layer 203, a second conductive layer 204, and a cover insulation layer 205. The first conductive layer 202 may be referred to as a first layer, and the second conductive layer 204 may be referred to as a second layer.

The base layer 201 may be an inorganic layer including at least one of silicon nitride, silicon oxynitride, and/or silicon oxide. As another example, the base layer 201 may be an organic layer including an epoxy resin, an acrylic resin, or an imide-based resin. The base layer 201 may have a single-layer structure, or a multi-layered structure laminated in the third direction DR3. In an embodiment of the present disclosure, the sensor layer 200 may not include the base layer 201.

Each of the first conductive layer 202 and the second conductive layer 204 may have a single-layer structure, or a multi-layered structure laminated in the third direction DR3.

Each of the first conductive layer 202 and the second conductive layer 204, which may have the single layered structure, may include a metal layer or a transparent conductive layer. The metal layer may include molybdenum, silver, titanium, copper, aluminum, and/or a suitable alloy thereof. The transparent conductive layer may include a transparent conductive oxide, such as indium tin oxide (ITO), indium zinc oxide (IZO), zinc oxide (ZnO), or indium zinc tin oxide (IZTO). In addition, the transparent conductive layer may include a conductive polymer such as poly (3,4-ethylenedioxythiophene) (PEDOT), a metal nano-wire, or graphene.

Each of the first conductive layer 202 and the second conductive layer 204, which have the multiple layered structure, may include a plurality of metal layers. The metal layers may have, for example, a three-layered structure of titanium/aluminum/titanium. The multi-layered conductive layer may include at least one metal layer and at least one transparent conductive layer.

In an embodiment of the present disclosure, the first conductive layer 202 may have a thickness equal to or greater than that of the second conductive layer 204. When the first conductive layer 202 has a thickness greater than that of the second conductive layer 204, components (e.g., an electrode, a pattern, or a bridge pattern) included in the first conductive layer 202 may have a reduced resistance. Also, because the first conductive layer 202 is disposed below the second conductive layer 204, even when the thickness of the first conductive layer 202 increases, a probability of the components included in the first conductive layer 202 to be recognized due to external light reflection may be less than that of the second conductive layer 204.

At least one of the intermediate insulation layer 203 and/or the cover insulation layer 205 may include an inorganic layer. The inorganic layer may include at least one of aluminum oxide, titanium oxide, silicon oxide, silicon nitride, silicon oxynitride, zirconium oxide, and/or hafnium oxide.

At least one of the intermediate insulation layer 203 and/or the cover insulation layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

As described above, the sensor layer 200 may include the first conductive layer 202 and the second conductive layer

204 as an example, but the present disclosure is not limited thereto. For example, in some embodiments, the sensor layer 200 may include three or more conductive layers.

Figure 6B:
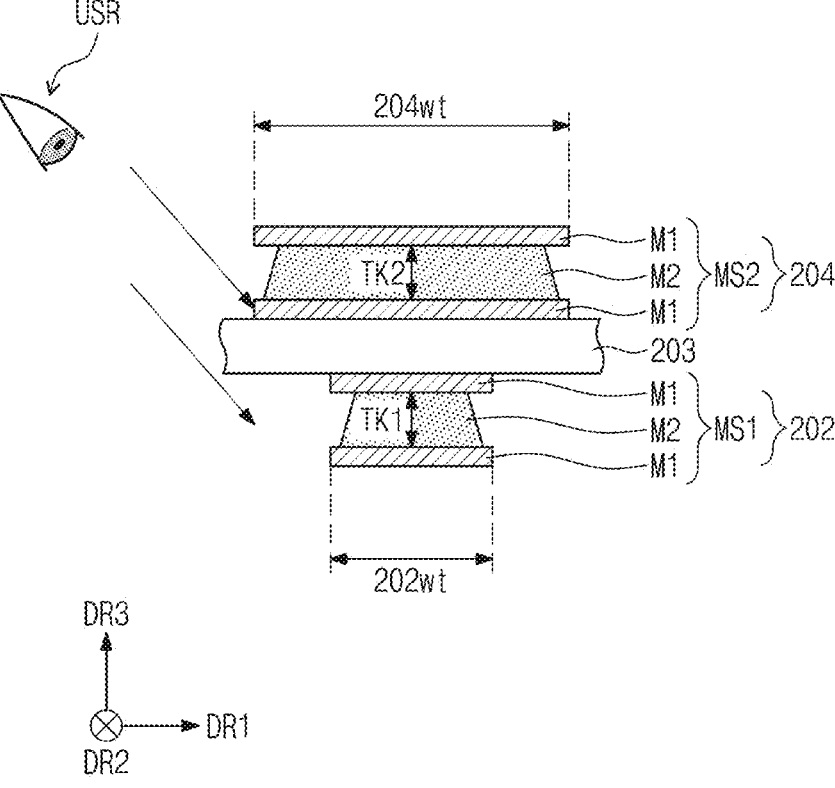
FIG. 6B is a cross-sectional view illustrating a sensor layer according to an embodiment of the present disclosure.

FIG. 6B is a cross-sectional view illustrating the sensor layer 200 according to an embodiment of the present disclosure.

Referring to FIGS. 6A and 6B, a second mesh line MS2 of the second conductive layer 204 may have a second width 204wt equal to or greater than a first width 202wt of a first mesh line MS1 of the first conductive layer 202. When a user USR views the first mesh line MS1 and the second mesh line MS2 from side surfaces thereof, because the first mesh line MS1 may have a width less than that of the second mesh line MS2, a probability of the first mesh line MS1 to be recognized by the user USR may be reduced.

Each of the first mesh line MS1 and the second mesh line MS2 may include first metal layers M1, and a second metal layer M2 disposed between the first metal layers M1. For example, the first metal layers M1 may include titanium (Ti), and the second metal layer M2 may include aluminum (Al). However, the present disclosure is not limited thereto.

In an embodiment of the present disclosure, a first thickness TK1 of the second metal layer M2 of the first mesh line MS1 and a second thickness TK2 of the second metal layer M2 of the second mesh line MS2 may be the same or substantially the same as each other. However, the present disclosure is not limited thereto. For example, the first thickness TK1 may be greater than the second thickness TK2. As another example, the second thickness TK2 may be greater than the first thickness TK1. In an embodiment of the present disclosure, each of the first thickness TK1 and the second thickness TK2 may be 1000 Å or more, for example, such as 6000 Å.

Figure 7:
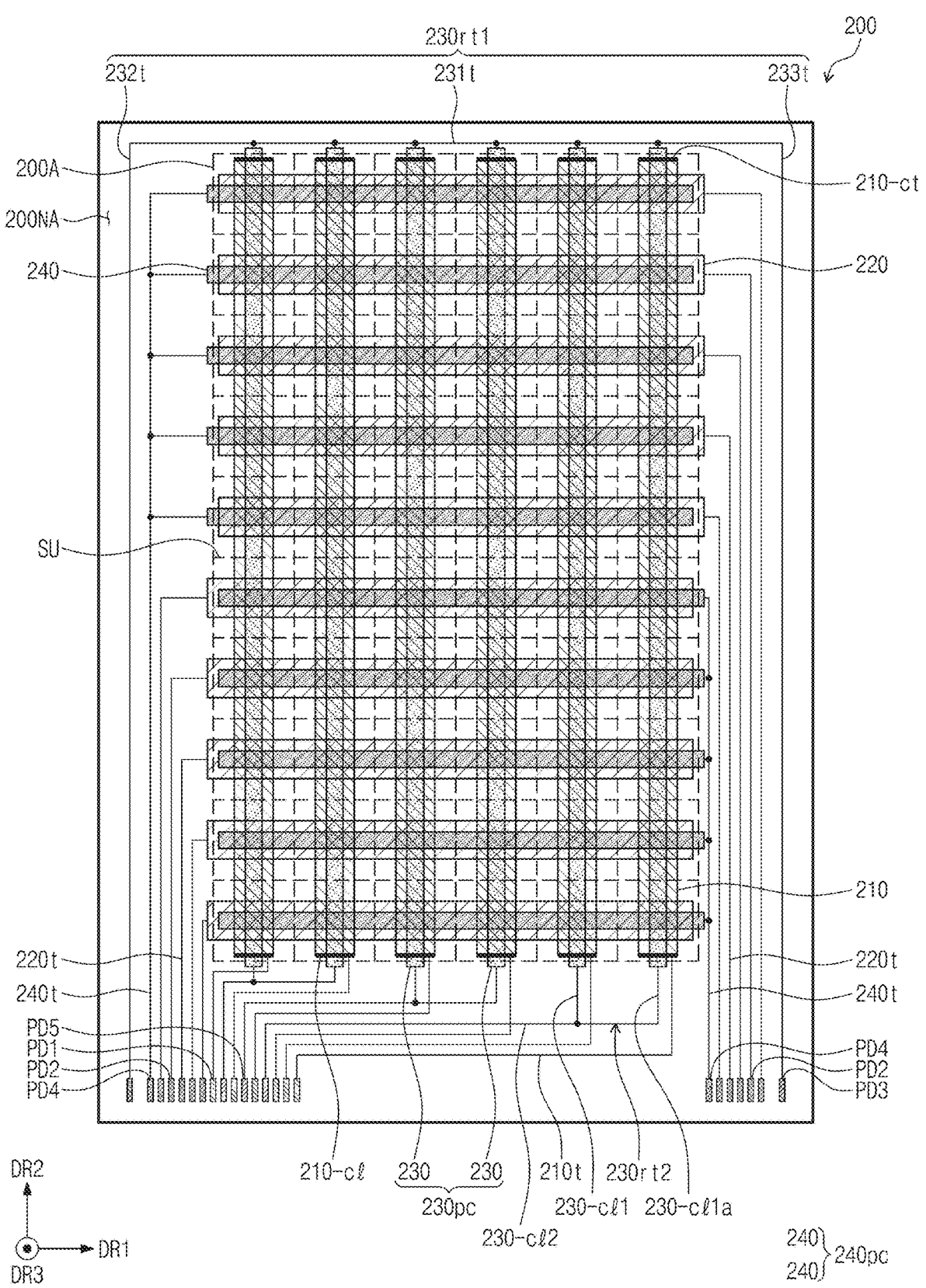
FIG. 7 is a plan view illustrating the sensor layer according to an embodiment of the present disclosure.

FIG. 7 is a plan view illustrating the sensor layer 200 according to an embodiment of the present disclosure.

Referring to FIG. 7, a sensing area 200A and a peripheral area 200NA disposed adjacent to the sensing area 200A may be defined at (e.g., in or on) the sensor layer 200.

The sensor layer 200 may include a plurality of first electrodes 210, a plurality of second electrodes 220, a plurality of third electrodes 230, and a plurality of fourth electrodes 240 disposed at (e.g., in or on) the sensing area 200A. The first electrodes 210 may be referred to as first sensing electrodes, the second electrodes 220 may be referred to as second sensing electrodes, the third electrodes 230 may be referred to as first electrodes, and the fourth electrodes 240 may be referred to as second electrodes.

The first electrodes 210 and the second electrodes 220 may cross each other. The first electrodes 210 may each extend in the second direction DR2, and may be spaced apart from each other along the first direction DR1. The second electrodes 220 may each extend in the first direction DR1, and may be spaced apart from each other along the second direction DR2. A sensing unit (e.g., a sensor, a sensor area, or sensing node) SU of the sensor layer 200 may be an area in which one first electrode 210 crosses one second electrode 220.

Although six first electrodes 210, ten second electrodes 220, and sixty sensing units SU are illustrated as an example in FIG. 7, the present disclosure is not limited thereto, and the number of each of the first electrodes 210 and the second electrodes 220 may be variously modified as needed or desired.

The third electrodes 230 may each extend in the second direction DR2, and may be spaced apart from each other along the first direction DR1. One third electrode 230 may overlap with at least a portion of one first electrode 210.

According to an embodiment of the present disclosure, a capacitance (e.g., a coupling capacitance) between one first electrode 210 and one third electrode 230 may be adjusted by adjusting an overlap area between the one first electrode 210 and the one third electrode 230.

In an embodiment of the present disclosure, at least some of the third electrodes 230 may be electrically connected in parallel to each other. For example, in FIG. 7, two third electrodes 230 may be connected in parallel with each other to provide a first electrode group 230pc, and three first electrode groups 230pc may be arranged along the first direction DR1. However, the present disclosure is not limited thereto, and the number of the third electrodes 230 of the first electrode group 230pc may be variously modified as needed or desired. For example, in some embodiments, one first electrode group 230pc may include only one third electrode 230, or may include three or more third electrodes 230.

As the number of third electrodes 230 included in the first electrode group 230pc and connected in parallel to each other increases, a resistance of the first electrode group 230pc decreases, and thus, a power efficiency and sensing sensitivity may be improved. On the other hand, as the number of third electrodes 230 included in the first electrode group 230pc decreases, a loop coil pattern provided by using the first electrode group 230pc may be designed to have more various shapes.

The fourth electrodes 240 may be arranged along the second direction DR2, and may each extend in the first direction DR1. One fourth electrode 240 may overlap with at least a portion of one second electrode 220. According to an embodiment of the present disclosure, a capacitance (e.g., a coupling capacitance) between one second electrode 220 and one fourth electrode 240 may be adjusted by adjusting an overlap area between the one second electrode 220 and the one fourth electrode 240.

In an embodiment of the present disclosure, at least some of the fourth electrodes 240 may be electrically connected to one another to constitute a second electrode group 240pc. For example, as illustrated in FIG. 7, five fourth electrodes 240 may be connected to one trace line, for example, such as a fourth trace line 240t, to constitute one second electrode group 240pc. Thus, in FIG. 7, two second electrode groups 240pc are arranged along the second direction DR2. However, the present disclosure is not limited to the number of the fourth electrodes 240 of the second electrode group 240pc illustrated in FIG. 7. For example, the number of fourth electrodes 240 constituting one second electrode group 240pc may be equal to 10, and in this case, the sensor layer 200 may include only one second electrode group 240pc.

The sensor layer 200 may further include a plurality of first trace lines 210t disposed at (e.g., in or on) the peripheral area 200NA, a plurality of first pads PD1 connected to the first trace lines 210t in a one-to-one correspondence manner, a plurality of second trace lines 220t, and a plurality of second pads PD2 connected to the second trace lines 220t in a one-to-one correspondence manner. The first trace lines 210t may be electrically connected to the first electrodes 210 in a one-to-one correspondence manner. The second trace lines 220t may be electrically connected to the second electrodes 220 in a one-to-one correspondence manner.

The sensor layer 200 may further include a third trace line 230rt1 disposed at (e.g., in or on) the peripheral area 200NA, a plurality of third pads PD3 connected to one end and another end (e.g., an opposite end) of the third trace line 230rt1, a plurality of fourth trace lines 240t, a plurality of fourth pads PD4 connected to the fourth trace lines 240t in a one-to-one correspondence manner, a plurality of fifth trace lines 230rt2, and a plurality of fifth pads PD5 connected to the fifth trace lines 230rt2 in a one-to-one correspondence manner.

The third trace line 230rt1 may be electrically connected to the third electrodes 230. In an embodiment of the present disclosure, the third trace line 230rt1 may be electrically connected to all of the third electrodes 230. The third trace line 230rt1 may include a first line portion 231t extending in the first direction DR1 and electrically connected to the third electrodes 230, a second line portion 232t extending from a first end of the first line portion 231t in the second direction DR2, and a third line portion 233t extending from a second end of the first line portion 231t in the second direction DR2.

In an embodiment of the present disclosure, each of the second line portion 232t and the third line portion 233t may have the same or substantially the same resistance as that of one third electrode of the third electrodes 230. Thus, the second line portion 232t and the third line portion 233t may serve as the third electrodes 230 to exhibit an effect in which the third electrodes 230 are disposed even at (e.g., in or on) the peripheral area 200NA. For example, one of the second line portion 232t and/or the third line portion 233t and one of the third electrodes 230 may provide a coil with each other. Thus, a pen disposed on an area adjacent to the peripheral area 200NA may be also sufficiently charged by a loop (e.g., of the coil) including the second line portion 232t or the third line portion 233t.

In an embodiment of the present disclosure, a width of each of the second line portion 232t and the third line portion 233t in the first direction DR1 may be variously adjusted to adjust a resistance of each of the second line portion 232t and the third line portion 233t. However, the present disclosure is not limited thereto, and the first to third line portions 231t, 232t, and 233t may have the same or substantially the same width as each other.

The fifth trace lines 230rt2 may be connected to the first electrode groups 230pc in a one-to-one correspondence manner. In other words, the number of fifth trace lines 230rt2 may correspond to that of first electrode groups 230pc. In FIG. 7, three fifth trace lines 230rt2 and three first electrode groups 230pc are illustrated as an example. The fifth trace lines 230rt2 may be referred to as first loop trace lines, and the third trace line 230rt1 may be referred to as a second loop trace line.

In an embodiment of the present disclosure, the fifth trace lines 230rt2 and the fifth pads PD5 may be omitted as needed or desired, and a charging driving mode for charging the pen may be omitted. In this case, the sensor layer 200 may sense an input from an active kind of pen capable of emitting a magnetic field, even though a magnetic field is not provided from the sensor layer 200.

The fourth trace lines 240t may be spaced apart from each other with the sensing area 200A therebetween. The fourth trace lines 240t may be electrically connected to the second electrode groups 240pc in a one-to-one correspondence manner. In FIG. 7, two second electrode groups 240pc are arranged as an example. The fourth trace line 240t connected to one second electrode group 240pc and the fourth trace line 240t connected to another second electrode group 240pc may be spaced apart from each other with the sensing area 200A therebetween. However, the present disclosure is not limited thereto.

Figure 8A:
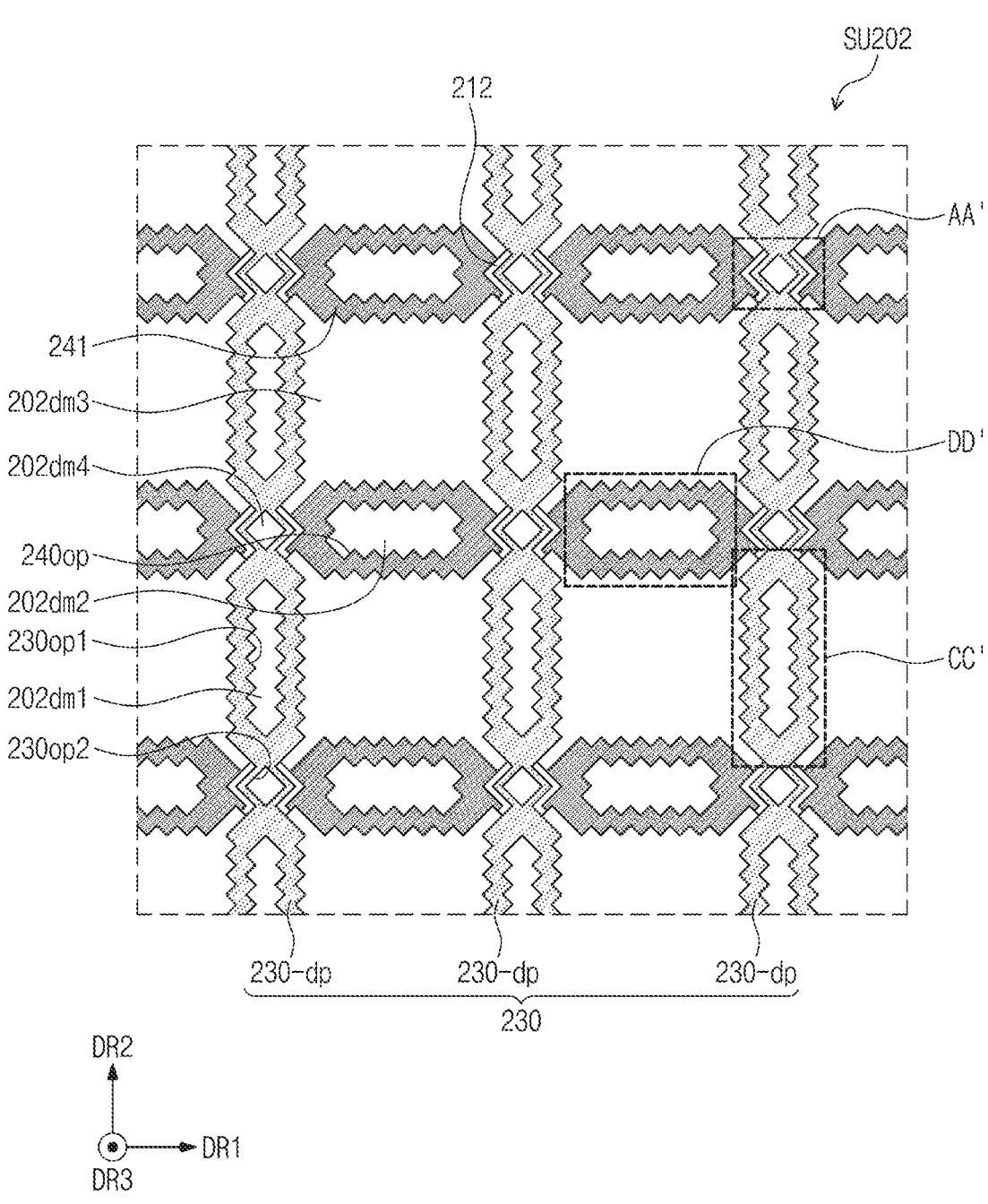
FIG. 8A is a plan view illustrating a first conductive layer of a sensing unit according to an embodiment of the present disclosure.

FIG. 8A is a plan view illustrating a first conductive layer SU202 of the sensing unit SU (e.g., refer to FIG. 7) according to an embodiment of the present disclosure. FIG.

Figure 9A:
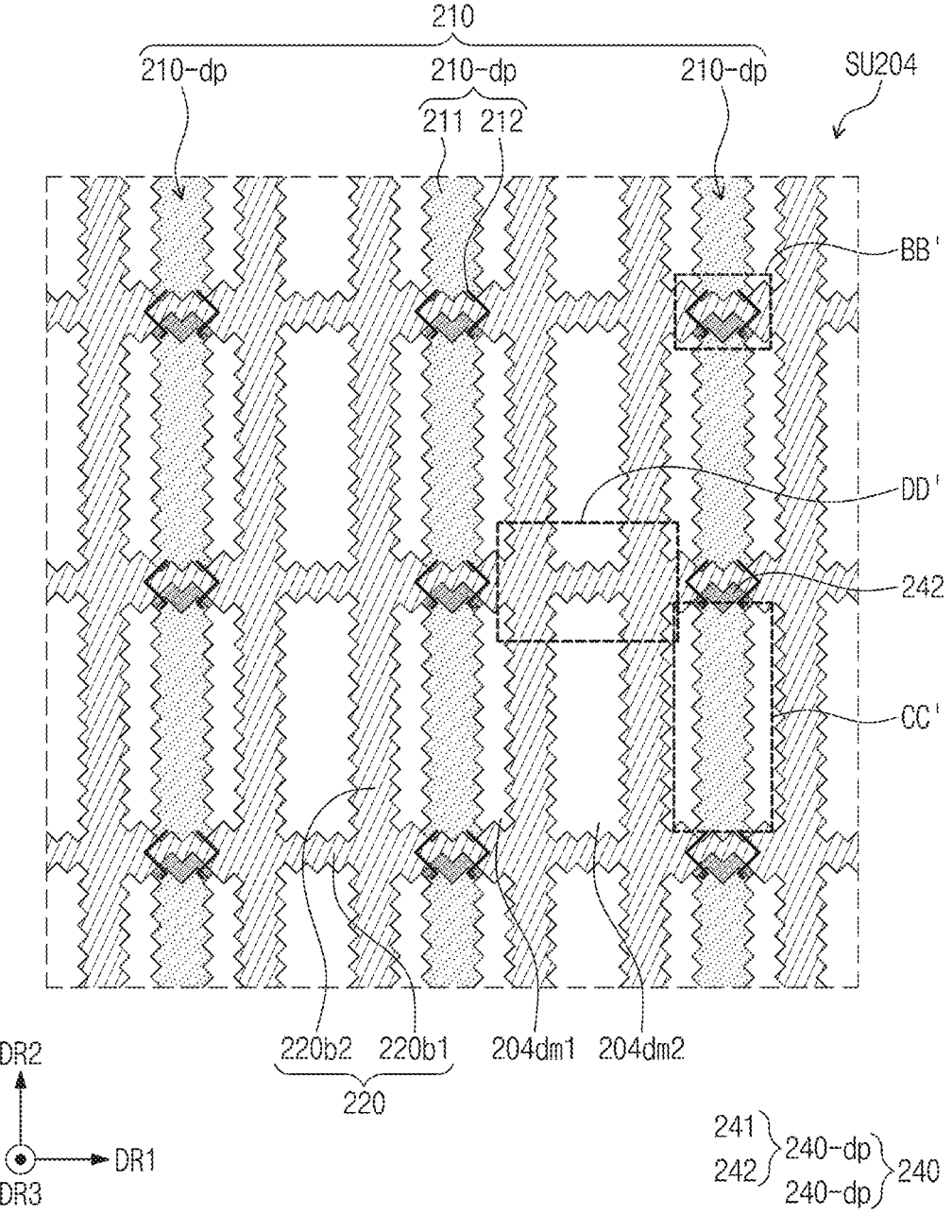
FIG. 9A is a plan view illustrating a second conductive layer of the sensing unit according to an embodiment of the present disclosure.
Figure 9B:
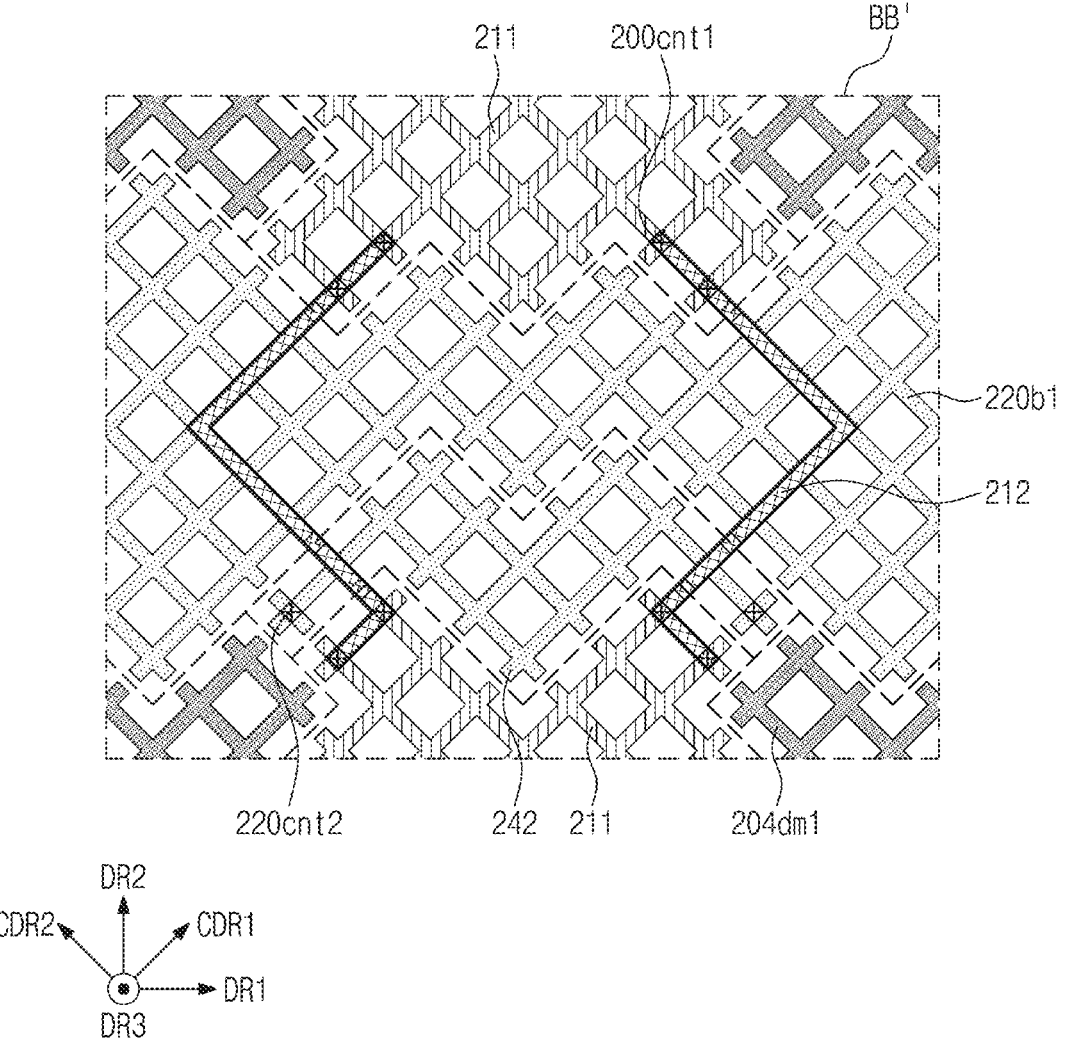
FIG. 9B is an enlarged plan view illustrating the area BB' in FIG. 9A.

8B is an enlarged plan view illustrating the area AA' in FIG. 8A. FIG. 9A is a plan view illustrating a second conductive layer SU204 of the sensing unit SU (e.g., refer to FIG. 7) according to an embodiment of the present disclosure. FIG. 9B is an enlarged plan view illustrating the area BB' in FIG. 9A.

Figure 8B:
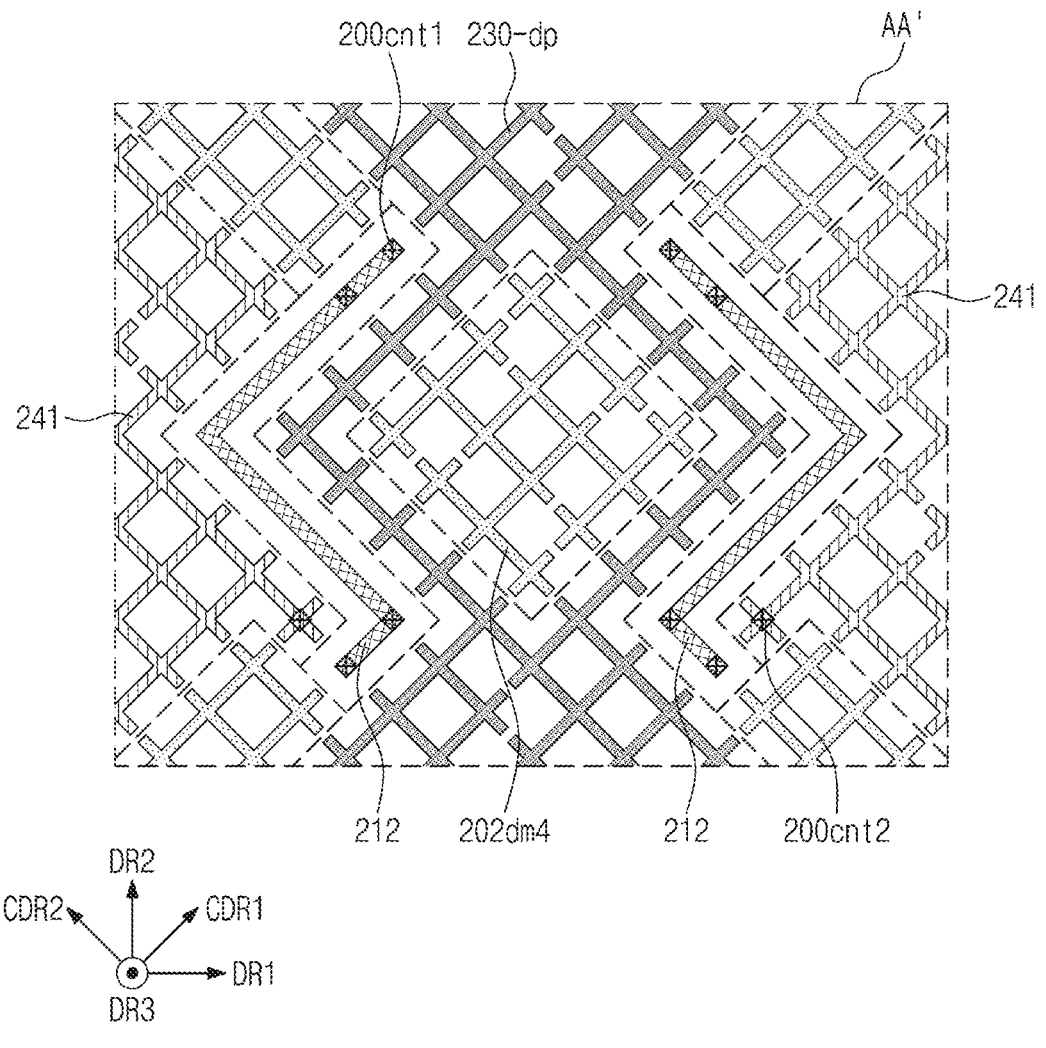
FIG. 8B is an enlarged plan view illustrating the area AA' in FIG. 8A.

In FIGS. 8A and 9A, a boundary between components is illustrated by a line for convenience of illustration, instead of illustrating a shape of a mesh structure. In other words, the lines illustrated in FIGS. 8A and 9A may correspond to cutting lines that cut the mesh structure as illustrated in FIGS. 8B and 9B, and the cutting lines are illustrated as dashed lines in FIGS. 8B and 9B.

Shapes of the sensing unit SU illustrated in FIGS. 7, 8A, 8B, 9A, and 9B are representative examples, and the present disclosure is not limited thereto. The sensing unit SU may have various suitable shapes in other embodiments.

Referring to FIGS. 7, 8A, 8B, 9A, and 9B, the first electrode 210 may include a plurality of first divided electrodes 210-*dp* that are spaced apart from each other in the first direction DR1. Each of the first divided electrodes 210-*dp* may extend in the second direction DR2. The first divided electrodes 210-*dp* may be referred to as first sub electrodes 210-*dp*.

The third electrode 230 may include a plurality of second divided electrodes 230-*dp* that are spaced apart from each other in the first direction DR1. Each of the second divided electrodes 230-*dp* may extend in the second direction DR2. The second divided electrodes 230-*dp* may be referred to as second sub electrodes 230-*dp*. Each of the second divided electrodes 230-*dp* may include ring-shaped patterns, and may have a shape in which the patterns are connected to each other.

When viewed in the third direction DR3 (e.g., in a plan view), the second divided electrodes 230-*dp* may overlap with the first divided electrodes 210-*dp* in a one-to-one correspondence manner. As used herein, the term overlapping and the like represents that at least a portion of one first divided electrode 210-*dp* overlaps with at least a portion of one second divided electrode 230-*dp* (e.g., in the third direction).

Although one sensing unit SU includes three first divided electrodes 210-*dp* and three second divided electrodes 230-*dp* as an example as illustrated in FIGS. 8A and 9A, the present disclosure is not limited thereto. For example, each of the number of first divided electrodes 210-*dp* and the number of second divided electrodes 230-*dp* included in one sensing unit SU may be one, two, four, or more. Each of the first divided electrodes 210-*dp* and the second divided electrodes 230-*dp* may correspond to a signal transmission path or a resistance path through which a signal is transmitted.

Referring to FIGS. 7 and 8A together, one fifth trace line 230*rt*2 is electrically connected to one first electrode group 230*pc*. One first electrode group 230*pc* may include two third electrodes 230. In this case, the one fifth trace line 230*rt*2 may be electrically connected to six second divided electrodes 230-*dp*. As such, a degree of an increase in the number of pads in the sensor layer 200 may be decreased.

Compared to a case in which the first electrode 210 in one sensing unit SU has a single shape instead of being divided, when the first electrode 210 in one sensing unit SU includes the first divided electrodes 210-*dp*, the first divided electrodes 210-*dp* may be arranged in a relatively more even distribution in one sensing unit SU. In this case, signals may be provided more evenly or detected in one sensing unit SU.

Also, when the first electrode 210 in one sensing unit SU includes the first divided electrodes 210-*dp*, when compared with a case in which the first electrode 210 in one sensing unit SU is not divided, the number of first bridge patterns 212 in one sensing unit SU may be increased. Considering the two first bridge patterns 212 connected to the same two first patterns 211 as one pair, nine pairs of first bridge patterns 212 may be arranged as an example as illustrated in FIG. 8A. In other words, a total of 18 bridge patterns 212 are illustrated in FIGS. 8A and 9A.

In more detail, an increase in the number of first bridge patterns 212 arranged in the first direction DR1 that crosses the second direction DR2, which is an extension direction of the first electrode 210, may correspond to an increase in the number of signal paths. Thus, as the number of signal paths increases, a resistance of the first electrode 210 may decrease. As a result, a sensing sensitivity of the sensor layer 200 may be improved.

Also, a shape of each of the first divided electrodes 210-*dp* may be close to or similar to a bar shape extending in the second direction DR2, and because the shape is close to or similar to the bar shape, the resistance path may be decreased. Thus, when the resistance path decreases, and the number of resistance paths connected in parallel to each other within one first electrode 210 is increased, the resistance of the first electrode 210 may be reduced. As a result, a sensing sensitivity of the sensor layer 200 may be improved.

Also, as the shape of each of the first divided electrodes 210-*dp* is close to or similar to the bar shape extending in the second direction DR2, a ratio of an area that is usable for a pattern design within an entire area of one sensing unit SU may be increased. Thus, a degree of freedom of the pattern design may be improved.

According to an embodiment of the present disclosure, the degree of freedom of the pattern design of the sensing unit SU may be improved, and the resistance of the electrodes included in the sensing unit SU may be reduced. In this case, a frequency range (e.g., a bandwidth) applicable to a signal provided to the sensor layer 200 may be more easily secured. Thus, a degree of freedom of a frequency selection may be improved.

Referring to FIGS. 8A and 9A, each of the first divided electrodes 210-*dp* may include a plurality of first patterns 211, and a plurality of first bridge patterns 212 electrically connected to the first patterns 211. In FIG. 9A, the first bridge patterns 212 of the first conductive layer SU202 and the second conductive layer SU204 of the sensing unit SU (e.g., refer to FIG. 7) are illustrated together to show an alignment relationship therebetween. Although two adjacent first patterns 211 may be connected to each other by two first bridge patterns 212, the present disclosure is not limited to the number of first bridge patterns 212. The first patterns 211 and the first bridge patterns 212 may be electrically connected to each other through contact holes 200*cnt*1 (e.g., refer to FIGS. 8B and 9B) defined in the intermediate insulation layer 203 (e.g., refer to FIG. 6A).

Referring to FIG. 9A, the second electrode 220 may include a plurality of first branch portions 220*b*1 extending in the first direction DR1, and a plurality of second branch portions 220*b*2 extending in the second direction DR2 crossing the first direction DR1. The first branch portions 220*b*1 may be spaced apart from each other in the second direction DR2. The second branch portions 220*b*2 may be spaced apart from each other in the first direction DR1. The first branch portions 220*b*1 and the second branch portions 220*b*2 may be connected to each other, and may have an integrated shape.

A portion of the first branch portion 220*b*1 and a second bridge pattern 242 described in more detail below may be disposed between two adjacent first patterns 211. The first bridge patterns 212 may cross a portion of the first branch portion 220*b*1 and one second bridge pattern 242 in an insulating manner.

Referring to FIGS. 8A and 9A, the fourth electrode 240 may include a plurality of third divided electrodes 240-*dp* that are spaced apart from each other in the second direction DR2. Each of the third divided electrodes 240-*dp* may extend in the first direction DR1. Each of the third divided electrodes 240-*dp* may include a plurality of second patterns 241, and a plurality of second bridge patterns 242 electrically connected to the second patterns 241. Each of the second patterns 241 may have a ring shape. The second patterns 241 and the second bridge patterns 242 may be electrically connected to each other through contact holes 200*cnt*2 (e.g., refer to FIGS. 8B and 9B) defined in the intermediate insulation layer 203 (e.g., refer to FIG. 6A). Two adjacent second patterns 241 may be spaced apart from each other, with one second divided electrode 230-*dp* and two first bridge patterns 212 therebetween.

Referring to FIGS. 8A and 8B, the second divided electrodes 230-*dp*, the first bridge patterns 212, and the second patterns 241 may be disposed at (e.g., in or on) the same layer as each other, and may include the same material as each other. For example, the second divided electrodes 230-*dp*, the first bridge patterns 212, and the second patterns 241 may be contained in the first conductive layer SU202.

Referring to FIGS. 9A and 9B, the first patterns 211, the first branch portions 220*b*1, the second branch portions 220*b*2, and the second bridge patterns 242 may be disposed at (e.g., in or on) the same layer as each other, and may include the same material as each other. For example, the first patterns 211, the first branch portions 220*b*1, the second branch portions 220*b*2, and the second bridge patterns 242 may be contained in the second conductive layer SU204.

Referring to FIGS. 8A and 9A, an area occupied by the components included in the first electrode 210 and the second electrode 220 in the second conductive layer SU204 within one sensing unit SU may be greater than that occupied by the components included in the third electrode 230 and the fourth electrode 240. A variation of a capacitance caused by a first input 2000 (e.g., refer to FIG. 4) may increase as a distance decreases. Thus, the components for detecting the first input 2000 (e.g., refer to FIG. 4) may occupy a relatively greater area in a layer that is adjacent to a surface of the electronic device 1000 (e.g., refer to FIG. 1A). As a result, a touch performance may be improved.

Referring to FIGS. 8B and 9B, each of the second divided electrodes 230-*dp*, the second patterns 241, the first patterns 211, the second electrode 220, and the second bridge patterns 242 may have a mesh structure. Each of the mesh structures may include a plurality of mesh lines. The plurality of mesh lines may each have a shape extending in a corresponding direction (e.g., a predetermined direction), and may be connected to each other. The shape of the mesh lines may include various suitable shapes, such as a straight line, a line with protrusions, or an uneven line. The mesh lines may include various suitable shapes, such as a straight line, a line with projections, or a wavy line. Openings that are at least partially surrounded (e.g., around peripheries thereof) by the mesh lines may be defined (e.g., may be provided) in each of the mesh structures. The openings may overlap with the light emitting area PXA (e.g., refer to FIG. 6A), and the mesh lines may overlap with the non-light emitting area NPXA. However, the present disclosure is not limited thereto.

As shown in FIGS. 8B and 9B, the mesh structure may include mesh lines extending in a first crossing direction CDR1 that crosses the first direction DR1 and the second direction DR2, and mesh lines extending in a second crossing direction CDR2 that crosses the first crossing direction CDR1, as an example. However, the present disclosure is not limited to the extension directions of the mesh lines of the mesh structures. For example, the mesh structure may include only mesh lines extending in the first direction DR1 and the second direction DR2, or mesh lines extending in the first direction DR1, the second direction DR2, the first crossing direction CDR1, and the second crossing direction CDR2. In other words, the mesh structure may have various suitable shapes.

Referring to FIGS. 8A and 9A, in an embodiment of the present disclosure, a first opening 230*op*1 overlapping with a portion of the first electrode 210 may be defined (e.g., may be provided) in the third electrode 230. For example, a plurality of first openings 230*op*1 overlapping with the first divided electrodes 210-*dp* may be provided to each of the second divided electrodes 230-*dp*. A first capacitance (e.g., a first coupling capacitance) provided between the first electrode 210 and the third electrode 230 may be variously adjusted as needed or desired according to a size of the first opening 230*op*1.

In an embodiment of the present disclosure, a second opening 240*op* overlapping with a portion of the second electrode 220 may be defined (e.g., may be provided) in the fourth electrode 240. For example, a plurality of second openings 240*op* overlapping with the fourth electrode 240 may be provided to each of the third divided electrodes 240-*dp*. A second capacitance (e.g., a second coupling capacitance) provided between the second electrode 220 and the fourth electrode 240 may be variously adjusted as needed or desired according to a size of the second opening 240*op*.

As the first and second capacitances increase, an amount of an induced current transmitted from the third electrode 230 to the first electrode 210 may increase, and an amount of an induced current transmitted from the fourth electrode 240 to the second electrode 220 may increase. Thus, as the first and second capacitances increase, a pen detection performance of the sensor layer 200 may be improved. Also, the first and second capacitances may act as a load during touch sensing. Thus, as the first and second capacitances decrease, the touch sensing performance may be improved.

According to an embodiment of the present disclosure, an overlap area of the first electrode 210 and the third electrode 230 and an overlap area of the second electrode 220 and the fourth electrode 240 may be adjusted as needed or desired (e.g., may be easily adjusted). Thus, the sensor layer 200 having capacitances at an appropriate level in consideration of a desired touch sensitivity and a desired pen detection sensitivity may be provided. As a result, the electronic device 1000 (e.g., refer to FIG. 1A) having an improved pen sensitivity and touch sensitivity may be provided.

In an embodiment of the present disclosure, a first additional opening 230*op*2 may be further defined in the third electrode 230. For example, the first additional opening 230*op*2 may be disposed between two of the first bridge patterns 212.

In an embodiment of the present disclosure, the first conductive layer SU202 may further include a first dummy pattern 202dm1, a second dummy pattern 202dm2, a third dummy pattern 202dm3, and a fourth dummy pattern 202dm4. Each of the first to fourth dummy patterns 202dm1, 202dm2, 202dm3, and 202dm4 may be floated (e.g., electrically floated). Each of the first to fourth dummy patterns 202dm1, 202dm2, 202dm3, and 202dm4 may be divided into a plurality of conductive patterns. For example, one fourth dummy pattern 202dm4 may include a plurality of floating dummy patterns that are separated (e.g., electrically separated) from each other.

The first dummy pattern 202dm1 may be surrounded (e.g., around a periphery thereof) by the first opening 230op1, and may be insulated from the third electrode 230. In an embodiment of the present disclosure, the first dummy pattern 202dm1 may entirely overlap with the first electrodes 210. In other words, an entire or substantially an entire area of the first dummy pattern 202dm1 may overlap with the first electrode 210 (e.g., may overlap with the first pattern 211).

The second dummy pattern 202dm2 may be surrounded (e.g., around a periphery thereof) by the second opening 240op, and may be insulated from the fourth electrode 240. For example, the second dummy pattern 202dm2 may be surrounded (e.g., around a periphery thereof) by the second pattern 241. In an embodiment of the present disclosure, one portion of the second dummy pattern 202dm2 may overlap with the second electrode 220, and another portion of the second dummy pattern 202dm2 may not overlap with the second electrode 220.

The third dummy pattern 202dm3 may be surrounded (e.g., around a periphery thereof) by the first additional opening 230op2, and may be insulated from the third electrode 230. The fourth dummy pattern 202dm4 may be surrounded (e.g., around a periphery thereof) by two second divided electrodes 230-dp and two third divided electrodes 240-dp.

In an embodiment of the present disclosure, the second conductive layer SU204 may further include a fifth dummy pattern 204dm1 and a sixth dummy pattern 204dm2. Each of the fifth and sixth dummy patterns 204dm1 and 204dm2 may be floated (e.g., electrically floated). Each of the fifth dummy pattern 204dm1 and the sixth dummy pattern 204dm2 may be divided into a plurality of conductive patterns. For example, one fifth dummy pattern 204dm1 may include a plurality of floating dummy patterns that are electrically separated from each other.

The first dummy pattern 204dm1 may be disposed adjacent to the first divided electrodes 210-dp. One portion of the fifth dummy pattern 204dm1 may overlap with the second divided electrode 230-dp, and another portion of the fifth dummy pattern 204dm1 may not overlap with the fourth dummy pattern 202dm4.

The sixth dummy pattern 204dm2 may be entirely or substantially entirely surrounded (e.g., around a periphery thereof) by the second electrode 220. For example, the sixth dummy pattern 240dm2 may be disposed between two first branch portions 220b1 and two second branch portions 220b2. The sixth dummy pattern 240dm2 may overlap with the other portion of the second dummy pattern 202dm2, the second pattern 241, and the fourth dummy pattern 202dm4.

According to an embodiment of the present disclosure, the dummy patterns may be provided in a space in which the first to fourth electrodes 210, 220, 230, and 240 are not disposed in each of the first conductive layer SU202 and the second conductive layer SU204. Each of the dummy patterns may also have the mesh structure. Thus, because the mesh lines are disposed over the entire or substantially entire sensing unit SU, a probability of specific patterns being recognized by external light reflection may be reduced. In other words, the electronic device 1000 (e.g., refer to FIG. 1A) having improved visibility against external light reflection may be provided.

An example of the structure in which each of the first to fourth electrodes 210, 220, 230, and 240 is divided to be arranged at (e.g., in or on) two conductive layers SU202 and SU204 has been described above with reference to FIGS. 8A to 9B. However, the present disclosure is not limited thereto. For example, the first to fourth electrodes 210, 220, 230, and 240 may be divided to be arranged at (e.g., in or on) three or four conductive layers.

In an embodiment of the present disclosure, the third electrode 230 to which a signal is applied in the charging driving mode may be included in a third conductive layer disposed below (e.g., underneath) the first and second conductive layers SU202 and SU204. For example, the third conductive layer may be disposed below (e.g., underneath) the base layer 201. The third conductive layer may be disposed between the base layer 201 and the display layer 100, may be disposed below (e.g., underneath) the display layer 100, or may be included in the display layer 100.

The first, second, and fourth electrodes 210, 220, and 240 may be included in the first and second conductive layers SU202 and SU204. For example, when the third electrode 230 is realized as a separate conductive layer like the third conductive layer described above, a shape of the third electrode 230 may be variously designed more freely. For example, the third electrode 230 may have a shape including a plurality of coils. Also, the third electrode 230 may be provided more densely by using the third conductive layer, and in this case, the pen sensing sensitivity may be improved. In another embodiment of the present disclosure, the third conductive layer may include the fourth electrode 240, instead of the third electrode 230.

Figure 10A:
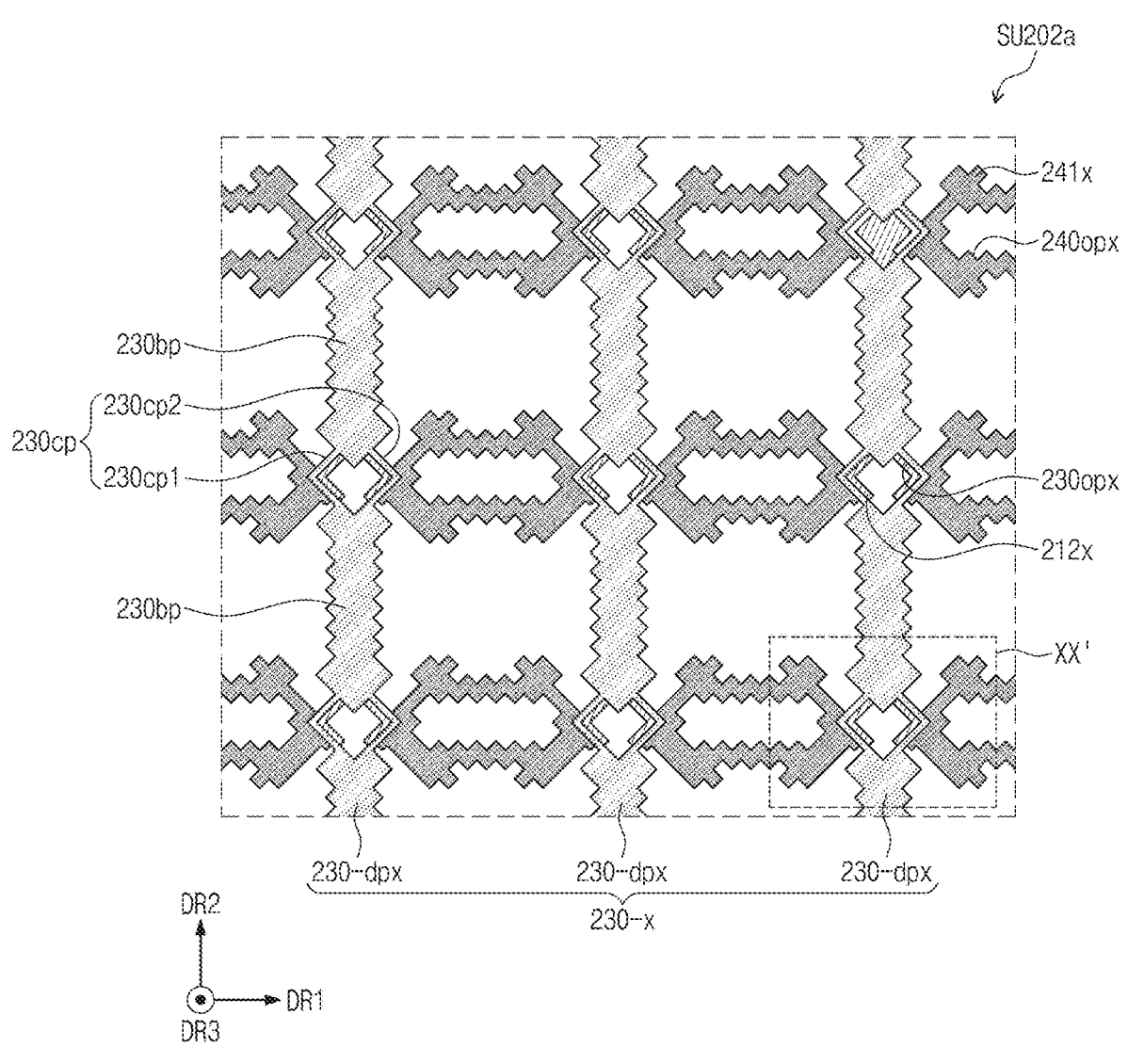
FIG. 10A is a plan view illustrating the first conductive layer of the sensing unit according to an embodiment of the present disclosure.
Figure 10B:
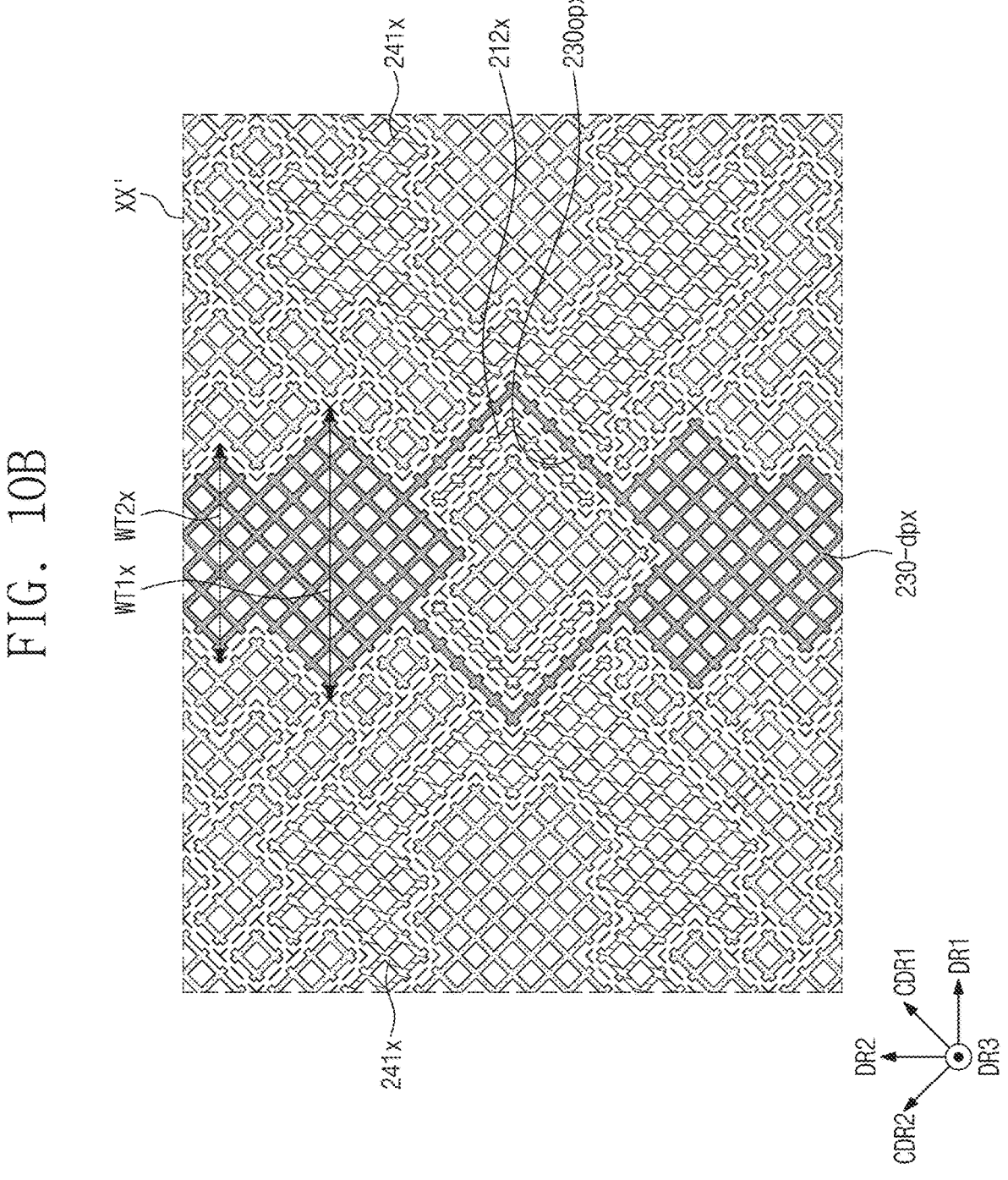
FIG. 10B is an enlarged plan view illustrating the area XX' in FIG. 10A.
Figure 11A:
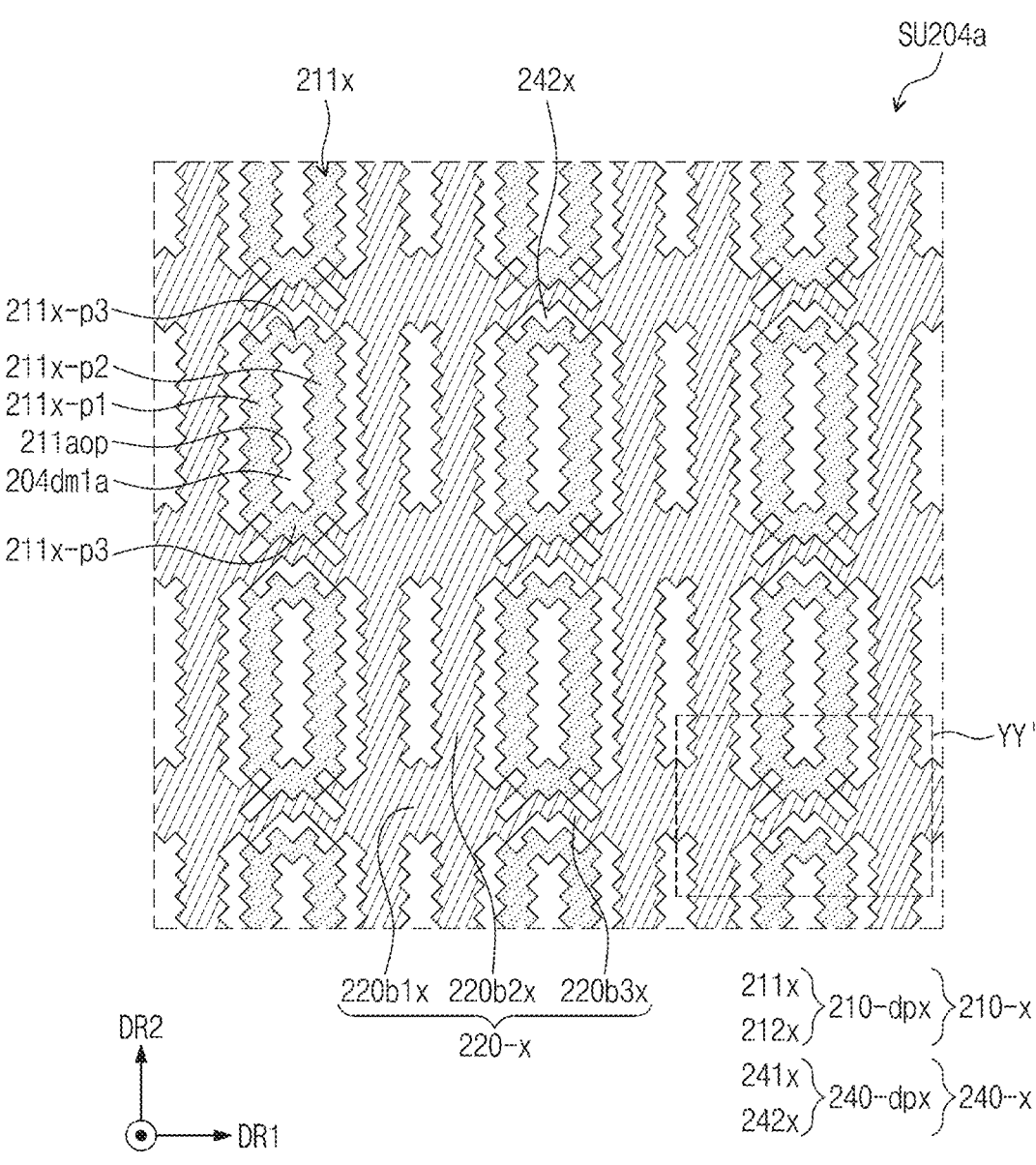
FIG. 11A is a plan view illustrating the second conductive layer of the sensing unit according to an embodiment of the present disclosure.
Figure 11B:
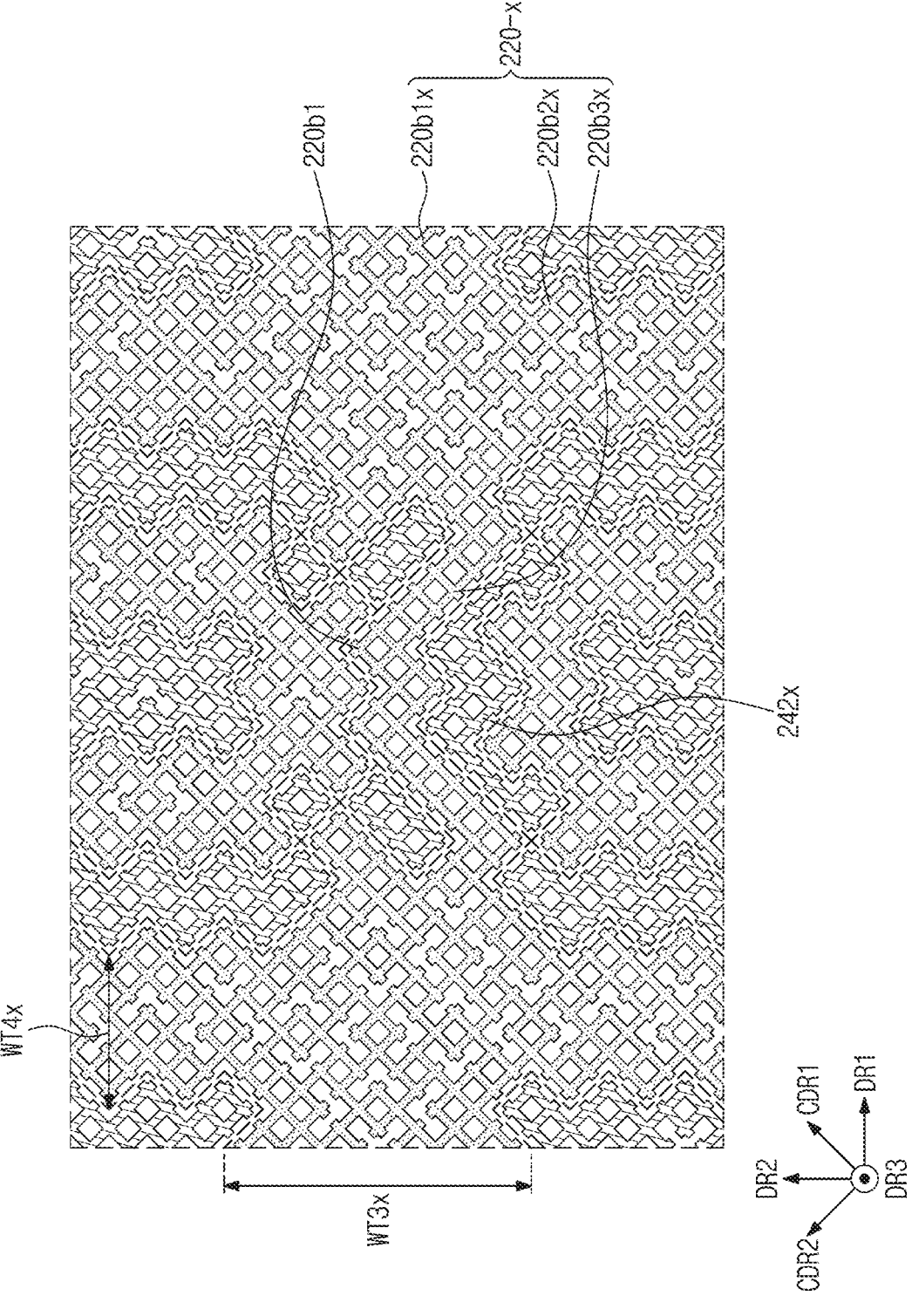
FIG. 11B is an enlarged plan view illustrating the area YY' in FIG. 11A.

FIG. 10A is a plan view illustrating a first conductive layer SU202a of the sensing unit SU (e.g., refer to FIG. 7) according to an embodiment of the present disclosure. FIG. 10B is an enlarged plan view illustrating the area XX' in FIG. 10A. FIG. 11A is a plan view illustrating a second conductive layer SU204a of the sensing unit SU (e.g., refer to FIG. 7) according to an embodiment of the present disclosure. FIG. 11B is an enlarged plan view illustrating the area YY' in FIG. 11A.

In FIGS. 10A and 11A, a boundary between components is illustrated by a line for convenience of illustration, instead of illustrating a shape of a mesh structure. In other words, it may be understood that the lines illustrated in FIGS. 10A and 11A may correspond to cutting lines that cut the mesh structure as illustrated in FIGS. 10B and 11B, and the cutting lines are illustrated by dashed lines in FIGS. 10B and 11B.

Referring to FIGS. 7, 10A, 10B, 11A, and 11B, the first electrode 210-x may include a plurality of first divided electrodes 210-dpx that are spaced apart from each other in the first direction DR1. Each of the first divided electrodes 210-dpx may extend in the second direction DR2. The third electrode 230-x may include a plurality of second divided electrodes 230-dpx that are spaced apart from each other in the first direction DR1. Each of the second divided electrodes 230-dpx may extend in the second direction DR2.

When viewed in the third direction DR3 (e.g., in a plan view), the second divided electrodes 230-dpx may overlap with the first divided electrodes 210-dpx in a one-to-one correspondence manner. As used herein, a feature of overlapping represents that at least a portion of one first divided electrode 210-*dpx* overlaps with at least a portion of one second divided electrode 230-*dpx* (e.g., in the third direction DR3).

According to an embodiment of the present disclosure, each of the first divided electrodes 210-*dpx* may include a plurality of first patterns 211*x*, and a plurality of first bridge patterns 212*x* electrically connected to the first patterns 211*x*.

According to an embodiment of the present disclosure, each of the first patterns 211*x* has a ring shape, and a portion of each of the second divided electrodes 230-*dpx*, which overlaps with the first patterns 211*x*, may have a bar or an approximately bar shape. In this case, an overlapping area between the first electrode 210-*x* and the third electrode 230-*x* may be more easily adjusted by adjusting an inner diameter size of each of the first patterns 211*x*, or a width of each of the second divided electrodes 230-*dpx*.

According to an embodiment of the present disclosure, the first divided electrode 210-*dpx* includes first patterns 211*x* and first bridge patterns 212*x*, which are arranged at (e.g., in or on) different layers from each other, and the first patterns 211*x* and the first bridge patterns 212*x* may be electrically connected to each other through a contact. In this case, a resistance may be increased relatively to a case in which the first patterns 211*x* and the first bridge patterns 212*x* are arranged at (e.g., in or on) the same layer as each other and integrated with each other.

In an embodiment of the present disclosure, a resistance of a portion of the second divided electrode 230-*dpx*, which overlaps with the first pattern 211*x*, may be less than that of the first pattern 211*x*. However, the present disclosure is not limited thereto. A resistance relationship may be variously modified according to a size of a width of a ring of the first pattern 211*x*, or a width of a portion of the second divided electrode 230-*dpx*.

Each of the second divided electrodes 230-*dpx* may extend in the second direction DR2 in the same layer. Thus, an increase in a resistance caused by a layer change may not exist in the second divided electrode 230-*dpx*. The second divided electrode 230-*dpx* may be an electrode to which a signal is applied in a charging driving mode that will be described in more detail below. Thus, as the resistance of the second divided electrode 230-*dpx* decreases, an intensity of each of a current and a magnetic field for charging the resonant circuit of the pen PN (e.g., refer to FIG. 5) may increase.

According to an embodiment of the present disclosure, because the portion of each of the second divided electrodes 230-*dpx*, which overlaps with the first patterns 211*x*, has a bar or an approximately bar shape, the second divided electrode 230-*dpx* may have a shape having a width that is relatively less than that of the first divided electrode 210-*dpx*. In this case, a parasitic capacitance that may occur in each of the second divided electrodes 230-*dpx* may be decreased. Thus, a performance of the sensor layer 200 may be improved.

Referring to FIG. 10B, the second divided electrode 230-*dpx* may include a first portion having a first width WT1*x* in the first direction DR1, and a second portion having a second width WT2*x* in the first direction DR1. The first width WT1*x* may be greater than the second width WT2*x*. For example, the first portion having the first width WT1*x* may be closer to the first bridge patterns 212*x* than the second portion having the second width WT2*x*.

On a plane (e.g., in a plan view), the first portion having the first width WT1*x* may overlap with the first patterns 211*x* to provide a capacitance therebetween. Also, the second portion having the second width WT2*x* may overlap with a dummy pattern surrounded (e.g., around a periphery thereof) by the first patterns 211*x*. An overlapping area between the first electrode 210-*x* and the third electrode 230-*x* may be easily adjusted by adjusting the second width WT2*x*.

An opening 230*opx* may be defined in the second divided electrode 230-*dpx*, and two first bridge patterns 212*x* may be disposed in the opening 230*opx*. When the first bridge patterns 212*x* are surrounded by the second divided electrode 230-*dpx*, capacitances having temperature variant values from among the capacitances occurring in the first electrode 210-*x* may be reduced. Therefore, temperature characteristics of the sensor layer 200 may be improved.

The second electrode 220-*x* may include a plurality of first branch portions 220*b1x*, each extending in the first direction DR1, a plurality of second branch portions 220*b2x*, each extending in the second direction DR2 crossing the first direction DR1, and connection portions 220*b3x* disposed between the first patterns 211*x*. The first branch portions 220*b1x* may be spaced apart from each other in the second direction DR2, and the second branch portions 220*b2x* may be spaced apart from each other in the first direction DR1. The first branch portions 220*b1x*, the second branch portion 220*b2x*, and the connection portions 220*b3x* may be connected to each other to have an integrated shape.

The fourth electrode 240-*x* may include a plurality of third divided electrodes 240-*dpx* that are spaced apart from each other in the second direction DR2. Each of the third divided electrodes 240-*dpx* may extend in the first direction DR1. Each of the third divided electrodes 240-*dpx* may include a plurality of second patterns 241*x*, and a plurality of second bridge patterns 242*x* electrically connected to the second patterns 241*x*. Each of the second patterns 241*x* may have a ring shape. The second patterns 241*x* and the second bridge patterns 242*x* may be electrically connected to each other through contact holes defined in the intermediate insulation layer 203 (e.g., refer to FIG. 6A). Two adjacent second patterns 241 may be spaced apart from each other, with one second divided electrode 230-*dpx* and two first bridge patterns 212*x* therebetween.

In an embodiment of the present disclosure, a third width WT3*x* of each of the first branch portions 220*b1x* in the second direction DR2 may be greater than a fourth width WT4*x* of each of the second branch portions 220*b2x* in the first direction DR1. For example, the first branch portions 220*b1x* may overlap with the second patterns 241*x* and a dummy pattern surrounded (e.g., around a periphery thereof) by the second pattern 241*x*. An overlapping area between the second electrode 220-*x* and the fourth electrode 240-*x* may be easily adjusted by adjusting the third width Wt3*x*. As another example, the overlapping area between the second electrode 220-*x* and the fourth electrode 240-*x* may be easily adjusted by adjusting a size of an inner diameter of the ring shape of each of the second patterns 240*x* surrounding (e.g., around a periphery thereof) the dummy pattern.

According to an embodiment of the present disclosure, each of the third divided electrodes 240-*dpx* includes second patterns 241*x* and second bridge patterns 242*x*, which are arranged at (e.g., in or on) different layers from each other, and the second patterns 241*x* and the second bridge patterns 242*x* may be electrically connected to each other through a contact. In this case, a resistance may be increased relatively to a case in which the second patterns 241*x* and the second bridge patterns 242*x* are arranged at (e.g., in or on) the same layer as each other, and integrated with each other.

In an embodiment of the present disclosure, the third electrode 230-*x* corresponds to a component that transmits a signal in case of the touch detection and the pen sensing, and the fourth electrode 240-$x$ corresponds to a component that provides a capacitance with the third electrode 230-$x$ in case of the pen sensing. Thus, it may be appropriate to reduce a resistance of the third electrode 230-$x$ rather than that of the fourth electrode 240-$x$. Thus, the third electrode 230-$x$ may be realized as a single layer, and the fourth electrode 240-$x$ may be realized as two different layers.

Referring to FIGS. 10B and 11B, the second bridge pattern 242$x$ may include one line (e.g., may include only one line) extending in the first extending direction CDR1 or the second extending direction CDR2 in some sections thereof. In this case, the first bridge pattern 212$x$ overlapping with the second bridge pattern 242$x$ may cross the second bridge pattern 242$x$ in an insulating manner in the some sections. Thus, a capacitance between the first bridge pattern 212$x$ and the second bridge pattern 242$x$ may be minimized or reduced. A more detailed description thereof will be provided below with reference to FIGS. 12 and 13.

Figure 12:
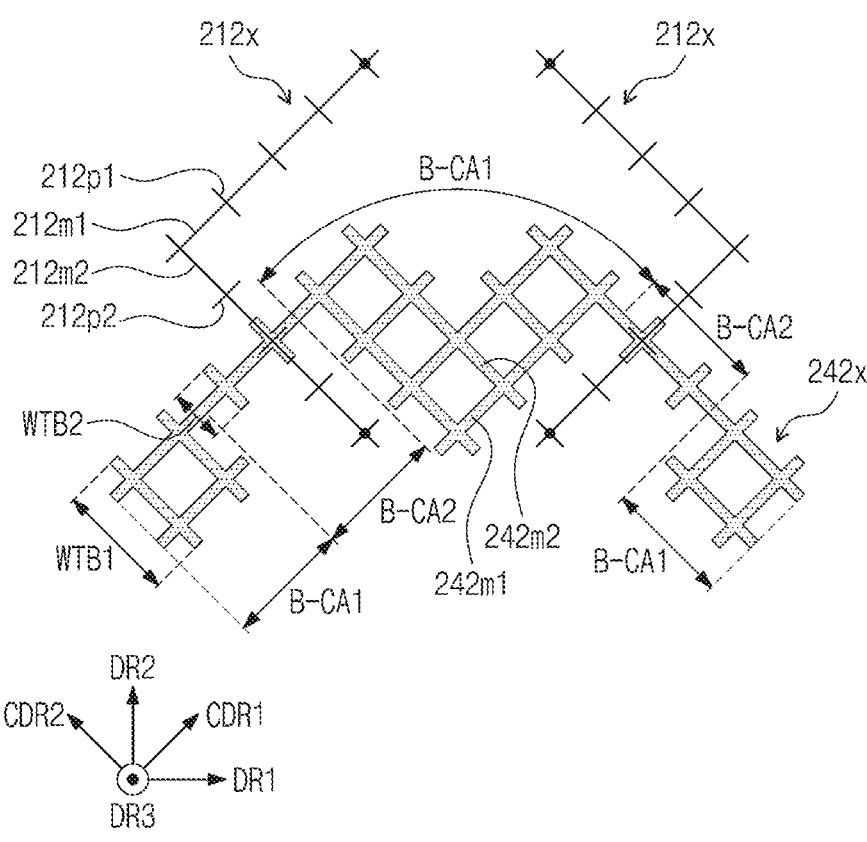
FIG. 12 is a plan view illustrating some components of the sensing unit according to an embodiment of the present disclosure.

FIG. 12 is a plan view illustrating some components of the sensing unit according to an embodiment of the present disclosure.

Referring to FIG. 12, one second bridge pattern 242$x$ and two first bridge patterns 212$x$ that overlap with the one second bridge pattern 242$x$ are illustrated as an example according to an embodiment. In FIG. 12, the first bridge patterns 212$x$ and the second bridge pattern 242$x$ are illustrated with different widths from each other for convenience of distinguishment from each other. A width of each of the first bridge patterns 212$x$ may be equal to or less than that of the second bridge pattern 242$x$.

Each of the first bridge patterns 212$x$ may include a first main line 212$m$1 extending in the first crossing direction CDR1 (or the second crossing direction CDR2) and a second main line 212$m$2 extending in the second crossing direction CDR2 (or the first crossing direction CDR1). For example, the first bridge patterns 212$x$ that are adjacent to each other may be symmetrical or substantially symmetrical with each other with respect to an imaginary axis extending in the second direction DR2 therebetween. One end of the first main line 212$m$1 may cross one end of the second main line 212$m$2. The first bridge pattern 212$x$ may further include a plurality of first projection lines 212$p$1 that cross the first main line 212$m$1, and a plurality of second projection lines 212$p$2 that cross the second main line 212$m$2. The first projection lines 212$p$1 may be spaced apart from each other along the first crossing direction CDR1 (or along the second crossing direction), and the second projection lines 212$p$2 may be spaced apart from each other along the second crossing direction CDR2 (or along the first crossing direction). In another embodiment of the present disclosure, the first projection lines 212$p$1 and the second projection lines 212$p$2 may be omitted as needed or desired.

The second bridge pattern 242$x$ may include first lines 242$m$1, each extending in the first crossing direction CDR1, and second lines 242$m$2, each extending in the second crossing direction CDR2. According to an embodiment of the present disclosure, the second bridge pattern 242$x$ may include first portions B-CA1 in which at least two first lines 242$m$1 cross at least two second lines 242$m$2, and second portions B-CA2 in which one first line 242$m$1 crosses at least one second line 242$m$2, or in which at least one first line 242$m$1 crosses one second line 242$m$2. The second portions B-CA2 may cross each of the first bridge patterns 212$x$. In other words, each of the second portions B-CA2 may cross a corresponding one of the first bridge patterns 212$x$.

In an embodiment of the present disclosure, each of the first portions B-CA1 includes at least two lines extending in the same direction as each other, and each of the second portions B-CA2 includes one line (e.g., only one line) extending in one direction. Thus, a minimum width WTB1 in one direction of each of the first portions B-CA1 may be greater than a minimum width WTB2 in the same one direction of each of the second portions B-CA2.

In the second portions B-CA2, the first bridge patterns 212$x$ that overlap with the second bridge pattern 242$x$ may cross the second bridge pattern 242$x$ in an insulating manner. In this case, a capacitance between the first bridge patterns 212$x$ and the second bridge pattern 242$x$ may be decreased. Also, as the remaining portions of the second bridge pattern 242$x$, which are not overlapping with the first bridge patterns 212$x$, are provided in a shape in which at least two first lines 242$m$1 cross at least two second lines 242$m$2, a probability of recognizing the second bridge pattern 242$x$ by a difference in an external light reflectance may be decreased.

Figure 13:
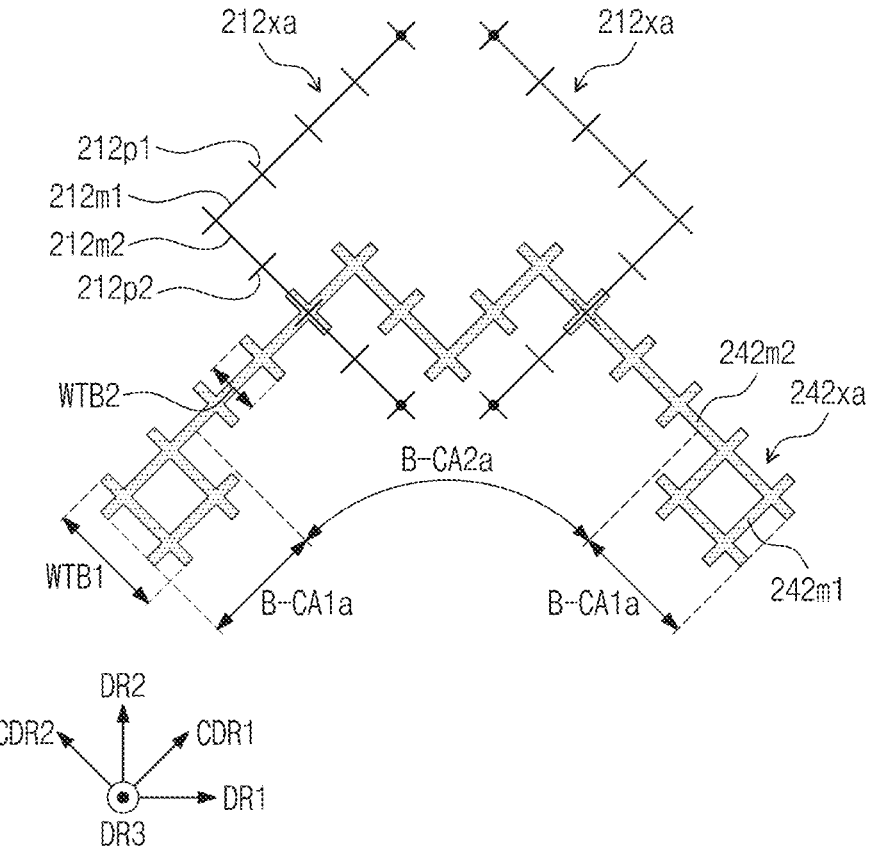
FIG. 13 is a plan view illustrating some components of the sensing unit according to an embodiment of the present disclosure.

FIG. 13 is a plan view illustrating some components of the sensing unit according to an embodiment of the present disclosure. In FIG. 13, the same reference numerals are used to denote the same or substantially the same components as those described above with reference to FIG. 12, and thus, redundant description thereof may not be repeated.

Referring to FIG. 13, one second bridge pattern 242$xa$ and two first bridge patterns 212$xa$ that overlap with the one second bridge pattern 242$xa$ are illustrated as an example according to an embodiment. In FIG. 13, the first bridge patterns 212$xa$ and the second bridge pattern 242$xa$ are illustrated with different widths from each other for convenience of distinguishment. A width of each of the first bridge patterns 212$xa$ may be equal to or less than that of the second bridge pattern 242$xa$.

According to an embodiment of the present disclosure, the second bridge pattern 242$xa$ may include first portions B-CA1$a$ in which at least two first lines 242$m$1 cross at least two second lines 242$m$2, and a second portion B-CA2$a$ in which one first line 242$m$1 crosses at least one second line 242$m$2, or in which at least one first line 242$m$1 crosses one second line 242$m$2. The second portion B-CA2$a$ may cross the first bridge patterns 212$xa$.

When compared with the embodiment described above with reference to FIG. 12, the second portion B-CA2$a$ may have a relatively greater area. The second portion B-CA2$a$ may be an area overlapping with the first bridge patterns 212$xa$. Thus, a degree of freedom of a design of a position of the first bridge patterns 212$xa$ may be improved. Also, because the second portion B-CA2$a$ includes not only the area that overlaps with the first bridge patterns 212$xa$, but also an area adjacent thereto, a capacitance between the first bridge patterns 212$xa$ and the second bridge pattern 242$xa$ may be further decreased.

Figure 14A:
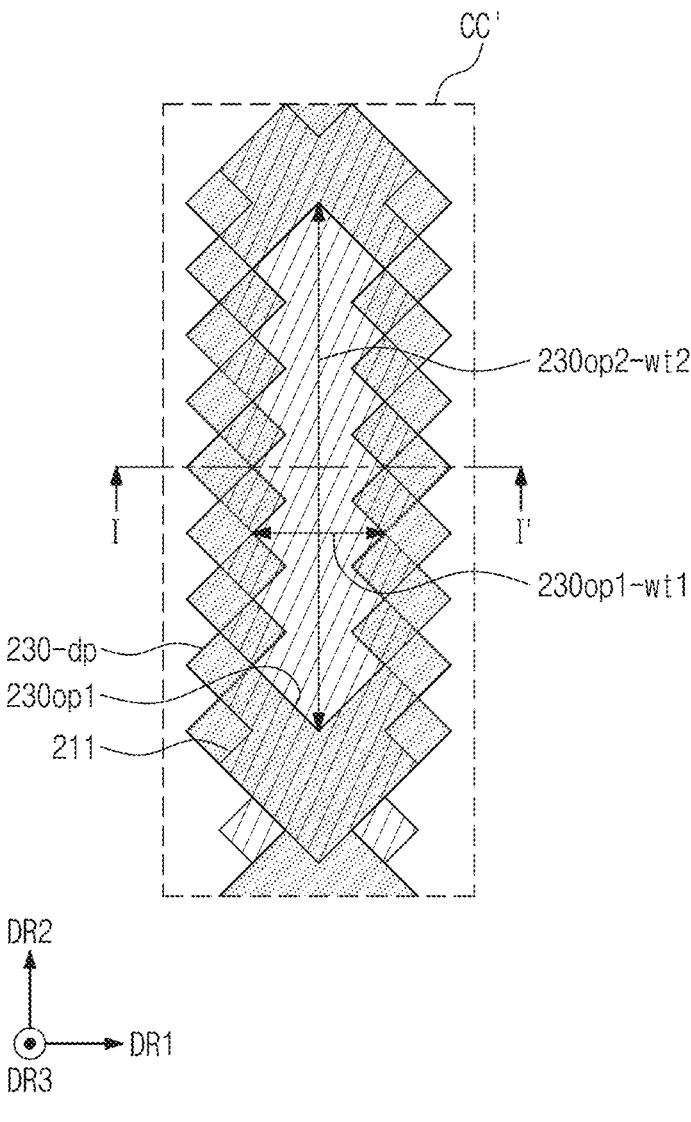
FIG. 14A is an enlarged plan view illustrating a portion of one sensing unit according to an embodiment of the present disclosure.
Figure 14B:
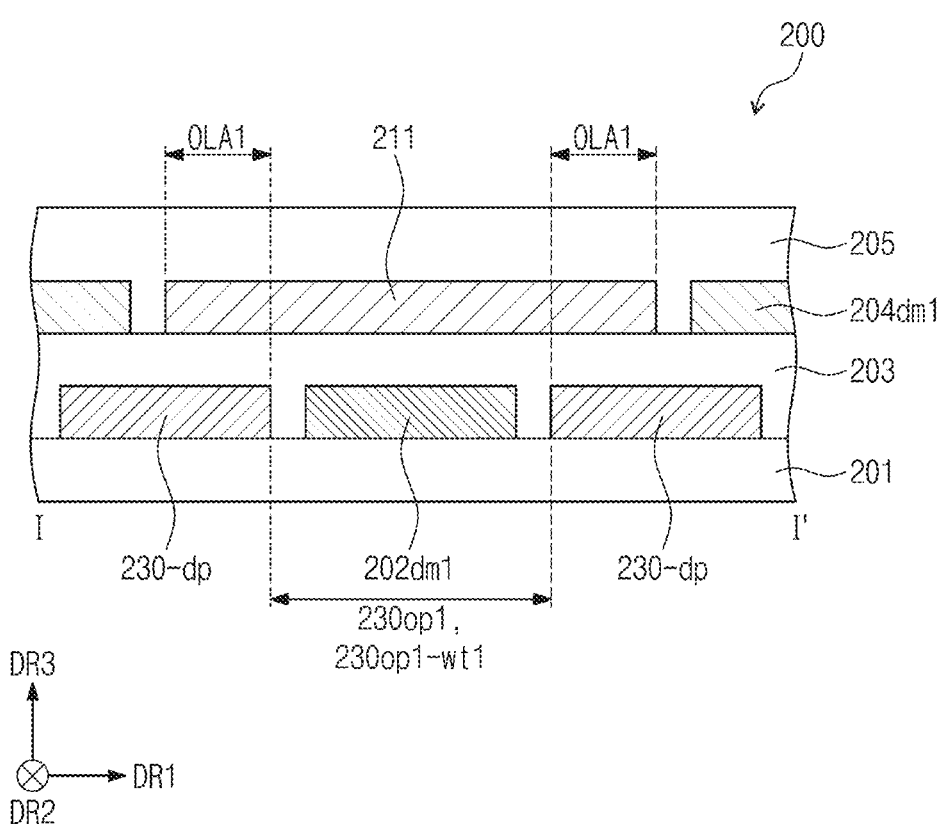
FIG. 14B is a cross-sectional view of the sensor layer taken along the line I-I' of FIG. 14A according to an embodiment of the present disclosure.

FIG. 14A is an enlarged plan view illustrating a portion of one sensing unit according to an embodiment of the present disclosure. FIG. 14B is a cross-sectional view taken along the line I-I' of FIG. 14A according to an embodiment of the present disclosure. For example, FIG. 14A illustrates a state in which the area CC' of FIG. 8A overlaps with the area CC' of FIG. 9A, and FIG. 14B illustrates a cross-section of the sensor layer.

Referring to FIGS. 14A and 14B, one first pattern 211 and a portion of the second divided electrode 230-$dp$ are illustrated. A first opening 230$op$1 may be defined in the second divided electrode 230-$dp$.

When viewed in the third direction DR3 (e.g., in a plan view), a magnitude of the first coupling capacitance between the first electrode 210 and the third electrodes 230 may be determined according to an area of a first area OLA1 in which the first pattern 211 overlaps with the second divided electrode 230-*dp*.

In an embodiment of the present disclosure, sizes of a first maximum width 230*op*1-*wt*1 in the first direction DR1 and a second maximum width 230*op*2-*wt*2 in the second direction DR2 of the first opening 230*op*1 may be adjusted as needed or desired. The magnitude of the first coupling capacitance between the first electrode 210 and the third electrode 230 may be adjusted according to the desired size of the first opening 230*op*1.

Figure 15A:
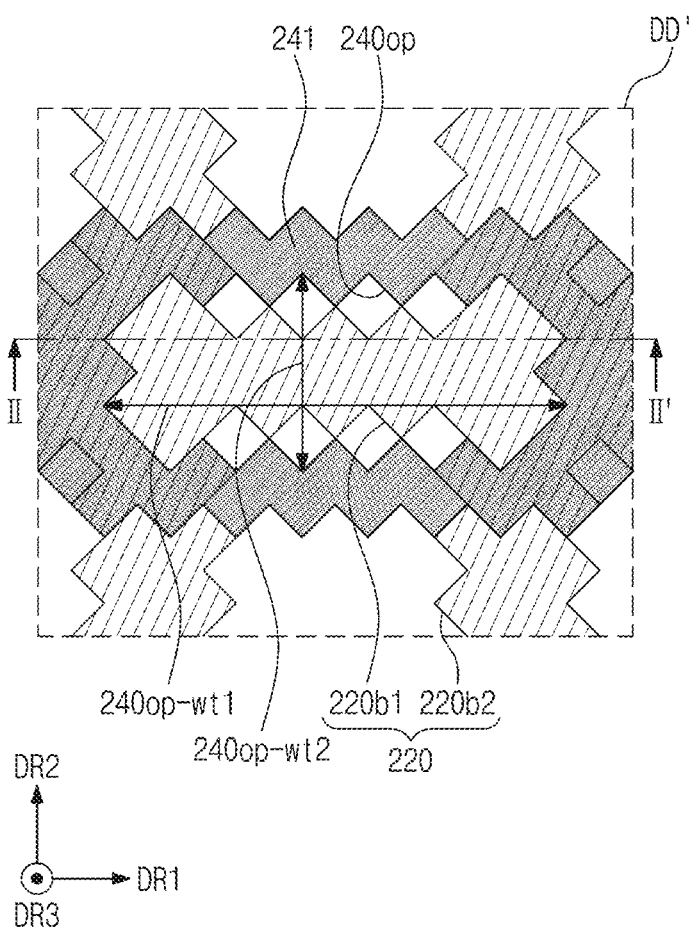
FIG. 15A is an enlarged plan view illustrating a portion of one sensing unit according to an embodiment of the present disclosure.
Figure 15B:
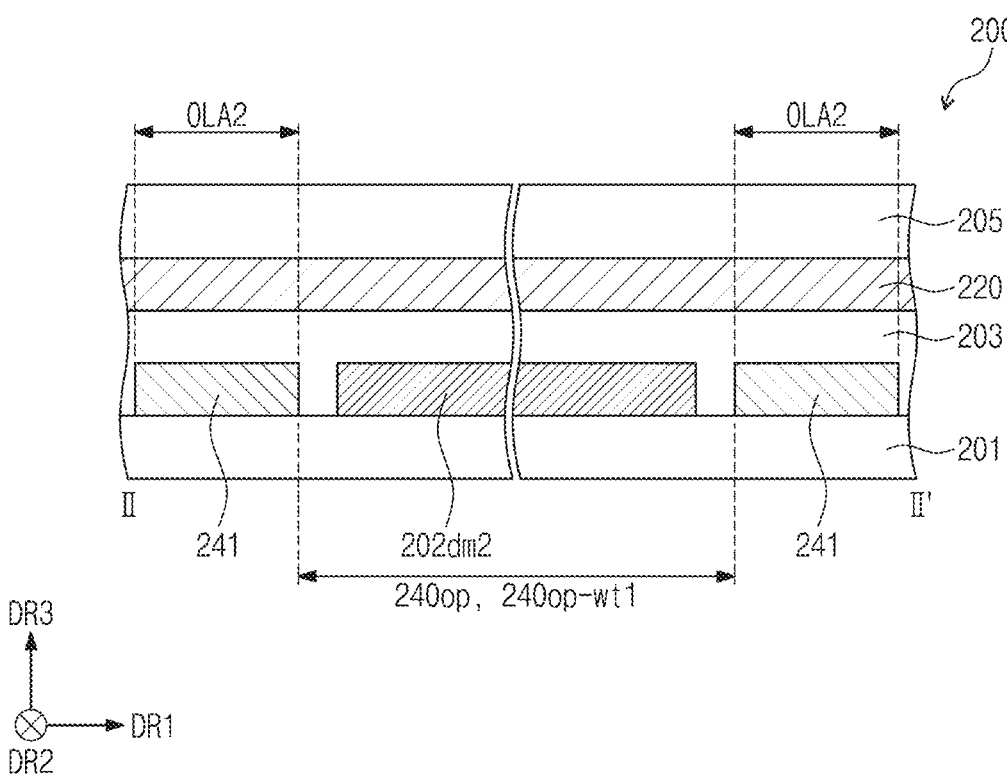
FIG. 15B is a cross-sectional view of the sensor layer taken along the line II-II' of FIG. 15A according to an embodiment of the present disclosure.

FIG. 15A is an enlarged plan view illustrating a portion of one sensing unit according to an embodiment of the present disclosure. FIG. 15B is a cross-sectional view taken along the line II-II' of FIG. 15A. For example, FIG. 15A illustrates a state in which the area DD' of FIG. 8A overlaps with the area DD' of FIG. 9A, and FIG. 15B illustrates a cross-section of the sensor layer.

Referring to FIGS. 15A and 15B, one second pattern 241 and a portion of the second electrode 220 are illustrated. A second opening 240*op* may be defined in the second pattern 241.

When viewed in the third direction DR3 (e.g., in a plan view), a magnitude of the second coupling capacitance between the second electrode 220 and the fourth electrodes 230 may be determined according to an area of a second area OLA2 in which the second pattern 241 overlaps with the second electrode 220.

In an embodiment of the present disclosure, sizes of a first maximum width 240*op*-*wt*1 in the first direction DR1 and a second maximum width 240*op*-*wt*2 in the second direction DR2 of the second opening 240*op* may be adjusted as needed or desired. The magnitude of the second coupling capacitance between the second electrode 220 and the fourth electrode 240 may be adjusted according to a desired size of the second opening 240*op*.

Although the first opening 230*op*1 may have a shape defined as a closed curve that is entirely surrounded (e.g., around a periphery thereof) by the second divided electrode 230-*dp*, and the second opening 240*op* may have a shape defined as a closed curve that is entirely surrounded (e.g., around a periphery thereof) by the second pattern 241 as shown as an example in FIGS. 14A and 15A, the present disclosure is not limited thereto.

For example, when the areas of the first area OLA1 and the second area OLA2 are adjustable, a planar shape of each of the first opening 230*op*1 and the second opening 240*op* may be deformed into various shapes. For example, the planar shape of each of the first opening 230*op*1 and the second opening 240*op* may be defined by an open curve having one opened side. In this case, a side surface defining the first opening 230*op*1 may be connected to an edge of the second divided electrode 230-*dp*, and a side surface defining the second opening 240*op* may be connected to an edge of the second pattern 241.

Figure 16A:
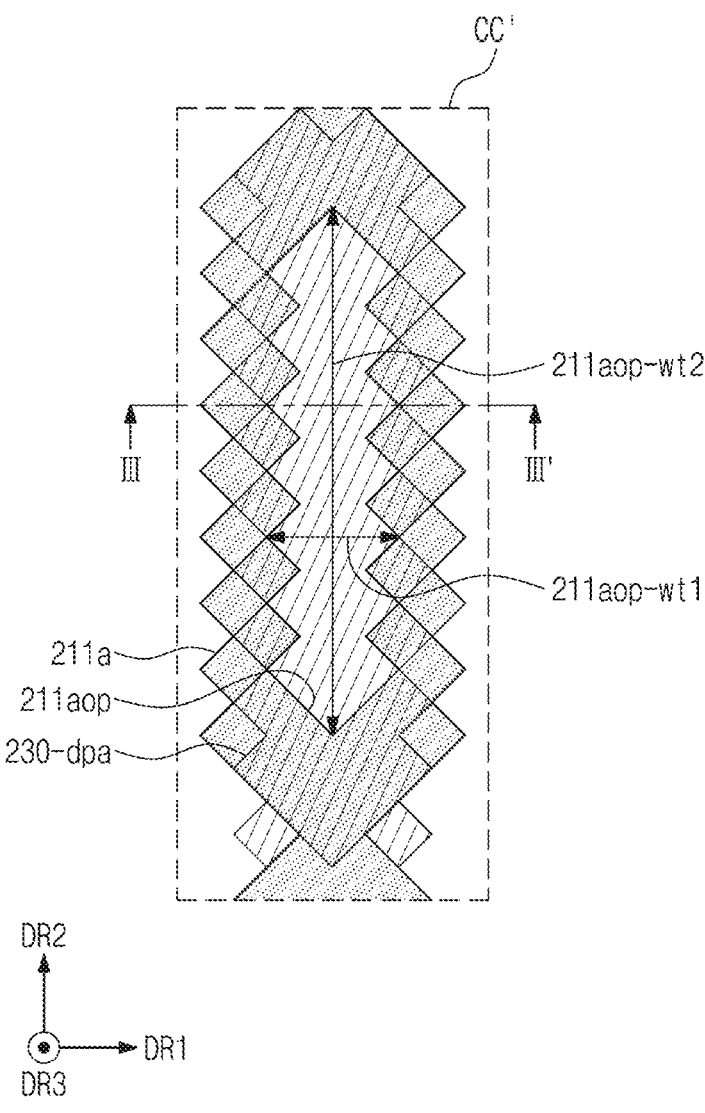
FIG. 16A is an enlarged plan view illustrating a portion of one sensing unit according to an embodiment of the present disclosure.
Figure 16B:
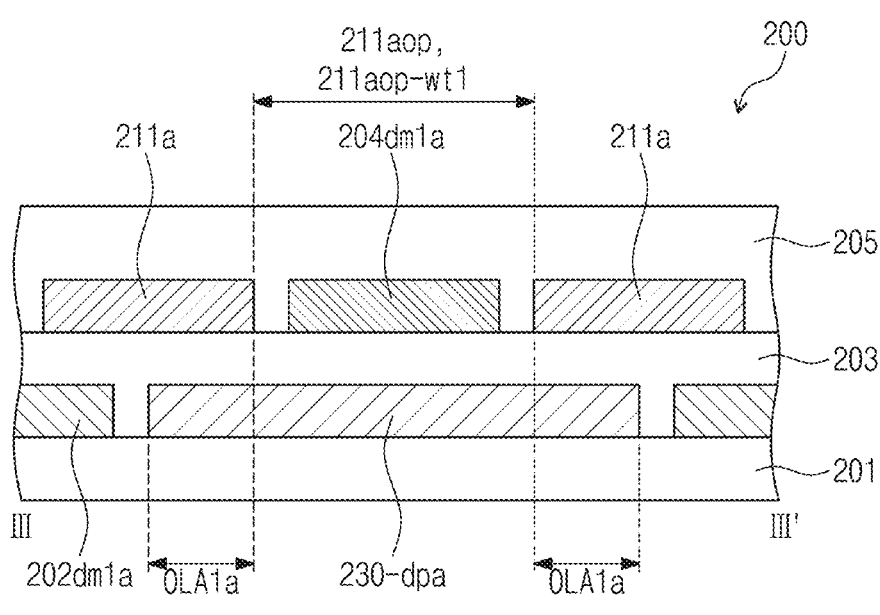
FIG. 16B is a cross-sectional view of the sensor layer taken along the line III-III' of FIG. 16A according to an embodiment of the present disclosure.
Figure 16B:
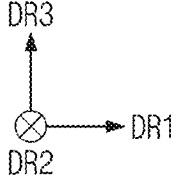

FIG. 16A is an enlarged plan view illustrating a portion of one sensing unit according to an embodiment of the present disclosure. FIG. 16B is a cross-sectional view taken along the line III-III' of FIG. 16A according to an embodiment of the present disclosure. For example, FIG. 16B may illustrate a cross-section of the sensor layer.

Referring to FIGS. 16A and 16B, one first pattern 211*a* and a portion of the second divided electrode 230-*dpa* are illustrated. Unlike that described above with reference to FIGS. 14A and 14B, in an embodiment, as illustrated in FIGS. 16A and 16B, a first opening 211*aop* may be defined in the first pattern 211*a*.

When viewed in the third direction DR3 (e.g., in a plan view), a magnitude of the first coupling capacitance between the first electrode 210 and the third electrodes 230 may be determined according to an area of a first area OLA1*a* in which the first pattern 211*a* overlaps with the second divided electrode 230-*dpa*.

In an embodiment of the present disclosure, sizes of a first maximum width 211*aop*-*wt*1 in the first direction DR1 and a second maximum width 211*aop*-*wt*2 in the second direction DR2 of the first opening 211*aop* may be adjusted as needed or desired. The magnitude of the first coupling capacitance between the first electrode 210 and the third electrode 230 may be adjusted according to the desired size of the first opening 211*aop*.

The sensor layer 200 may further include a plurality of dummy patterns. For example, the plurality of dummy patterns may include a first dummy pattern 202*dm*1*a* and a second dummy pattern 204*dm*1*a*. The first dummy pattern 202*dm*1*a* may be disposed at (e.g., in or on) the same layer as that of the second divided electrode 230-*dpa*, and may overlap with a portion of the first pattern 211*a*. The second dummy pattern 204*dm*1*a* may be surrounded (e.g., around a periphery thereof) by the first opening 211*aop*, and may be disposed at (e.g., in or on) the same layer as that of the first pattern 211*a*.

Figure 17A:
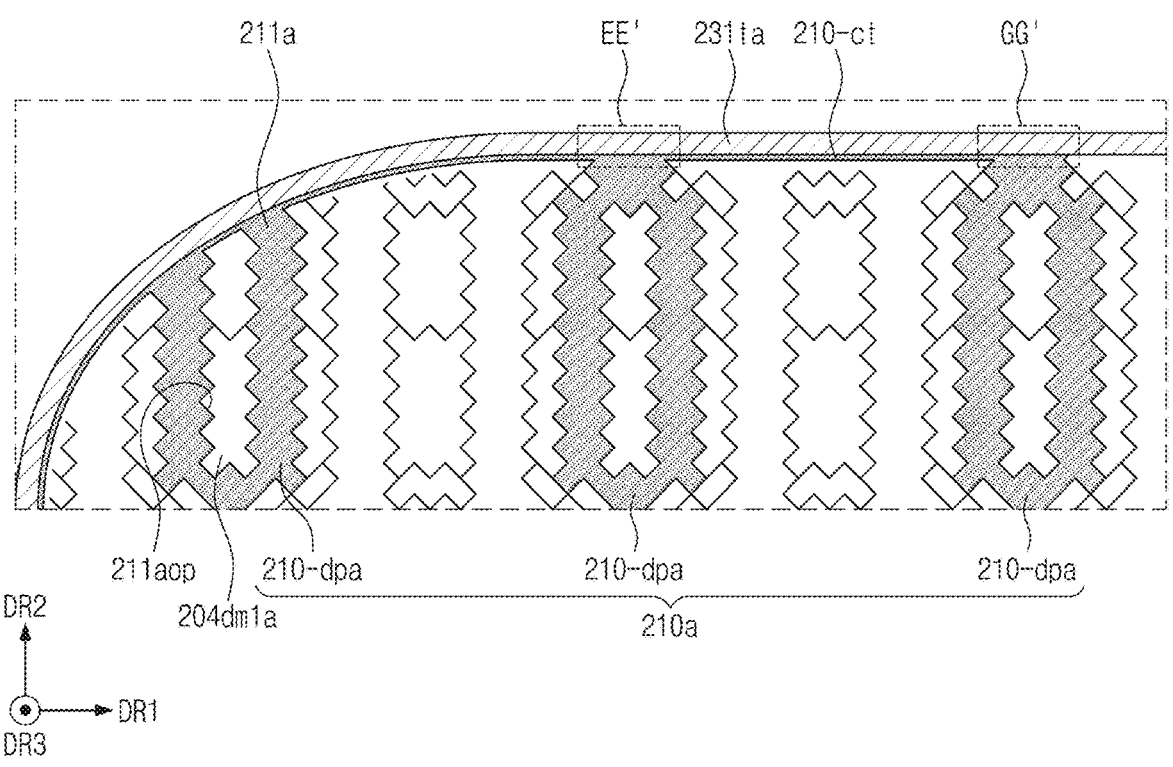
FIG. 17A is an enlarged plan view illustrating a portion of the second conductive layer of the sensor layer according to an embodiment of the present disclosure.
Figure 17B:
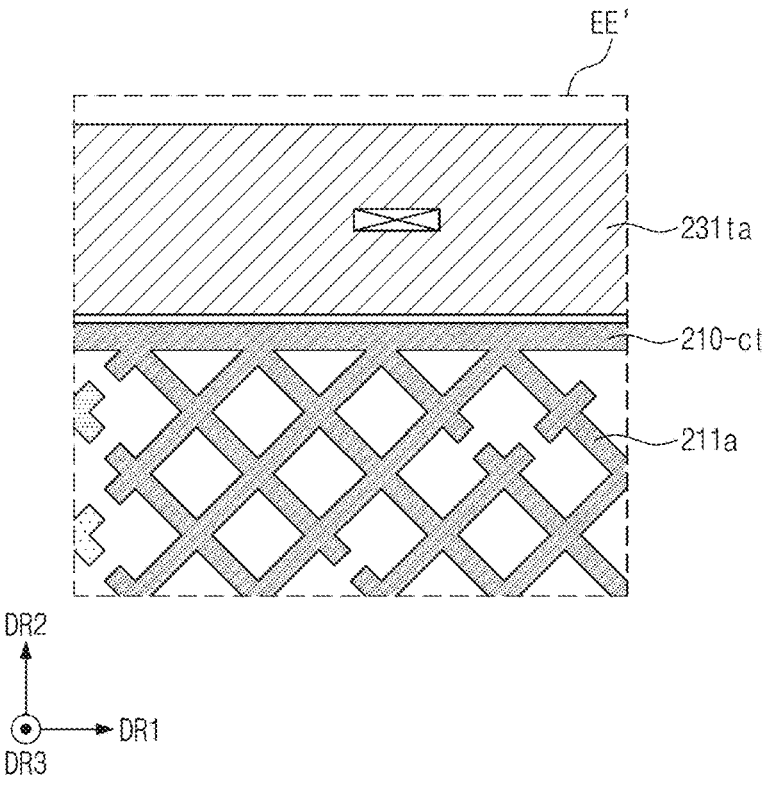
FIG. 17B is an enlarged plan view illustrating the area EE' in FIG. 17A.

FIG. 17A is an enlarged plan view illustrating a portion of the second conductive layer of the sensor layer according to an embodiment of the present disclosure. FIG. 17B is an enlarged plan view illustrating the area EE' in FIG. 17A.

Referring to FIGS. 7, 16A, 17A, and 17B, the first electrode 210*a* of one sensing unit SU may include a plurality of first divided electrodes 210-*dpa*. Each of the first divided electrodes 210-*dpa* may include a first pattern 211*a*. In FIG. 17A, three first patterns 211*a* included in one sensing unit SU are illustrated.

The second dummy pattern 204*dm*1*a* may be divided into a plurality of patterns. For example, the second dummy pattern 204*dm*1*a* surrounded (e.g., around a periphery thereof) by one first opening 211*aop* may include a plurality of floating patterns that are separated or electrically separated from each other. Although the second dummy pattern 204*dm*1*a* includes two floating patterns in the example described above with reference to FIG. 17A, the present disclosure is not limited thereto.

In an embodiment of the present disclosure, the first patterns 211*a* included in one sensing unit SU may be electrically connected to each other. For example, the sensor layer 200 may further include a connection line 210-*ct* disposed on the peripheral area 200NA, and the first patterns 211*a* may be electrically connected to each other by the connection line 210-*ct*. Also, the first patterns 211*a* may be electrically connected to one first trace line 210*t*. Thus, each of the first divided electrodes 210-*dpa* included in the first electrode 210*a* may have one end electrically connected to the connection line 210-*ct*, and another end (e.g., an opposite end) electrically connected to the first trace line 210*t*.

Each of the first patterns 211*a* may have a mesh structure. The first patterns 211*a* may be disposed at (e.g., in or on) the same layer as that of the connection line 210-*ct*, and may include the same material as that of the connection line 210-*ct*. The first patterns 211*a* and the connection line 210-*ct* may be connected to each other to have an integrated shape.

Figure 18A:
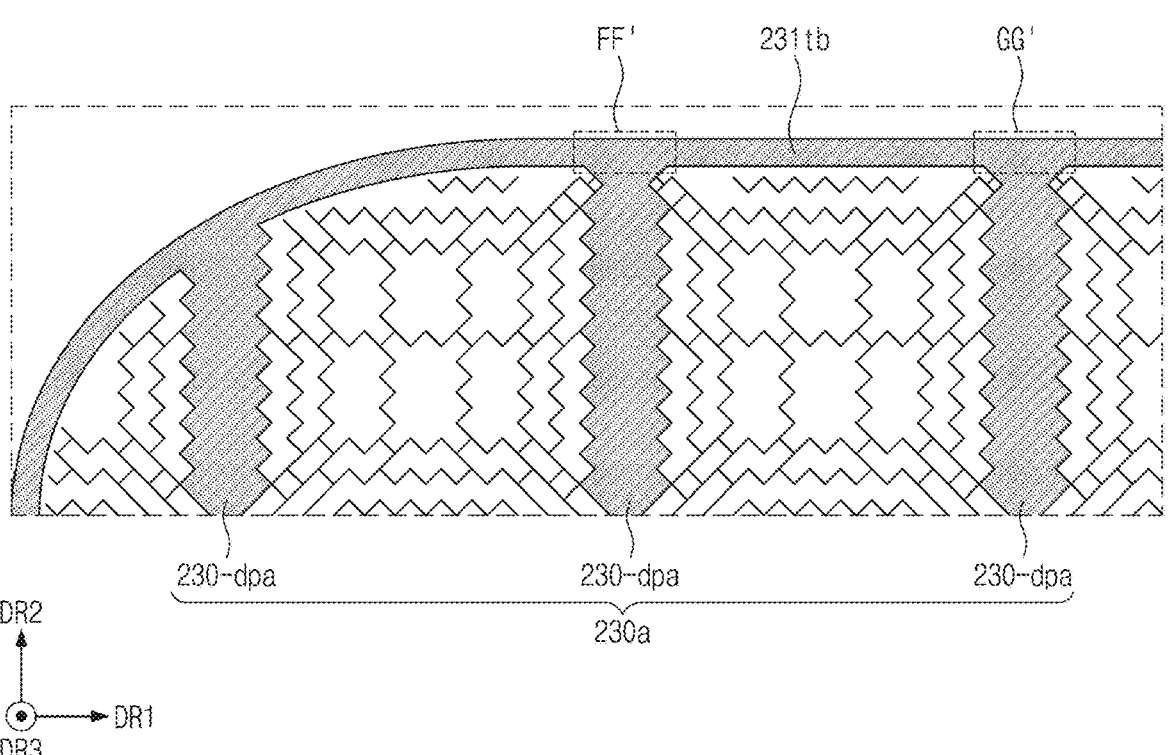
FIG. 18A is an enlarged plan view illustrating a portion of the first conductive layer of the sensor layer according to an embodiment of the present disclosure.
Figure 18B:
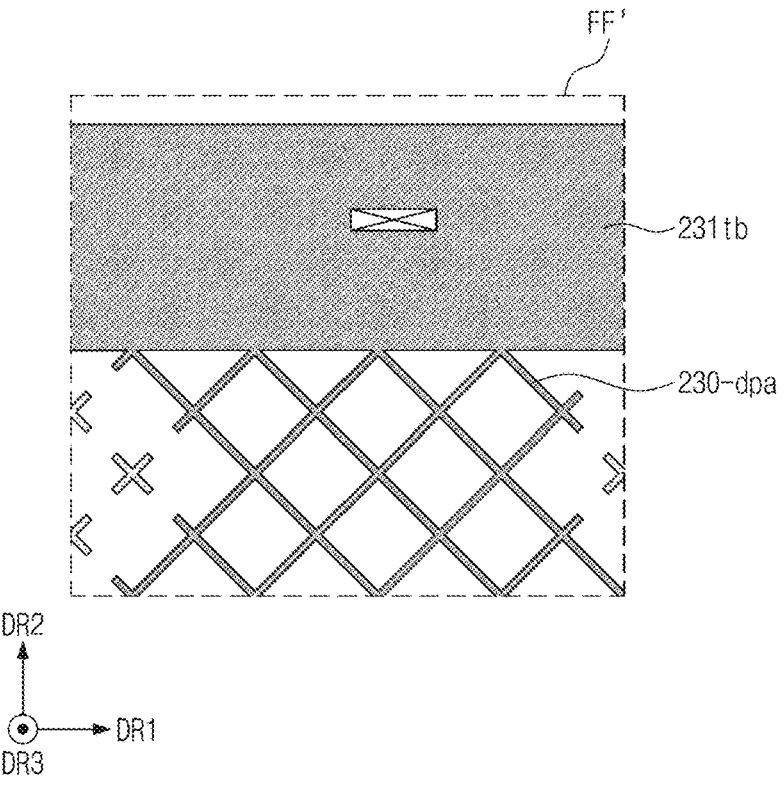
FIG. 18B is an enlarged plan view illustrating the area FF' in FIG. 18A.
Figure 19:
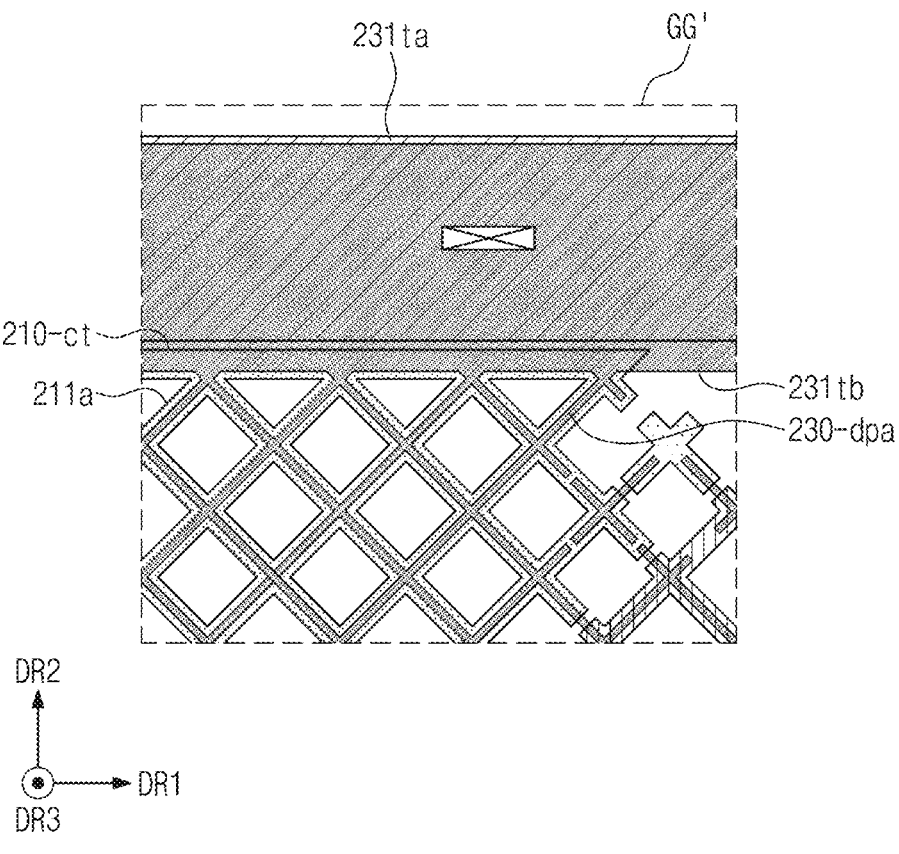
FIG. 19 is an enlarged plan view illustrating a portion of the sensor layer according to an embodiment of the present disclosure.

FIG. 18A is an enlarged plan view illustrating a portion of the first conductive layer of the sensor layer according to an embodiment of the present disclosure. FIG. 18B is an enlarged plan view illustrating the area FF' in FIG. 18A. FIG. 19 is an enlarged plan view illustrating a portion of the sensor layer according to an embodiment of the present disclosure. For example, FIG. 19 illustrates a state in which the area GG' of FIG. 17A overlaps with the area GG' of FIG. 18A.

Referring to FIGS. 7, 17A, 18A, 18B, and 19, the third electrode 230*a* of one sensing unit SU may include a plurality of second divided electrodes 230-*dpa*. The second divided electrodes 230-*dpa* may overlap with the first divided electrodes 210-*dpa* in a one-to-one correspondence manner. The second divided electrodes 230-*dpa* may be electrically connected to the third trace line 230*rt*1.

In an embodiment of the present disclosure, the first line portion 231*t* of the third trace line 230*rt*1 may include a first layer line 231*ta*, and a second layer line 231*tb* connected to the first layer line 231*ta* and disposed at (e.g., in or on) a layer different from that of the connection line 210-*ct*. The second layer line 231*tb* may overlap with at least a portion of the connection line 210-*ct*. The second layer line 231*tb* may overlap with the connection line 210-*ct* and the first layer line 231*ta*. The second layer line 231*tb* may be electrically insulated from the connection line 210-*ct*, and may be electrically connected to the first layer line 231*ta*.

Figure 20:
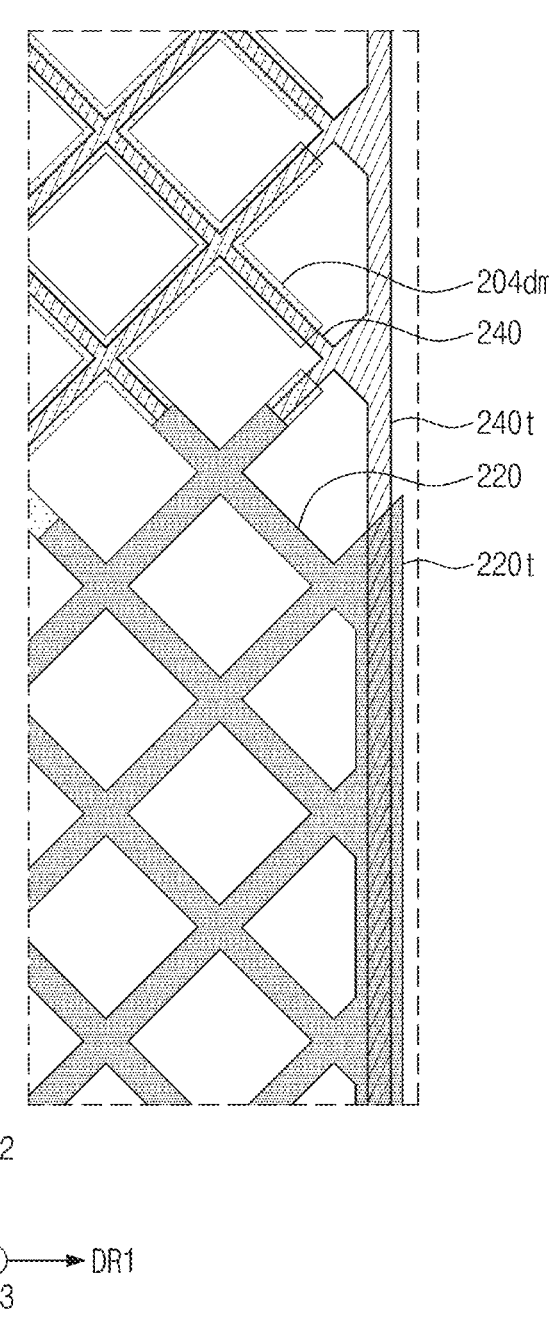
FIG. 20 is an enlarged plan view illustrating a portion of the sensor layer according to an embodiment of the present disclosure.

FIG. 20 is an enlarged plan view illustrating a portion of the sensor layer according to an embodiment of the present disclosure.

Referring to FIG. 20, a portion of the fourth electrode 240 and a portion of the second electrode 220 are illustrated as an example. The second electrode 220 may have a mesh structure, and the fourth electrode 240 may also have a mesh structure. A mesh line of the second electrode 220 may have a thickness greater than a thickness of a mesh line of the fourth electrode 240.

In an embodiment of the present disclosure, the second electrode 220 may be electrically connected to the second trace line 220*t*. For example, the second electrode 220 and the second trace line 220*t* may include the same material as each other, and may be disposed at (e.g., in or on) the same layer as each other. The second electrode 220 and the second trace line 220*t* may be connected to each other to have an integrated shape. For example, the second electrode 220 and the second trace line 220*t* may be included in the first conductive layer 202 (e.g., refer to FIG. 6A).

In an embodiment of the present disclosure, the fourth electrode 240 may be electrically connected to the fourth trace line 240*t*. For example, the fourth electrode 240 and the fourth trace line 240*t* may include the same material as each other, and be disposed at (e.g., in or on) the same layer as each other. The fourth electrode 240 and the fourth trace line 240*t* may be connected to each other to have an integrated shape. For example, the fourth electrode 240 and the fourth trace line 240*t* may be included in the second conductive layer 204 (e.g., refer to FIG. 6A).

Figure 21:
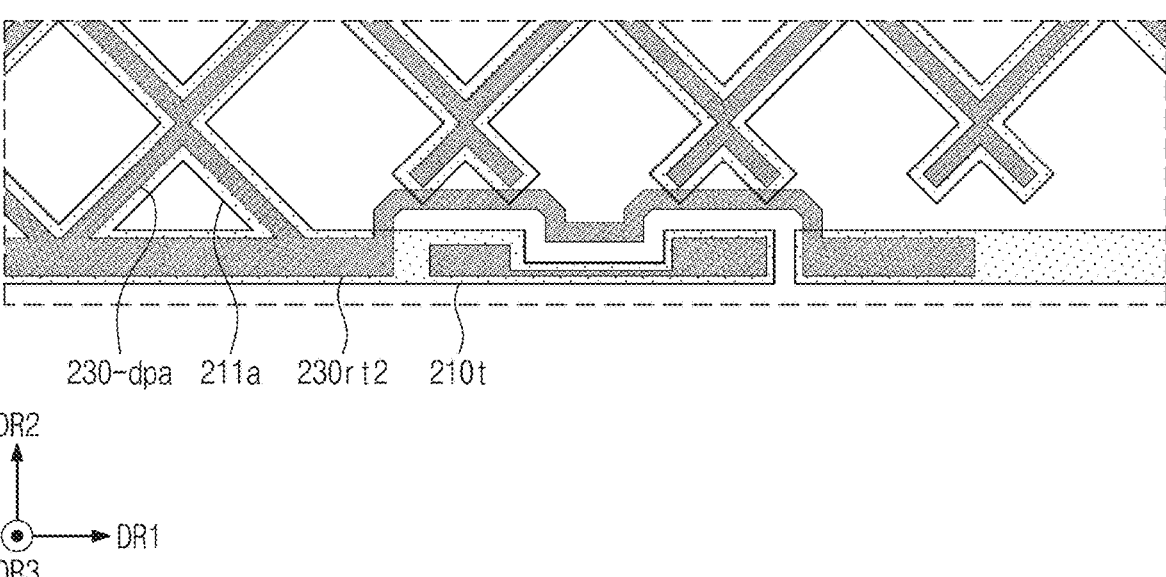
FIG. 21 is an enlarged plan view illustrating a portion of the sensor layer according to an embodiment of the present disclosure.

FIG. 21 is an enlarged plan view illustrating a portion of the sensor layer according to an embodiment of the present disclosure.

Referring to FIG. 21, the first patterns 211*a* may be electrically connected to one first trace line 210*t*. Each of the first patterns 211*a* may have a mesh structure. The first patterns 211*a* may be disposed at (e.g., in or on) the same layer as that of the first trace line 210*t*, and may include the same material as that of the first trace line 210*t*. The first patterns 211*a* and the first trace line 210*t* may be connected to each other to have an integrated shape. For example, the first patterns 211*a* and the first trace line 210*t* may be included in the second conductive layer 204 (e.g., refer to FIG. 6A).

The second divided electrodes 230-*dpa* may be electrically connected to one fifth trace line 230*rt*2. Each of the second divided electrodes 230-*dpa* may have a mesh structure. The second divided electrodes 230-*dpa* may be disposed at (e.g., in or on) the same layer as that of the fifth trace line 230*rt*, and may include the same material as that of the fifth trace line 230*rt*. The second divided electrodes 230-*dpa* and the fifth trace line 230*rt* may be connected to each other to have an integrated shape. For example, the second divided electrodes 230-*dpa* and the fifth trace line 230*rt* may be included in the first conductive layer 202 (e.g., refer to FIG. 6A).

In some embodiments with reference to FIGS. 7, 10A, 11A, and 17A, the sensor layer 200 may include a plurality of first sensing electrodes 210. Each of the first sensing electrodes comprises a plurality of first divided electrodes (e.g., the divided electrodes 210-*dp* or 210-*dpx* of one first electrode 210 or 210-*x*) extending in one direction or a first direction (e.g., the second direction DR2 in the figures), and a plurality of second sensing electrodes (e.g., the sensing electrodes 220 or 220-*x*), extending in another direction or a second direction (e.g., the first direction DR1 in the figures) crossing the one direction or the first direction.

Each of the plurality of first divided electrodes (e.g., 210-*dp* or 210-*dpx*) may include at least two first patterns (e.g., the first patterns 211 or 211*x*), and a first bridge pattern (e.g., the first bridge pattern 212 or 212*x*) electrically connected to the first patterns. At least two adjacent first divided electrodes (e.g., 210-*dp* or 210-*dpx*) may be connected to each other at one end via a first connection line 210-*cl*. The first connection line 210-*cl* may be electrically connected the first trace line 210*t*, and the first connection line may be electrically connected to a first pad PD1.

The first connection line 210-*cl* and the connection line 210-*ct* (e.g., refer to FIG. 17A). may be spaced apart in the second direction DR2 with the plurality of first divided electrodes 210-*dp* or 210-*dpx* included in one first sensing electrode 210 or 210-*x* interposed therebetween. Accordingly, first ends of the plurality of first divided electrodes 210-*dp* or 210-*dpx* included in one first sensing electrode 210 or 210-*x* may be connected to the first connection line 210-*cl*, and second ends of the plurality of first divided electrodes 210-*dp* or 210-*dpx* may be connected to the connection line 210-*ct*. Accordingly, since one first sensing electrode 210 or 210-*x* includes a plurality of electrically connected first divided electrodes 210-*dp* or 210-*dpx*, two or more first bridge pattern 212 or 212*x* arranged in the first direction DR1 may be included within one first sensing electrode 210 or 210-*x*.

In some embodiments, the sensor layer 200 may further include a plurality of first electrodes 230. Each of the plurality of first electrodes 230 comprises a plurality of second divided electrodes (e.g., the second divided electrodes 230-*dp* or 230-*dpx* of one third electrode 230 or 230-*x*) extending in the one direction or the first direction (e.g, the second direction DR2 in the figures). At least two adjacent second divided electrodes (e.g., 230-*dp* or 230-*dpx*) overlapping with the at least two adjacent first divided electrodes (e.g., 210-*dp* or 210-*dpx*) may be connected to each other at one end via a second connection line 230-*cl*1 (e.g., a portion of the fifth trace line 230*rt*2 extending from one third electrode 230 or 230-*x*). The second connection line 230-*cl*1 and another adjacent second connection line 230-*cl*1*a* (e.g., another portion of the fifth trace lines 230*rt*2 extending from the other third electrode 230 or 230-*x*) may be connected to each other via a third connection line 230-*cl2* (e.g., a portion of the fifth trace line 230*rt2* connecting the other portions to the fifth pad PD5), and the third connection line 230-*cl2* may be electrically connected to a second pad (e.g., the fifth pad PD5). In some embodiments, the second pad may be adjacent to the first pad, or the second pads (e.g., the fifth pads PD5) may be alternately arranged with the first pads (e.g., the first pads PD1) along the other direction or the second direction.

In some embodiments, at least one first pattern (e.g., 211*x*) may include a first portion 211*x*-*p*1, a second portion 211*x*-*p*2 opposite to the first portion 211*x*-*p*1, and a third portion 211*x*-*p*3 connected to an end of the first portion 211*x*-*p*1 and an end of the second portion 211*x*-*p*2. For example, in some embodiments, the at least one pattern (e.g., 211*x*) may have a closed loop shape having two third portions 211*x*-*p*3 that connect ends of the first and second portions 211*x*-*p*1 and 211*x*-*p*2 to one another, such that the first, second, and third portions 211*x*-*p*1, 211*x*-*p*2, 211*x*-*p*3 define an opening 211*aop* therebetween. In some embodiments, a first dummy pattern (e.g., the second dummy pattern 204*dm*1*a*) may be located between the first and second portions 211*x*-*p*1, 211*x*-*p*2 of the first pattern, and may be insulated with the first pattern 211*x*. In other words, the first dummy pattern (e.g., 204*dm*1*a*) may be surrounded (e.g., around a periphery thereof) by the first, second, and third portions 211*x*-*p*1, 211*x*-*p*2, 211*x*-*p*3 of the first pattern 211*x*. As such, the first electrode (e.g., 230-*dp* or 230-*dpx*) may overlap with the first dummy pattern 204*dm*1*a*, and with the first and second portions 211*x*-*p*1, 211*x*-*p*2 of the first pattern (e.g., 211*x*).

In some embodiments, the first electrode (e.g., 230-*dpx*) may include at least two second patterns 230*bp* (e.g., refer to FIG. 10A) (e.g., the bar shaped parts), and a second bridge pattern 230*cp* (e.g., refer to FIG. 10A) (e.g., the bracket < or > shaped parts) electrically connected to the second patterns 230*bp*. As shown in FIG. 10A, the second bridge pattern 230*cp* may include a first bridge portion 230*cp*1 (e.g., one of the bracket shaped parts) and a second bridge portion 230*cp*2 (e.g., the other of the bracket shaped parts) opposite to the first bridge portion 230*cp*1. In some embodiments, the first bridge pattern 212*x* may be located between the first and second bridge portions 230*cp*1 and 230*cp*2 of the first electrode (e.g., 230-*dpx*), and may be at the same layer as that of the first electrode (e.g., 230-*dpx*) and the second bridge pattern (e.g., the bracket < or > shaped parts).

In some embodiments, the sensor layer 200 may further include a second electrode (e.g., the third divided electrode 240-*dpx*) extending in the other direction or the second direction (e.g., the first direction DR1 in the figures), and overlapping with the second sensing electrode (e.g., 220-*x*). In some embodiments, the second electrode (e.g., 240-*dpx*) may include at least two second patterns (e.g., the second patterns 241*x*), and a second bridge pattern (e.g., the second bridge pattern 242*x*) electrically connected to the second patterns. The second bridge pattern (e.g., 242*x*) may be located at the same layer as that of the first pattern (e.g., 211*x*) and the second sensing electrode (e.g., 220-*x*), and may cross the first bridge pattern (e.g., 212*x*) located at a different layer from that of the second bridge pattern. Each of the first and second bridge patterns (e.g., 212*x* and 242*x*) may include first mesh lines, and second mesh lines crossing the first mesh lines. As shown in FIG. 11B, the second bridge pattern (e.g., 242*x*) may have at least one closed hole (e.g., a hole having a closed loop shape) surrounded (e.g., around a periphery thereof) by the first and second mesh lines, and as shown in FIG. 10B, the first bridge pattern (e.g., 212*x*)

may have no closed holes. In other words, in some embodiments, the first bridge pattern (e.g., 212*x*) may have a smaller number of closed holes than that of the second bridge pattern (e.g., 242*x*), where the number may be an integer greater than or equal to 0.

Figure 22A:
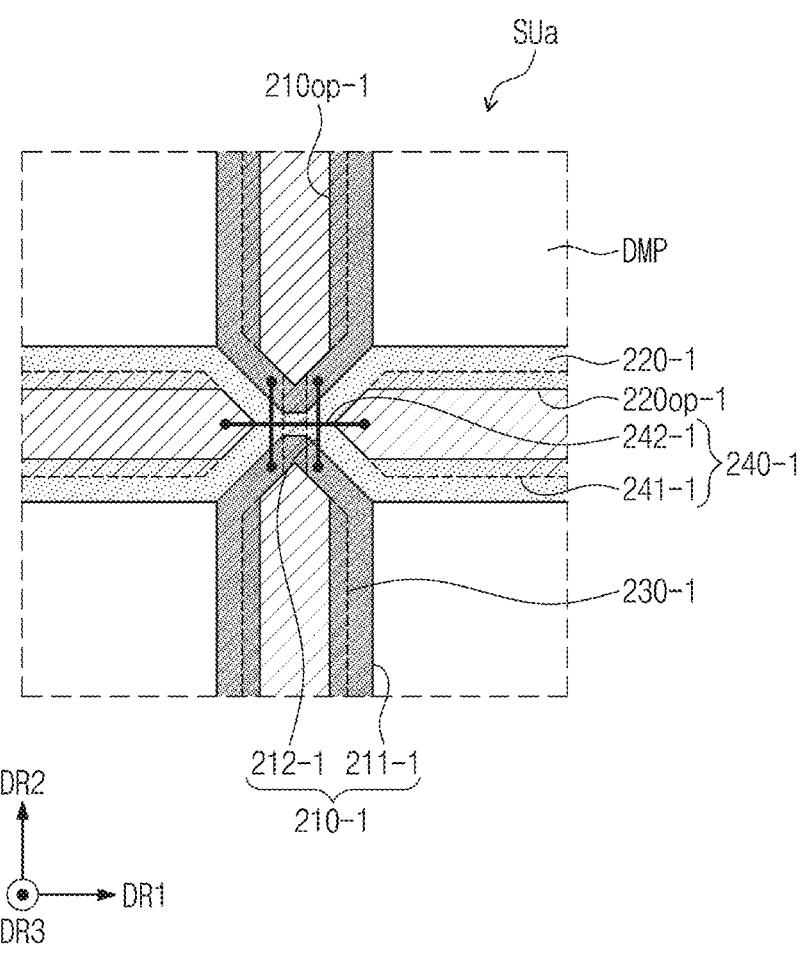
FIG. 22A is a plan view illustrating one sensing unit according to an embodiment of the present disclosure.

FIG. 22A is a plan view illustrating one sensing unit according to an embodiment of the present disclosure.

Referring to FIGS. 7 and 22A, one sensing unit SUa may include a first electrode 210-1, a second electrode 220-1, a third electrode 230-1, and a fourth electrode 240-1.

The first electrode 210-1 may include first patterns 211-1 and first bridge patterns 212-1. The fourth electrode 240-1 may include second patterns 241-1 and a second bridge pattern 242-1.

The first patterns 211-1, the second electrode 220-1, and the second bridge pattern 242-1 may be included in the second conductive layer 204 (e.g., refer to FIG. 6A). The third electrode 230-1, the first bridge patterns 212-1, and the second patterns 241-1 may be disposed at (e.g., in or on) the first conductive layer 202 (e.g., refer to FIG. 6A).

In an embodiment of the present disclosure, a first opening 210*op*-1 may be defined in one of the first electrode 210-1 and/or the third electrode 230-1, and a second opening 220*op*-1 may be defined in one of the second electrode 220-1 and/or the fourth electrode 240-1. Although an example illustrated in FIG. 22A shows that the first opening 210*op*-1 is defined in the first electrode 210-1, and the second opening 220*op*-1 is defined in the second electrode 220-1, the present disclosure is not limited thereto.

According to an embodiment of the present disclosure, a capacitance between the first electrode 210-1 and the third electrode 230-1 and a capacitance between the second electrode 220-1 and the fourth electrode 240-1 may be variously adjusted as needed or desired, by adjusting an area or a shape of each of the first opening 210*op*-1 and the second opening 220*op*-1. Thus, the capacitances at an appropriate level in consideration of a desired touch sensitivity and a desired pen detection sensitivity may be provided.

Also, the sensing unit SUa may further include dummy patterns DMP. The dummy patterns DMP may be floated or electrically floated, and may be provided in a space in which the first to fourth electrodes 210-1, 220-1, 230-1, and 240-1 are not disposed. Because the dummy patterns DMP may be disposed in the empty space, a probability of specific patterns being recognized due to external light reflection may be reduced. In other words, the electronic device 1000 (e.g., refer to FIG. 1A) having improved visibility against external light reflection may be provided.

Figure 22B:
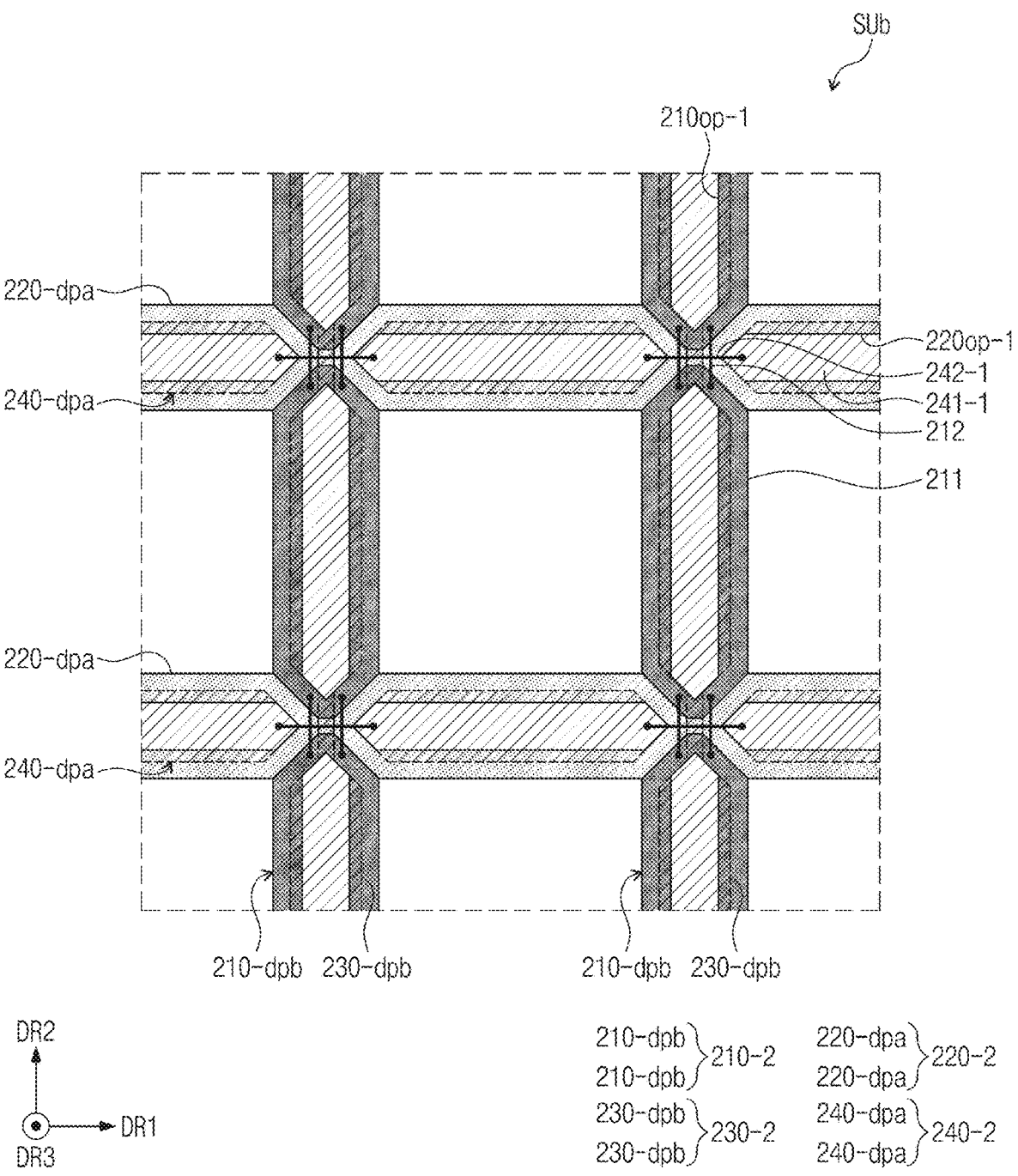
FIG. 22B is a plan view illustrating one sensing unit according to an embodiment of the present disclosure.

FIG. 22B is a plan view illustrating one sensing unit according to an embodiment of the present disclosure.

Referring to FIG. 22B, one sensing unit SUb may have a structure in which a plurality of the sensing unit SUa described above with reference to FIG. 22A are repeatedly arranged. In FIG. 22B, the structure described above with reference to FIG. 22A that is repeatedly arranged in a 2 ×2 form is illustrated as an example. However, the present disclosure is not limited thereto. For example, the sensing unit may have a structure in which the structure described above with reference to FIG. 22A is repeatedly arranged in a 3×3 form.

The first electrode 210-2 included in one sensing unit SUb may include a plurality of first divided electrodes 210-*dpb*. The first divided electrodes 210-*dpb* may be electrically connected to each other, and may receive or provide the same signal as each other. The second electrode 220-2 may include a plurality of second divided electrodes 220-*dpa*. The third electrode 230-2 may include a plurality of third divided electrodes 230-*dpb*. The fourth electrode 240-2 may include a plurality of fourth divided electrodes 240-*dpa*.

Each of the first to fourth divided electrodes 210-*dpb*, 220-*dpa*, 230-*dpb*, and 240-*dpa* may correspond to a signal transmission path or a resistance path through which a signal is transmitted. Each of the first to fourth divided electrodes 210-*dpb*, 220-*dpa*, 230-*dpb*, and 240-*dpa* may have a bar shape extending in a suitable direction (e.g., a specific or predetermined direction). In this case, the resistance path may be minimized or reduced. Thus, when the resistance path is decreased and the number of resistance paths connected in parallel with each other is increased, a resistance of each of the first to fourth electrodes 210-2, 220-2, 230-2, and 240-2 may be reduced. As a result, a sensing sensitivity of the sensor layer 200 may be improved.

Figure 23:
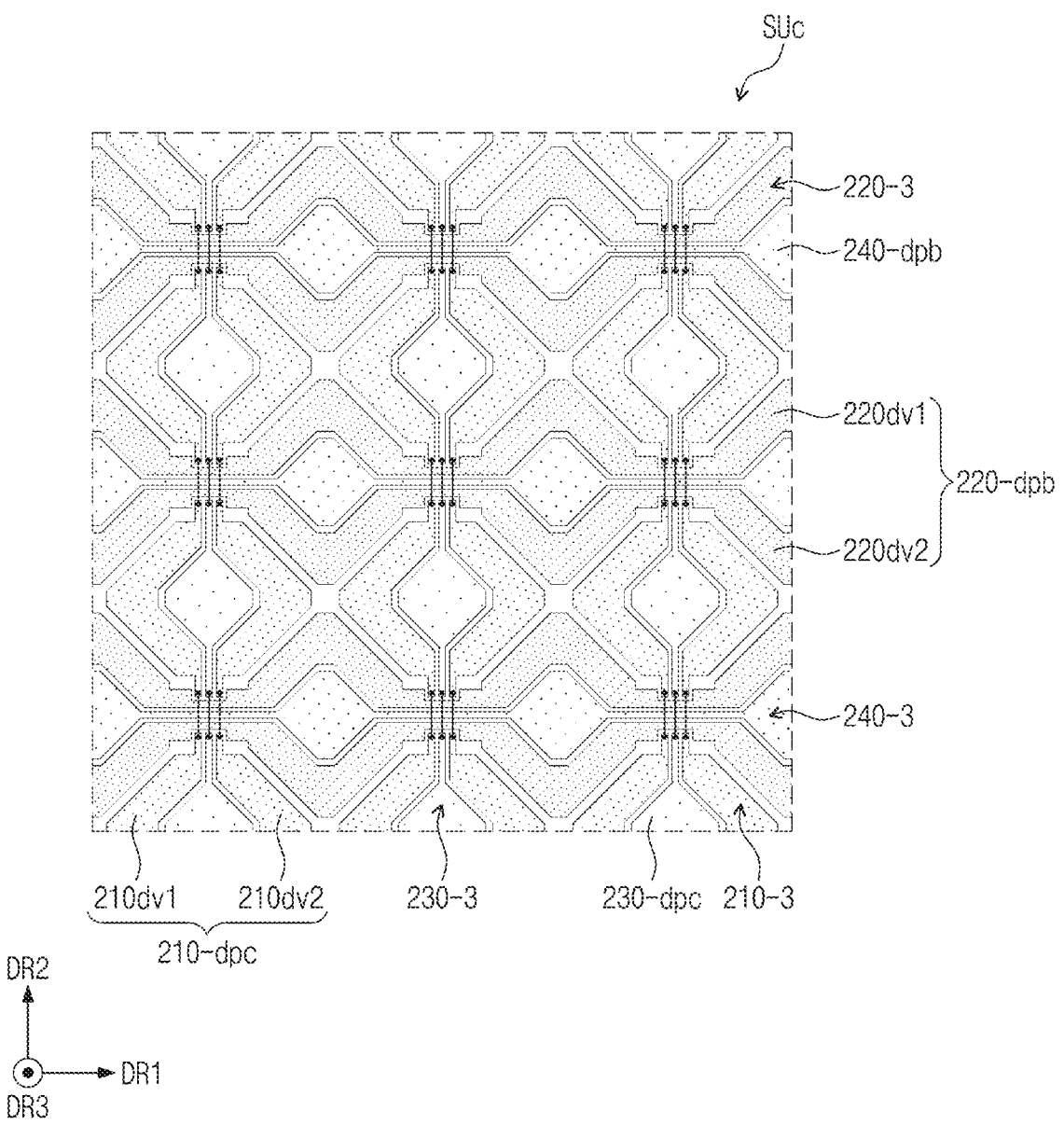
FIG. 23 is a plan view illustrating one sensing unit according to an embodiment of the present disclosure.

FIG. 23 is a plan view illustrating one sensing unit SUc according to an embodiment of the present disclosure.

Referring to FIG. 23, one sensing unit SUc may include a first electrode 210-3, a second electrode 220-3, a third electrode 230-3, and a fourth electrode 240-3.

The first electrode 210-3 may include a plurality of first divided electrodes 210-*dpc* that are spaced apart from each other in the first direction DR1. The second electrode 220-3 may include a plurality of second divided electrodes 220-*dpb* that are spaced apart from each other in the second direction DR2. Each of the first divided electrodes 210-*dpc* may include a first sub-divided electrode 210*dv*1 and a second sub-divided electrode 210*dv*2 that are spaced apart from each other in the first direction DR1. Each of the second divided electrodes 220-*dpb* may include a third sub-divided electrode 220*dv*1 and a fourth sub-divided electrode 220*dv*2 that are spaced apart from each other in the second direction DR2.

The third electrode 230-3 may include a plurality of third divided electrodes 230-*dpc* spaced apart from each other in the first direction DR1, and the fourth electrode 240-3 may include a plurality of fourth divided electrodes 240-*dpb* spaced apart from each other in the second direction DR2.

The first divided electrodes 210-*dpc* and the third divided electrodes 230-*dpc* may be adjacent to each other in a one-to-one correspondence manner. The second divided electrodes 220-*dpb* and the fourth divided electrodes 240-*dpb* may be adjacent to each other in a one-to-one correspondence manner. For example, one third divided electrode 230-*dpc* may be disposed between a first sub-divided electrode 210*dv*1 and a second sub-divided electrode 210*dv*2 of one first divided electrode 210-*dpc*. One fourth divided electrode 240-*dpb* may be disposed between a third sub-divided electrode 220*dv*1 and a fourth sub-divided electrode 220*dv*2 of one second divided electrode 220-*dpb*.

Figure 24:
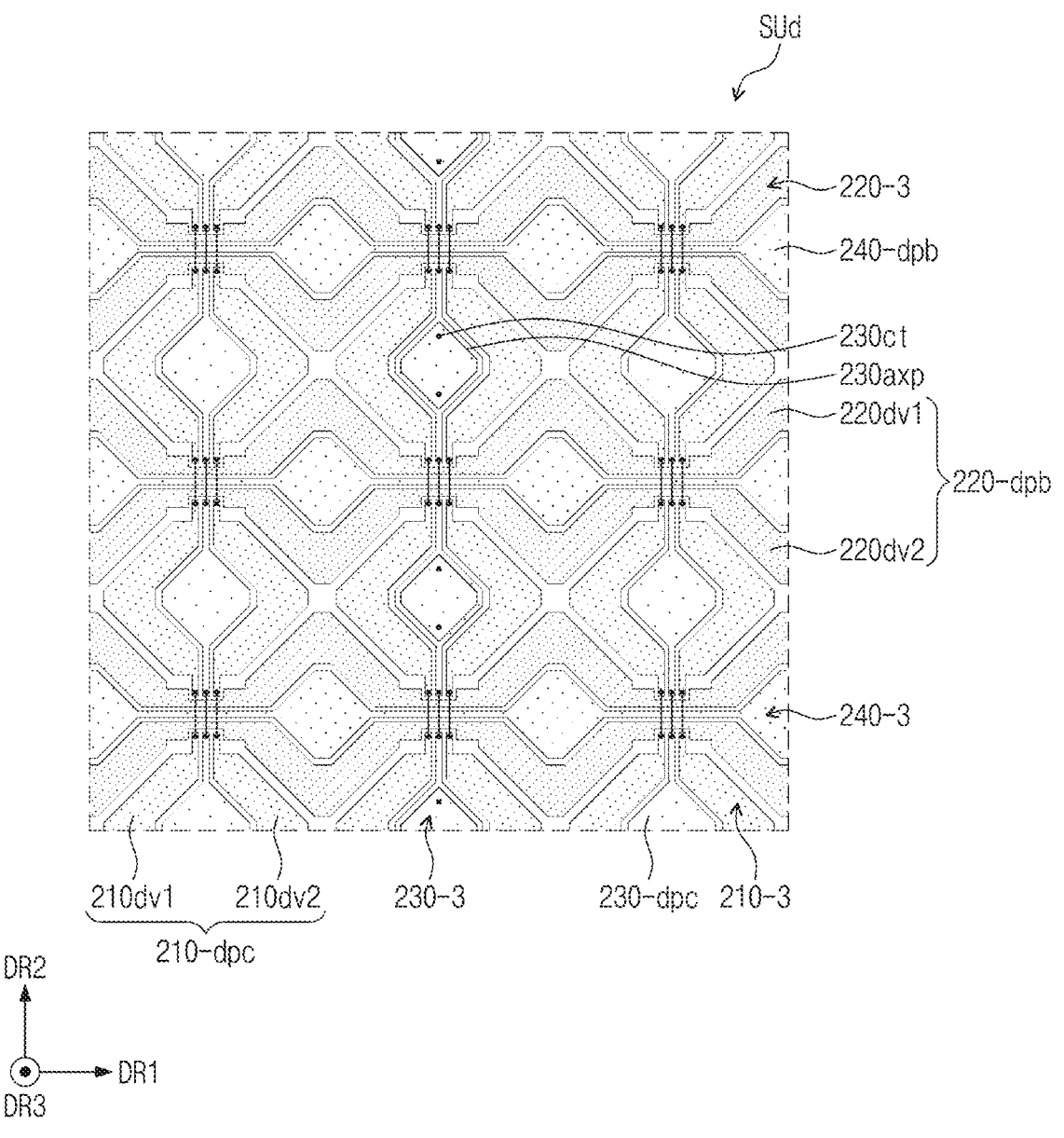
FIG. 24 is a plan view illustrating one sensing unit according to an embodiment of the present disclosure.

FIG. 24 is a plan view illustrating one sensing unit SUd according to an embodiment of the present disclosure.

Referring to FIG. 24, the sensing unit SUd may further include auxiliary electrodes 230*axp* when compared with the embodiment described above with reference to FIG. 23.

In an embodiment of the present disclosure, the auxiliary electrodes 230*axp* may overlap with one third divided electrode 230-*dpc* of the plurality of third divided electrodes 230-*dpc* of the third electrode 230-3. In other words, the auxiliary electrodes 230*axp* may be electrically connected to the one third divided electrode 230-*dpc*. In this case, an overall resistance of the third electrode 230-3 may be reduced. However, the present disclosure is not limited thereto.

Although only one third divided electrode 230-*dpc* overlaps with the auxiliary electrodes 230*axp* in the example described above with reference to FIG. 24, the present disclosure is not limited thereto. For example, the sensing unit SUd may further include auxiliary electrodes overlapping with the plurality of third divided electrodes 230-*dpc*, and the plurality of third divided electrodes 230-*dpc* may be electrically connected to the overlapping auxiliary electrodes, respectively.

In another embodiment of the present disclosure, the sensing unit SUd may further include auxiliary electrodes, and the auxiliary electrodes may be arranged in various suitable arrangements. For example, the auxiliary electrode may overlap with the first electrode 210-3, and the first divided electrode 210-*dpc* may be electrically connected to the overlapping auxiliary electrode. As another example, the auxiliary electrode may overlap with the second electrode 220-3, and the second divided electrode 220-*dpb* may be electrically connected to the overlapping auxiliary electrode. As another example, the auxiliary electrode may overlap with the fourth electrode 240-3, and the fourth divided electrode 240-*dpb* may be electrically connected to the overlapping auxiliary electrode.

Figure 25:
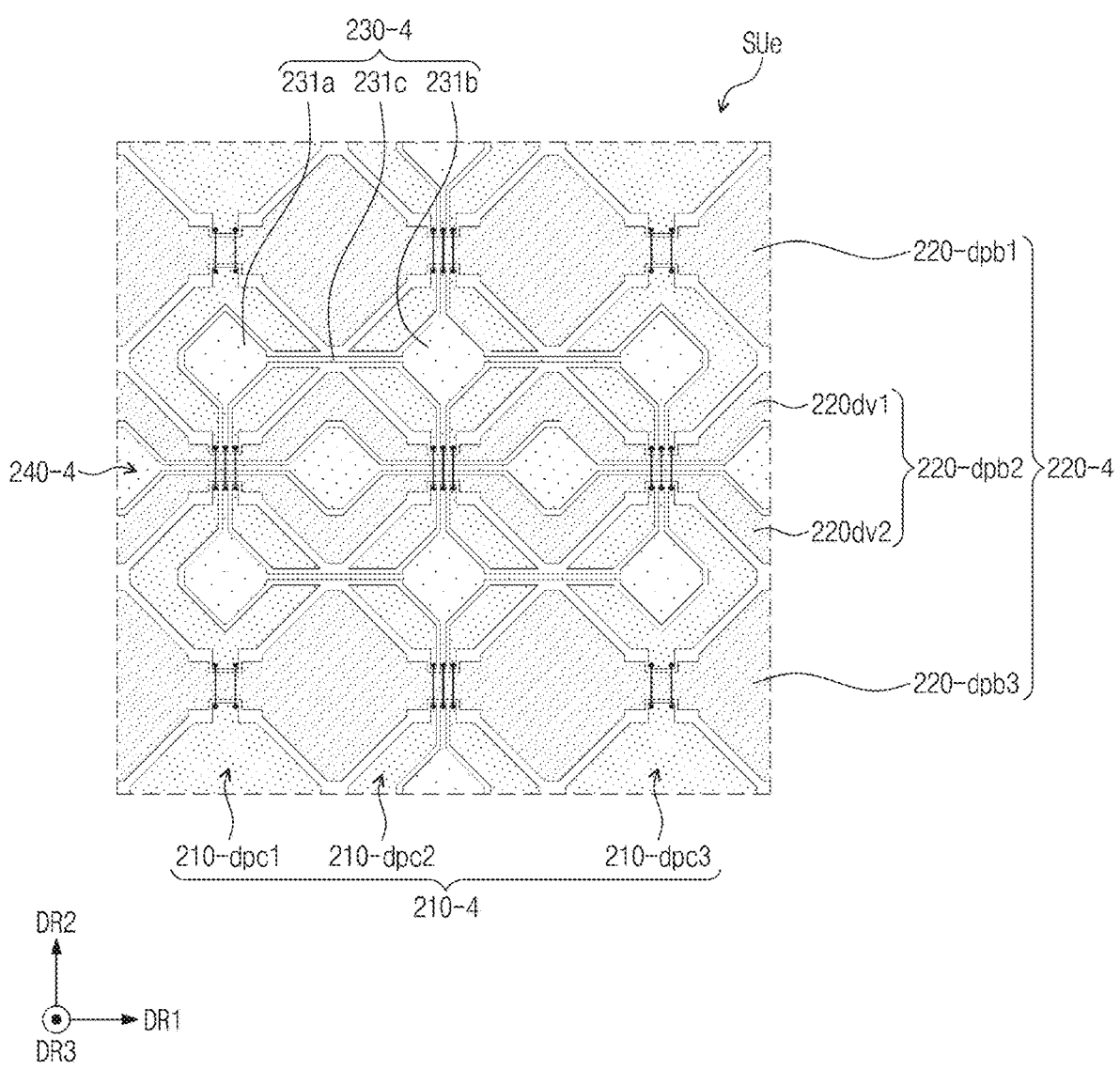
FIG. 25 is a plan view illustrating one sensing unit according to an embodiment of the present disclosure.

FIG. 25 is a plan view illustrating one sensing unit SUe according to an embodiment of the present disclosure.

Referring to FIG. 25, one sensing unit SUe may include a first electrode 210-4, a second electrode 220-4, a third electrode 230-4, and a fourth electrode 240-4.

The first electrode 210-3 may include a plurality of first divided electrodes 210-*dpc*1, 210-*dpc*2, and 210-*dpc*3 spaced apart from each other in the first direction DR1. The second electrode 220-3 may include a plurality of second divided electrodes 220-*dpb*1, 220-*dpb*2, and 220-*dpb*3 spaced apart from each other in the second direction DR2.

In an embodiment of the present disclosure, one third electrode 230-4 may be adjacent to all of the first divided electrodes 210-*dpc*1, 210-*dpc*2, and 210-*dpc*3. For example, the third electrode 230-4 may include a first adjacent pattern 231*a* adjacent to one first divided electrode 210-*dpc*1 of the first divided electrodes 210-*dpc*1, 210-*dpc*2, and 210-*dpc*3, a second adjacent pattern 231*b* adjacent to another first divided electrode 210-*dpc*2 of the first divided electrodes 210-*dpc*1, 210-*dpc*2, and 210-*dpc*3, and a connection pattern 231*c* electrically connected to the first adjacent pattern 231*a* and the second adjacent pattern 231*b*.

In an embodiment of the present disclosure, one fourth electrode 240-4 may be adjacent to one of the second divided electrodes 220-*dpb*1, 220-*dpb*2, and 220-*dpb*3. In FIG. 25, the fourth electrode 240-4 is shown as being disposed adjacent to the second divided electrode 220-*dpb*2 as an example. However, the present disclosure is not limited thereto. The fourth electrode 240-4 may have a shape similar to that of the third electrode 230-4, and may be disposed adjacent to all of the second divided electrodes 220-*dpb*1, 220-*dpb*2, and 220-*dpb*3.

In an embodiment of the present disclosure, in one sensing unit SUe, each of the first electrode 210-4 and the second electrode 220-4 may have a plurality of resistance paths, and the third electrode 230-4 and the fourth electrode 240-4 may have a single resistance pass.

Figure 26:
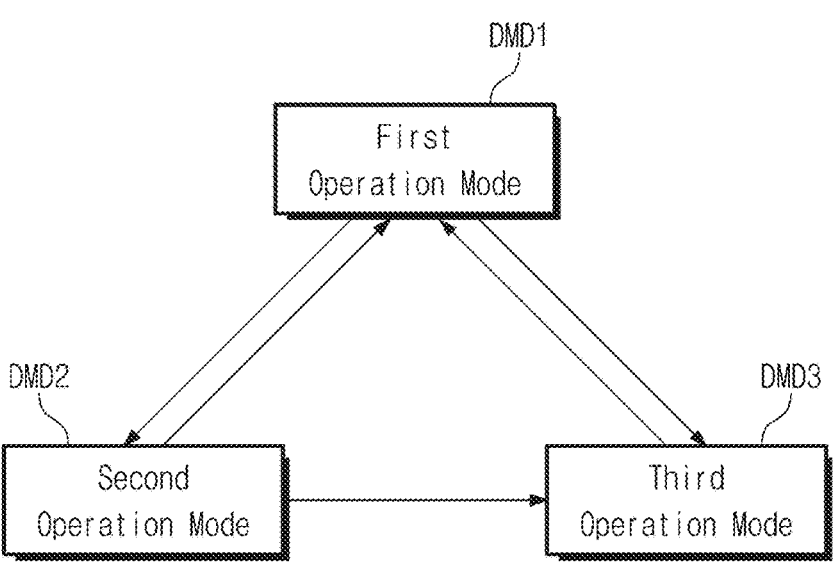
FIG. 26 is a block diagram illustrating an operation of a sensor driver according to an embodiment of the present disclosure.

FIG. 26 is a block diagram illustrating an operation of the sensor driver 200C (e.g., refer to FIG. 5) according to an embodiment of the present disclosure.

Referring to FIGS. 5 and 26, the sensor driver 200C may be selectively driven in one of a first operation mode DMD1, a second operation mode DMD2, and/or a third operation mode DMD3.

The first operation mode DMD1 may be referred to as a touch and pen standby mode. The second operation mode DMD2 may be referred to as a touch activation and pen standby mode. The third operation mode DMD3 may be referred to as a pen activation mode. The first operation mode DMD1 may be a mode of standing by for the first input 2000 and the second input 3000. The second operation mode DMD2 may be a mode of sensing the first input 2000, and standing by for the second input 3000. The third operation mode DMD3 may be a mode of sensing the second input 3000.

In an embodiment of the present disclosure, the sensor driver 200C may be firstly driven in the first operation mode DMD1. When the first input 2000 is sensed in the first operation mode DMD1, the sensor driver 200C may be switched (e.g., may be converted) to the second operation mode DMD2. When the second input 3000 is sensed in the first operation mode DMD1, the sensor driver 200C may be switched (e.g., may be converted) to the third operation mode DMD3.

In an embodiment of the present disclosure, when the second input 3000 is sensed in the second operation mode DMD2, the sensor driver 200C may be switched to the third operation mode DMD3. When the first input 2000 is released (e.g., not sensed) in the second operation mode DMD2, the sensor driver 200C may be switched to the first operation mode DMD1. When the second input 3000 is released (e.g., not sensed) in the third operation mode DMD3, the sensor driver 200C may be switched to the first operation mode DMD1.

Figure 27:
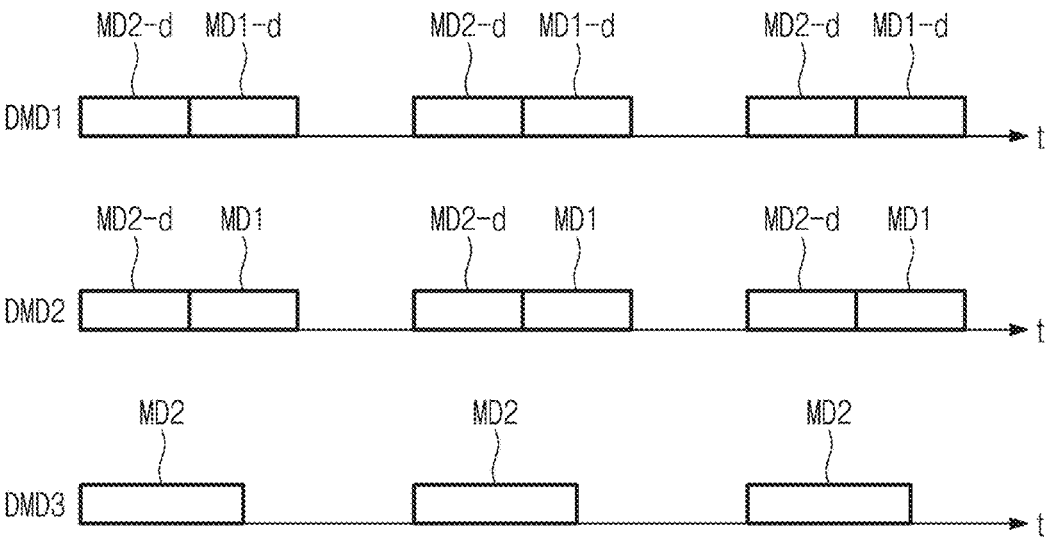
FIG. 27 is a schematic view illustrating an operation of the sensor driver according to an embodiment of the present disclosure.

FIG. 27 is a schematic view illustrating an operation of the sensor driver 200C (e.g., refer to FIG. 5) according to an embodiment of the present disclosure.

In FIG. 27, the operations in the first to third operation modes DMD1, DMD2, and DMD3 are illustrated in an order of time t as an example.

Referring to FIGS. 5, 26, and 27, in the first operation mode DMD1, the sensor driver 200C may be repeatedly driven in a second mode MD2-$d$ and a first mode MD1-$d$. During the second mode MD2-$d$, the sensor layer 200 may be scan driven to detect the second input 3000. During the first mode MD1-$d$, the sensor layer 200 may be scan driven to detect the first input 2000. Although in the example illustrated in FIG. 27, the sensor driver 200C continuously operates in the second mode Md2-$d$ and then in the first mode Md1-$d$, the present disclosure is not limited to the order.

In the second operation mode DMD2, the sensor driver 200C may be repeatedly driven in a second mode MD2-$d$ and a first mode MD1. During the second mode MD2-$d$, the sensor layer 200 may be scan driven to detect the second input 3000. During the first mode MD1, the sensor layer 200 may be scan driven to detect coordinates caused by the first input 2000.

In the third operation mode DMD3, the sensor driver 200C may be driven in a second mode MD2. During the second mode MD2, the sensor layer 200 may be scan driven to detect coordinates caused by the second input 3000. In the third operation mode DMD3, the sensor driver 200C may not operate in the first operation mode Md1-$d$ or MD1 until the second input 3000 is released (e.g., not sensed).

Referring further to FIG. 7 together, in the first mode MD1-$d$ and the first mode MD1, all of the third electrodes 230 and the fourth electrodes 240 may be grounded, or a constant or substantially constant voltage may be applied thereto. As another example, in the first mode MD1, all of the third electrodes 230 and the fourth electrodes 240 may be floated (e.g., may be electrically floated). As another example, in the first mode MD1-$d$ and the first mode MD1, a signal having the same phase as that of a transmission signal provided to the first electrodes 210 may be applied to the third electrodes 230 and the fourth electrodes 240. In this case, a touch noise may be prevented or substantially prevented from being introduced through the third electrodes 230 and the fourth electrodes 240.

In the second mode MD2-$d$ and the second mode MD2, one end of each of the third electrodes 230 and the fourth electrodes 240 may be floated. As another example, in the second mode MD2-$d$ and the second mode MD2, another end (e.g., an opposite end) of each of the third electrodes 230 and the fourth electrodes 240 may be grounded or floated. Thus, compensation for the sensing signal may be increased or maximized by the coupling between the first electrodes 210 and the third electrodes 230, and the coupling between the second electrodes 220 and the fourth electrodes 240.

Figure 28:
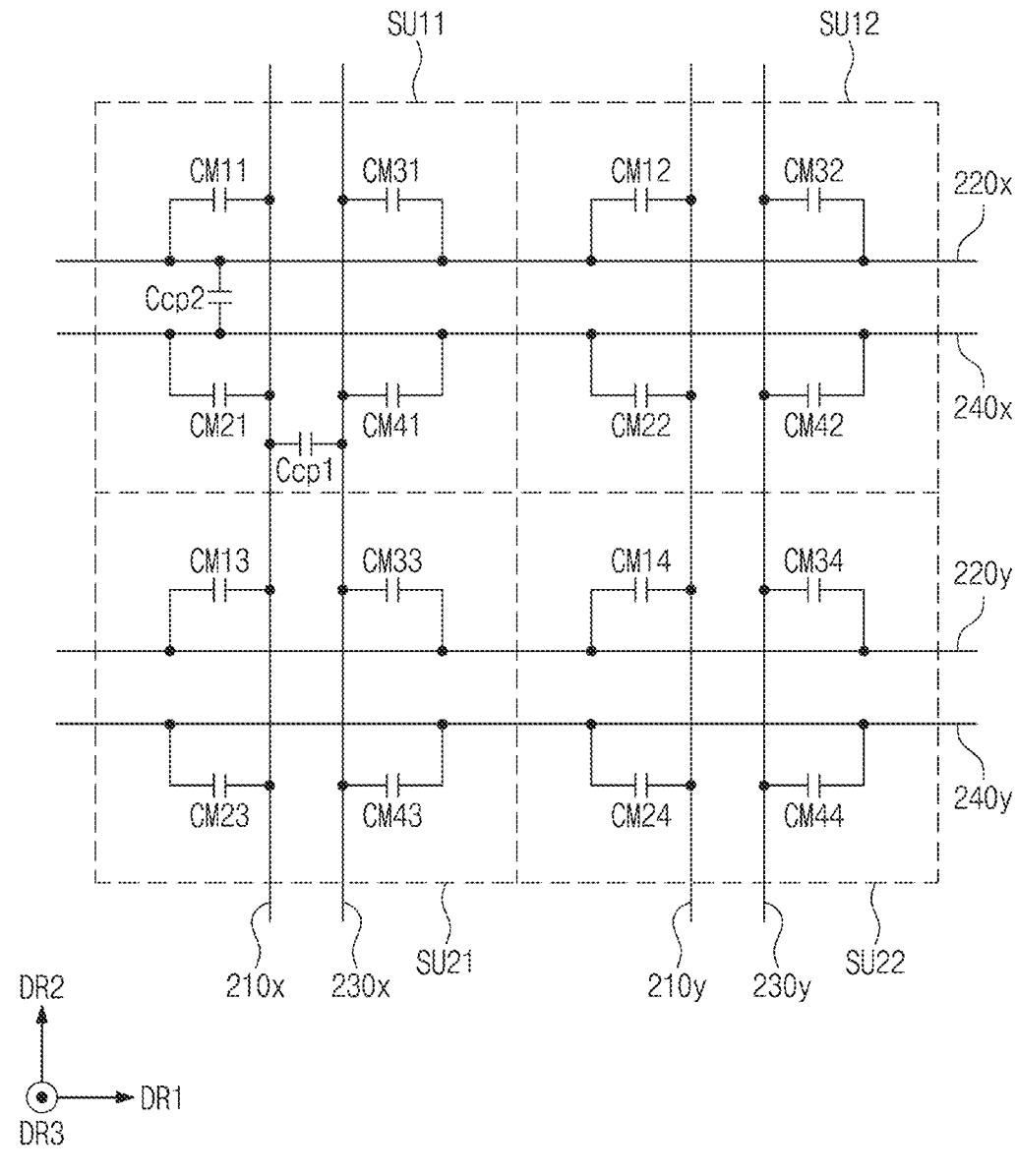
FIG. 28 is an equivalent circuit diagram illustrating four sensing units according to an embodiment of the present disclosure.

FIG. 28 is an equivalent circuit diagram illustrating four sensing units according to an embodiment of the present disclosure.

Referring to FIG. 28, first to fourth sensing units SU11, SU12, SU21, and SU22 are illustrated as an example. The first sensing unit SU11 and the second sensing unit SU12 may be adjacent to each other in the first direction DR1, and may include a second electrode 220$x$ and a fourth electrode 240$x$ in common. The first sensing unit SU11 and the third sensing unit SU21 may be adjacent to each other in the second direction DR2, and may include a first electrode 210$x$ and a third electrode 230$x$ in common.

The third sensing unit SU21 and the fourth sensing unit SU22 may be adjacent to each other in the first direction DR1, and may include a second electrode 220$y$ and a fourth electrode 240$y$ in common. The second sensing unit SU12 and the fourth sensing unit SU22 may be adjacent to each other in the second direction DR2, and may include a first electrode 210$y$ and a third electrode 230$y$ in common.

First to fourth capacitances CM11, CM21, CM31, and CM41 may be provided in the first sensing unit SU11. First to fourth capacitances CM12, CM22, CM32, and CM42 may be provided in the second sensing unit SU12. First to fourth capacitances CM13, CM23, CM33, and CM43 may be provided in the third sensing unit SU21. First to fourth capacitances CM14, CM24, CM34, and CM44 may be provided in the fourth sensing unit SU22. Hereinafter, the first sensing unit SU11 will be described in more detail as a representative example.

Each of the first to fourth capacitances CM11, CM21, CM31, and CM41 may have a temperature variant value. Thus, as each of the first to fourth capacitances CM11, CM21, CM31, and CM41 decreases, temperature characteristics of the sensor layer 200 may be improved. The temperature characteristics being improved may represent a reduction in a probability of a ghost touch being recognized as a touch, even when a touch does not occur, as a dielectric constant may be varied depending on the temperature.

In an embodiment of the present disclosure, the first capacitance CM11 may be defined between the first electrode 210$x$ and the second electrode 220$x$. A design range of the first capacitance CM11 may be varied according to a driving method of the sensor driver 200C (e.g., refer to FIG. 5). For example, when a touch is not generated, the first capacitance CM11 may be several hundreds fF (femto farad), and when a touch is generated, an amount of variation of the first capacitance CM11 may be several tens fF. However, the present disclosure is not limited thereto.

In an embodiment of the present disclosure, the amount of variation of the first capacitance CM11 may be increased. A minimum value of the amount of variation of the first capacitance CM11 may be varied according to the sensor driver 200C (e.g., refer to FIG. 5). For example, when a touch is generated, the minimum value of the amount of variation of the first capacitance CM11 may be 30 fF or more (e.g., 34 fF). However, the present disclosure is not limited to the minimum value of the amount of variation of the first capacitance CM11.

In an embodiment, each of the second capacitance CM21, the third capacitance CM31, and the fourth capacitance CM41 may be decreased. For example, each of the second capacitance CM21, the third capacitance CM31, and the fourth capacitance CM41 may be several hundreds fF or less, or several tens fF or less. However, the present disclosure is not limited thereto.

A first coupling capacitance Ccp1 (e.g., referred to as a first capacitance) may be defined between the first electrode 210x and the third electrode 230x. A second coupling capacitance Ccp2 (e.g., referred to as a second capacitance) may be defined between the second electrode 220x and the fourth electrode 240x. As the first coupling capacitance Ccp1 and the second coupling capacitance Ccp2 are increased, the pen detection performance of the sensor layer 200 (e.g., refer to FIG. 7) may be improved. Also, as the first coupling capacitance Ccp1 and the second coupling capacitance Ccp2 are decreased, the touch sensing performance of the sensor layer 200 (e.g., refer to FIG. 7) may be improved. Thus, the first coupling capacitance Ccp1 and the second coupling capacitance Ccp2 may be set to an appropriate range.

According to an embodiment of the present disclosure, the first coupling capacitance Ccp1 and the second coupling capacitance Ccp2 may be adjusted by adjusting an overlap area of the first electrode 210x and the third electrode 230x, and adjusting an overlap area of the second electrode 220x and the fourth electrode 240x. For example, the first coupling capacitance Ccp1 may be 8 pF (pico farad) or more and 15 pF or less, and the second coupling capacitance Ccp2 may be 8 pF or more and 15 pF or less.

Figure 29:
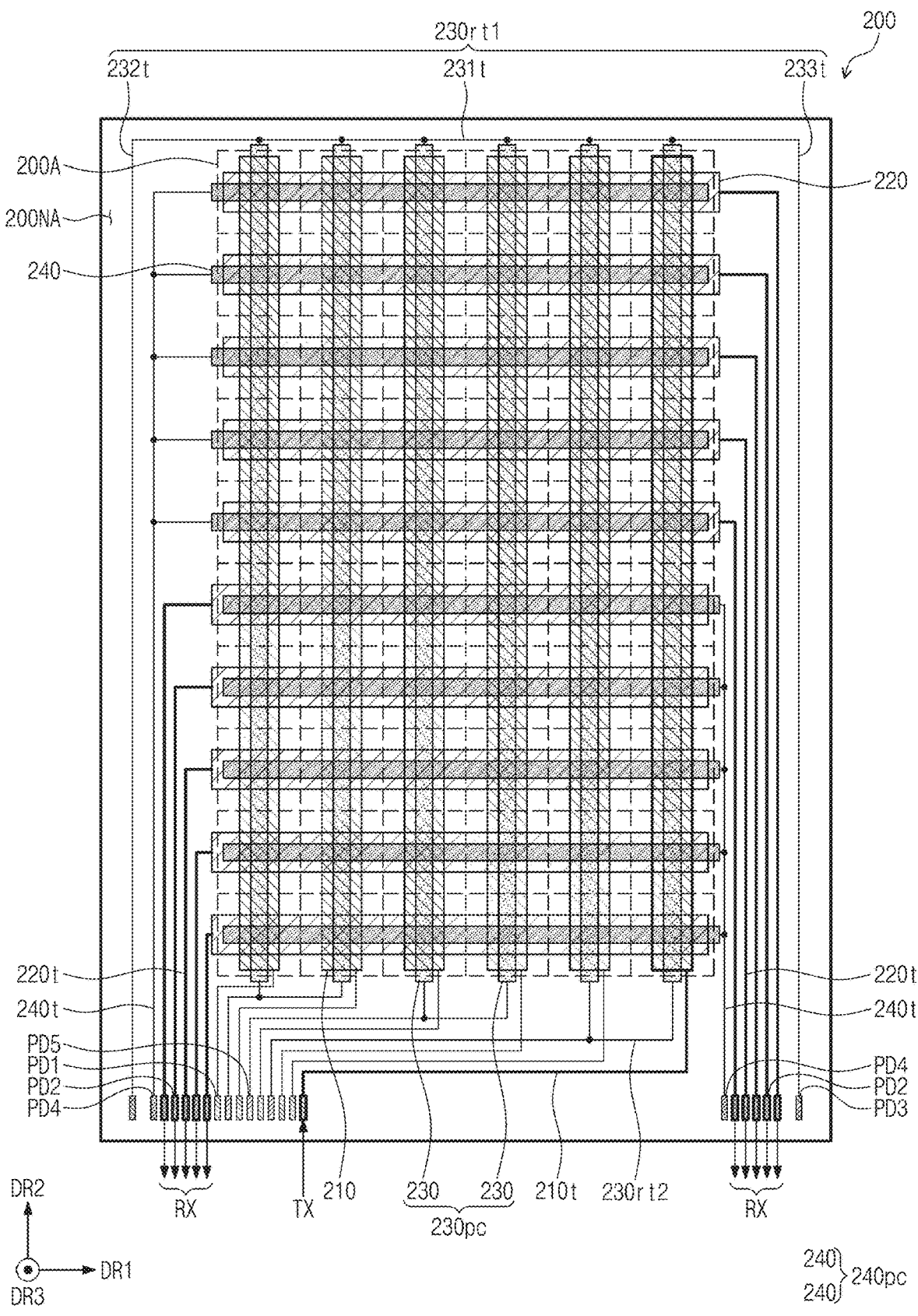
FIG. 29 is a view illustrating a first mode according to an embodiment of the present disclosure.

FIG. 29 is a view illustrating the first mode according to an embodiment of the present disclosure.

Referring to FIGS. 5, 27, and 29, each of the first mode MD1-$d$ of the first operation mode DMD1 and the first mode MD1 of the second operation mode DMD2 may include a mutual capacitance detection mode. FIG. 29 is a view illustrating the mutual capacitance detection mode in the first mode MD1-$d$ of the first operation mode DMD1 and the first mode MD1 of the second operation mode DMD2.

In the mutual capacitance detection mode, the sensor driver 200C may sequentially provide a transmission signal TX to the first electrodes 210, and may detect coordinates of the first input 2000 by using a reception signal RX detected through the second electrodes 220. For example, the sensor driver 200C may calculate input coordinates by sensing a variation of the mutual capacitance between the first electrodes 210 and the second electrodes 220.

In FIG. 29, the transmission signal TX is shown as being provided to one first electrode 210, and the reception signal RX is shown as being output from the second electrodes 220 as an example. In order to clearly express the signal, one first electrode 210 to which the transmission signal TX is provided is illustrated in bold in FIG. 29. The sensor driver 200C may detect the input coordinates of the first input 2000 by sensing the variation of the capacitance between the first electrode 210 and the second electrodes 220.

In another embodiment of the present disclosure, at least one of the first mode Md1-$d$ of the first operation mode DMD1 and/or the first mode MD1 of the second operation mode DMD2 may further include a self-capacitance detection mode. The sensor driver 200C may output driving signals to the first electrodes 210 and the second electrodes 220, and may calculate the input coordinates by sensing the variation of the capacitance of each of the first electrodes 210 and the second electrodes 220 in the self-capacitance detection mode.

Figure 30A:
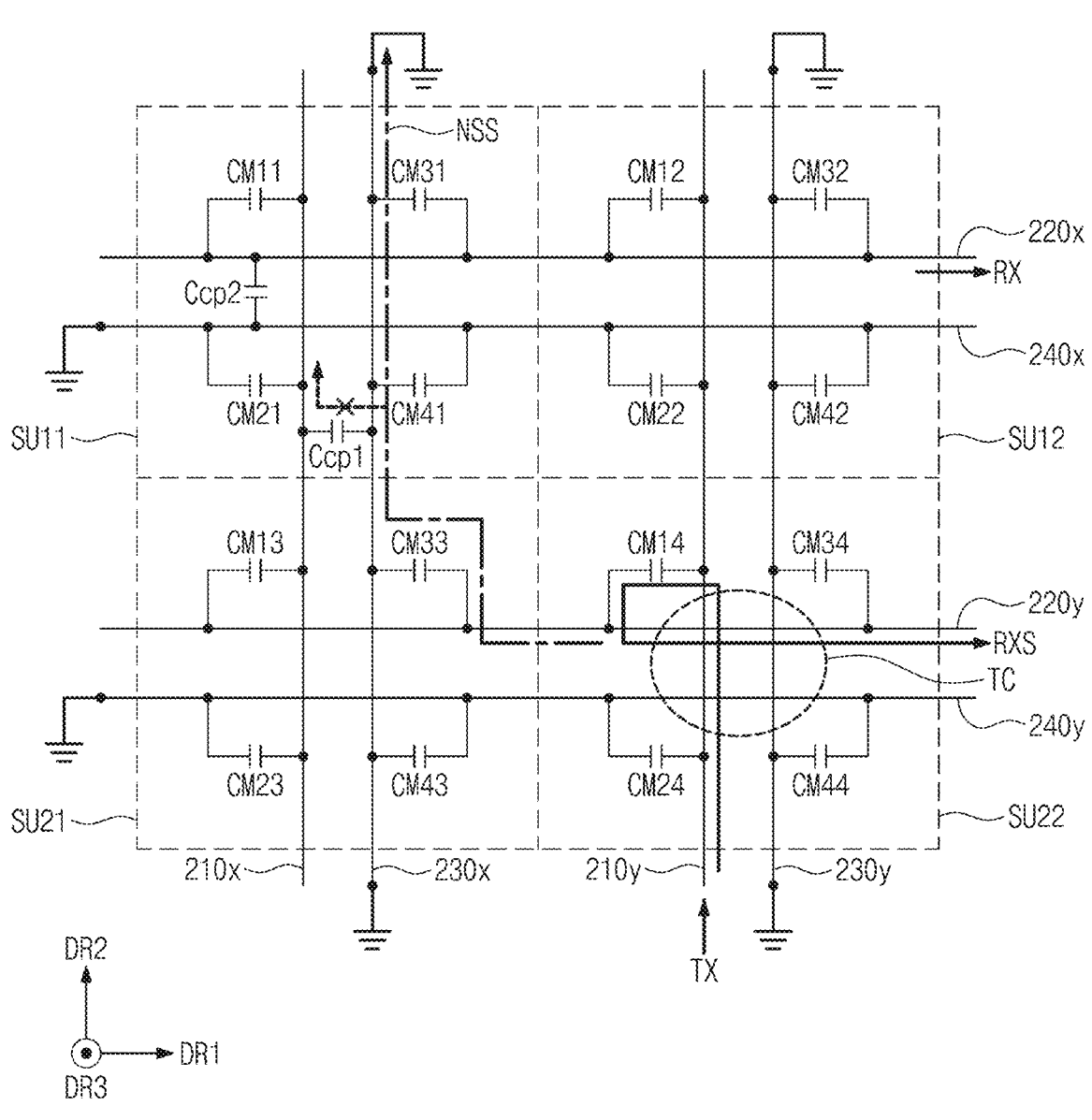
FIG. 30A is an equivalent circuit diagram illustrating four sensing units in the first mode according to an embodiment of the present disclosure.

FIG. 30A is an equivalent circuit diagram illustrating four sensing units in the first mode according to an embodiment of the present disclosure.

Referring to FIGS. 29 and 30A, a touch event TC that occurs in the fourth sensing unit SU22 in the mutual capacitance detection mode is illustrated as an example.

When the transmission signal TX is provided to the first electrode 210y, the sensor driver 200C receives reception signals RX and RXS from the second electrodes 220x and 220y. The sensor driver 200C may detect input coordinates of the touch event TC by sensing a variation of the capacitance between the first electrode 210y and the second electrode 220y, (e.g., the first capacitance CM14).

According to an embodiment of the present disclosure, all of the third electrodes 230 and the fourth electrodes 240 may be grounded in the mutual capacitance detection mode. In this case, the transmission signal TX may escape to ground instead of being transmitted to another first electrode 210x, even though the transmission signal TX provided to the first electrode 210y is transmitted to the third electrode 230x. In other words, a parasitic component NSS that may cause a ghost touch may escape to ground. Thus, a noise may not be introduced through the third electrodes 230 and the fourth electrodes 240.

Although all of the third electrodes 230x and 230y and the fourth electrodes 240x and 240y may be grounded as an example described above with reference to FIG. 30A, the present disclosure is not limited thereto. For example, the third electrodes 230x and 230y may be grounded, and the fourth electrodes 240x and 240y may be floated.

Figure 30B:
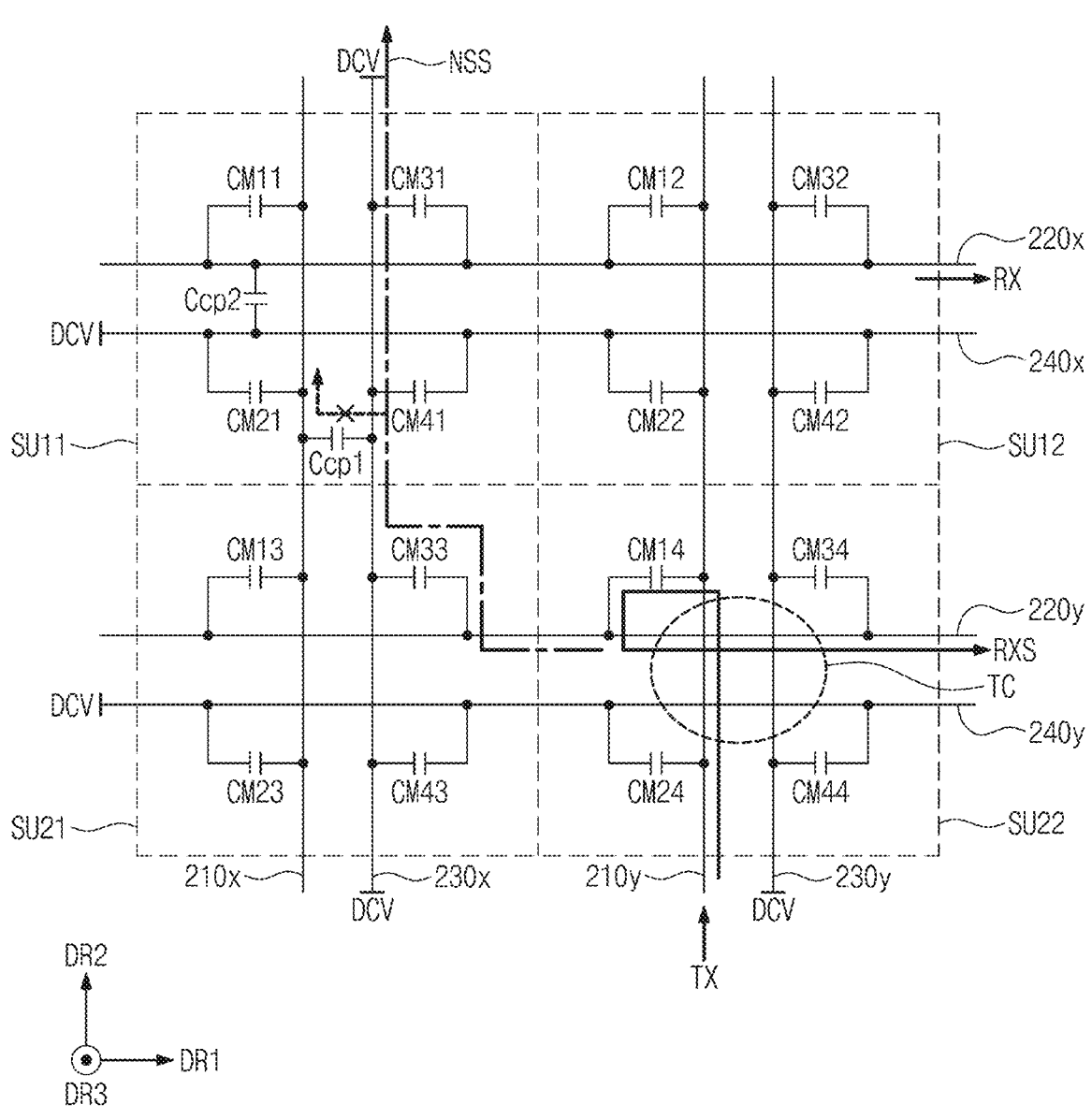
FIG. 30B is an equivalent circuit diagram illustrating four sensing units in the first mode according to an embodiment of the present disclosure.

FIG. 30B is an equivalent circuit diagram illustrating four sensing units in the first mode according to an embodiment of the present disclosure.

Referring to FIGS. 29 and 30B, a constant or substantially constant voltage DCV may be applied to the third electrodes 230 and the fourth electrodes 240 in the mutual capacitance detection mode. The constant voltage DCV may be a direct current voltage having a suitable level (e.g., a predetermined level).

According to an embodiment of the present disclosure, although the transmission signal TX provided to the first electrode 210y is transmitted to the third electrode 230x, the transmission signal TX may be transmitted to a node to which the constant voltage DCV is provided, instead of being transmitted to the first electrode 210x through the third electrode 230x. In other words, the parasitic component NSS that may cause the ghost touch may escape to the node.

Although FIG. 30B shows that the constant voltage DCV is provided to all of the third electrodes 230x and 230y and the fourth electrodes 240x and 240y as an example, the present disclosure is not limited thereto. For example, the constant voltage DCV may be provided to the third electrodes 230x and 230y, and the fourth electrodes 240x and 240y may be floated.

Figure 31:
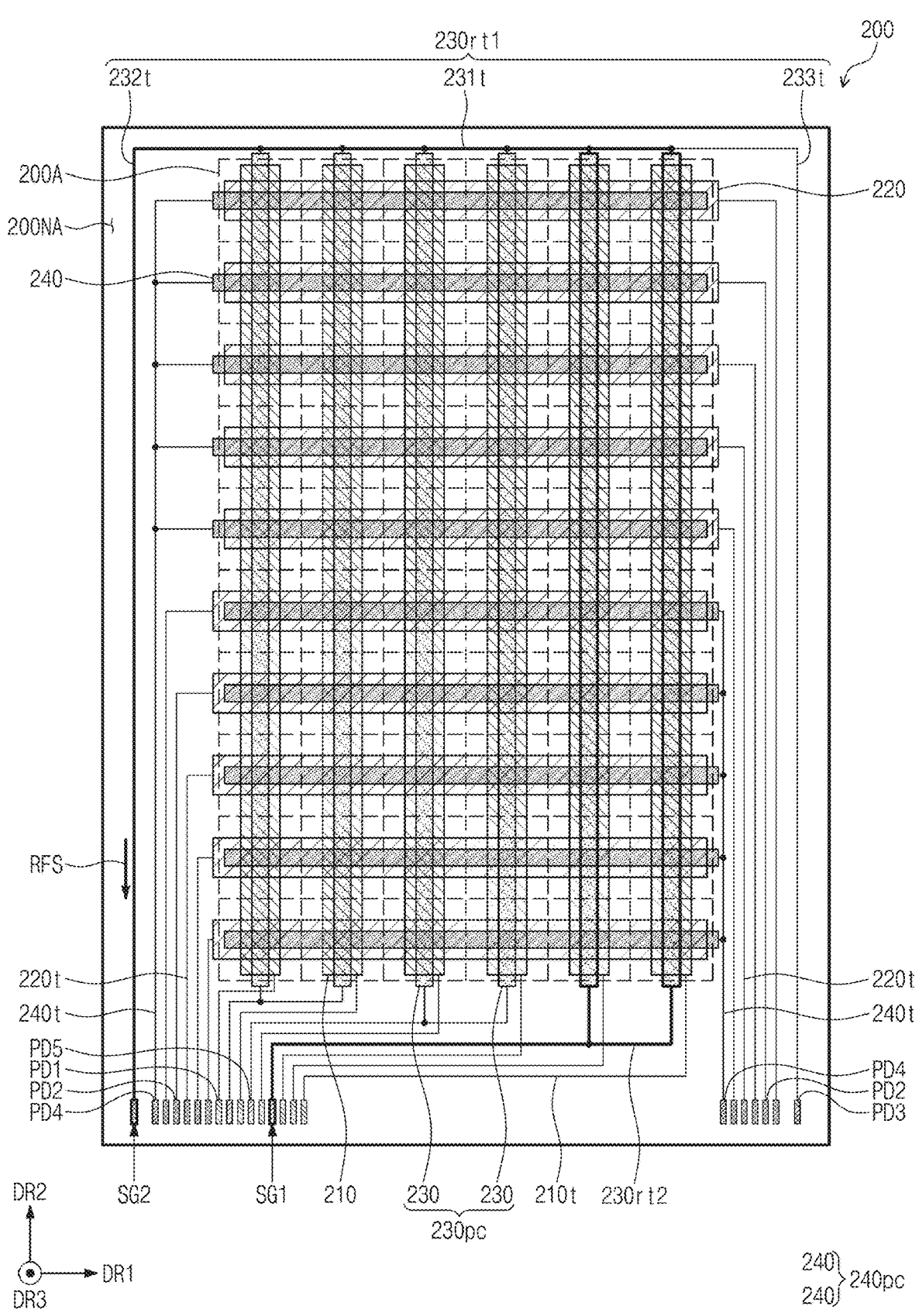
FIG. 31 is a view illustrating a second mode according to an embodiment of the present disclosure.
Figure 32A:
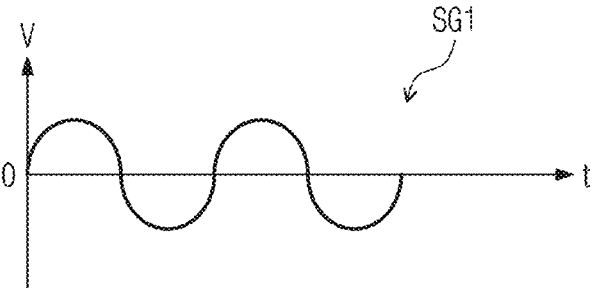
FIG. 32A is a graph showing a waveform of a first signal according to an embodiment of the present disclosure.
Figure 32B:
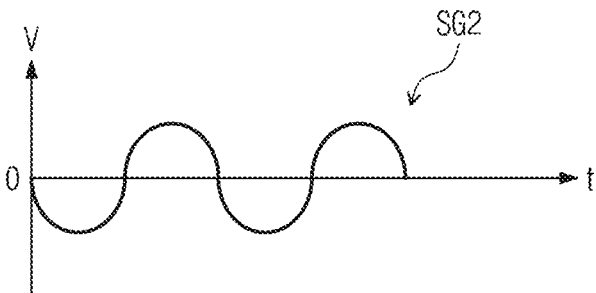
FIG. 32B is a graph showing a waveform of a second signal according to an embodiment of the present disclosure.

FIG. 31 is a view illustrating the second mode according to an embodiment of the present disclosure. FIG. 32A is a graph showing a waveform of a first signal according to an embodiment of the present disclosure. FIG. 32B is a graph showing a waveform of a second signal according to an embodiment of the present disclosure.

Referring to FIGS. 27, 32A, and 32B, the second mode MD2 may include a charging driving mode. The charging driving mode may include a searching charging driving mode and a tracking charging driving mode.

The searching charging driving mode may be a driving mode before sensing a position of the pen. Thus, a first signal SG1 or a second signal SG2 may be provided to all channels included in the sensor layer 200. In other words, the entire area of the sensor layer 200 may be scanned in the searching charging driving mode. When the pen PN is sensed in the searching charging driving mode, the sensor layer 200 may be tracking searching driven. For example, in the tracking charging driving mode, the sensor driver 200C may sequentially output the first signal SG1 and the second signal SG2 to an area overlapping with a point at which the pen PN is sensed, instead of the entire sensor layer 200.

In the charging driving mode, the sensor driver 200C may apply the first signal SG1 to one of the third pads PD3 and/or the fifth pads PD5, and may apply the second signal SG2 to another pad. The second signal SG2 may be a reverse phase signal of the first signal SG1. For example, the first signal SG1 may be a sinusoidal signal.

Because the first signal SG1 and the second signal SG2 are applied to at least two pads, a current RFS may have a current path flowing through one pad to another pad. Also, because the first signal SG1 and the second signal SG2 may be sinusoidal signals having a reverse phase relationship with each other, a direction of the current RFS may be changed periodically. In another embodiment of the present disclosure, the first signal SG1 and the second signal SG2 may be square wave signals having an inverse relationship with each other.

When the first signal SG1 and the second signal SG2 have the reverse phase relationship with each other, the noise occurring in the display layer 100 (e.g., refer to FIG. 4) by the first signal SG1 may be canceled by the second signal SG2. Thus, a flicker phenomenon may not occur in the display layer 100, and a display quality of the display layer 100 may be improved.

In another embodiment of the present disclosure, the first signal SG1 may be a square wave signal. However, the present disclosure is not limited thereto. For example, the first signal SG1 may be a sinusoidal signal. Also, the second signal SG2 may have a constant or substantially constant voltage (e.g., a predetermined constant voltage). For example, the second signal SG2 may be a ground voltage. In other words, a pad to which the second signal SG2 is applied may be grounded. Even in this case, the current RFS may flow from one pad to another pad. Also, although the other pad is grounded, the direction of the current RFS may be changed periodically because the first signal SG1 may be the sinusoidal wave signal or the square wave signal.

Referring to FIG. 31, the second signal SG2 is provided to one third pad PD3 connected to one third trace line 230rt1, and the first signal SG1 is provided to one fifth pad PD5 connected to the third electrode 230. From the fifth pad PD5, the current RFS may flow through a current path defined by the fifth trace line 230rt2 connected to the fifth pad PD5, the third electrode 230, a portion of the third trace line 230rt1 connected to the third pad PD3, and the third pad PD3. The current path may have a coil shape. Thus, in the charging driving mode of the second mode, a resonance circuit of the pen PN may be charged by the current path.

According to an embodiment of the present disclosure, a current path of a loop coil pattern may be realized by components included in the sensor layer 200. Thus, the electronic device 1000 (e.g., refer to FIG. 1A) may charge the pen PN by using the sensor layer 200. As such, because a component having a coil for charging the pen PN is not additionally used, the electronic device 1000 may not have an increase in a thickness and a weight thereof, and a decrease in a flexibility thereof.

In the charging driving mode, the first electrodes 210, the second electrodes 220, and the fourth electrodes 240 may be grounded or electrically floated, or may have the constant voltage applied thereto. In more detail, the first electrodes 210, the second electrodes 220, and the fourth electrodes 240 may be floated. In this case, the current RFS may not flow through the first electrodes 210, the second electrodes 220, and the fourth electrodes 240.

Figure 33A:
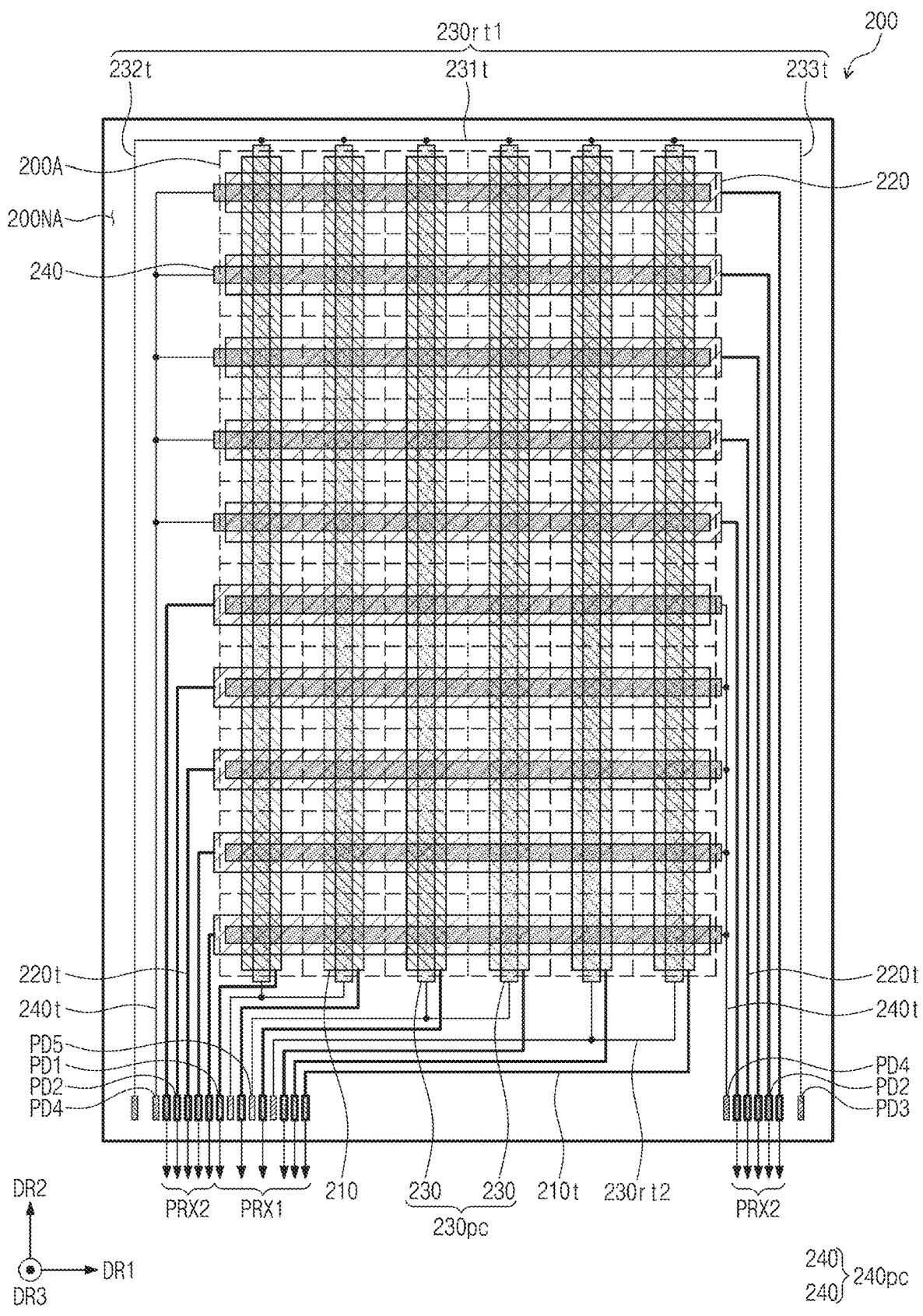
FIG. 33A is a view illustrating the second mode according to an embodiment of the present disclosure.
Figure 33B:
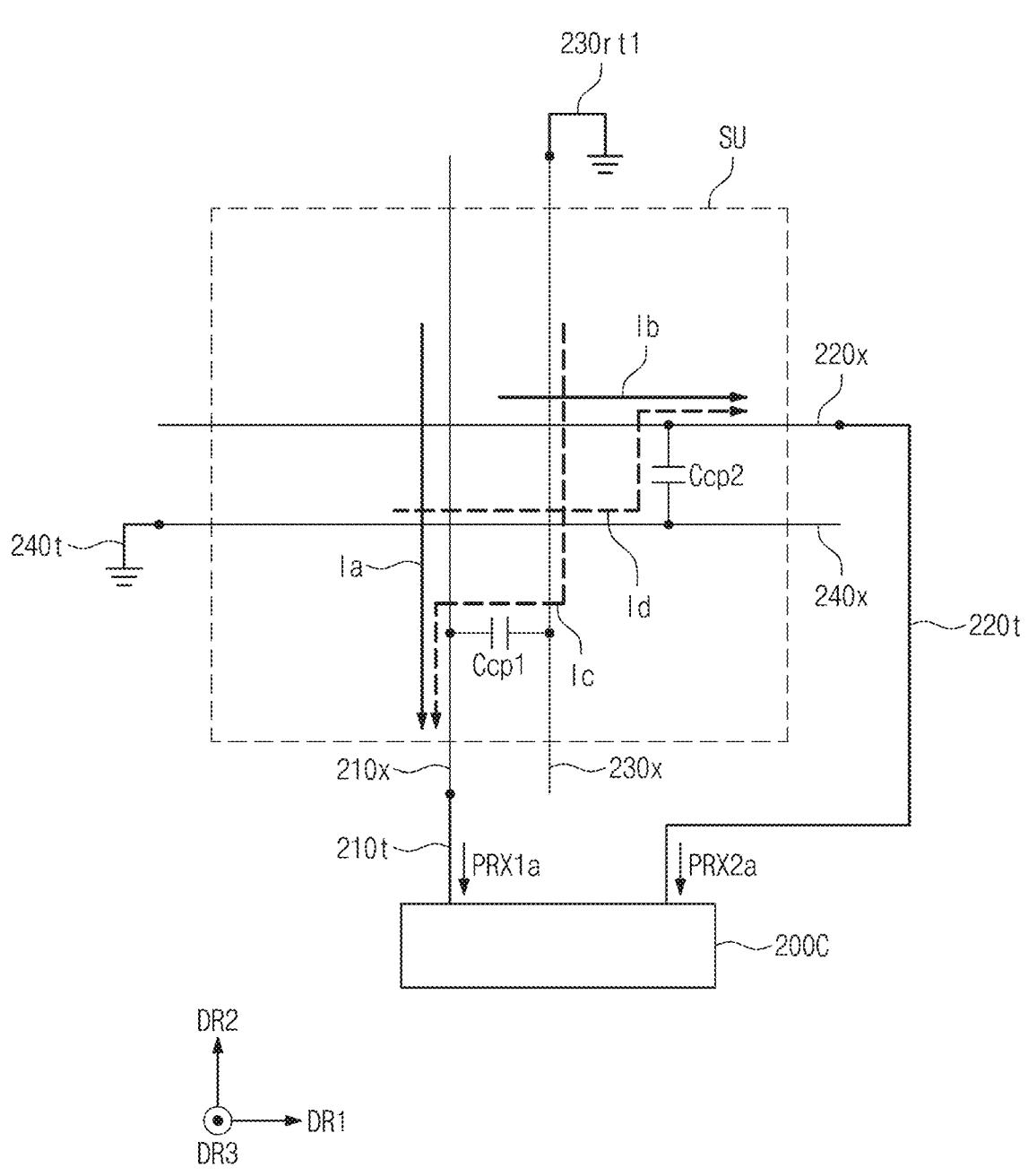
FIG. 33B is a view illustrating one sensing unit in the second mode according to an embodiment of the present disclosure.

FIG. 33A is a view illustrating the second mode according to an embodiment of the present disclosure. FIG. 33B is a view illustrating one sensing unit in the second mode according to an embodiment of the present disclosure.

Referring to FIGS. 33A and 33B, the second mode may include a charging driving mode and a pen sensing driving mode. FIGS. 33A and 33B are views illustrating the pen sensing driving mode. In FIG. 33B, first to fourth induced currents Ia, Ib, Ic, and Id generated by the pen PN and flowing through one sensing unit SU is illustrated.

In the pen sensing driving mode, the sensor driver 200C may receive first receive signals PRX1 from first electrodes 210 and second receive signals PRX2 from second electrodes 220.

In an embodiment of the present disclosure, routing directions of one electrode and another electrode of the sensor layer 200, which overlap with each other, may be different from each other. For example, a routing direction of the first electrode 210x and a routing direction of the third electrode 230x may be different from each other. Also, a routing direction of the second electrode 220x and a routing direction of the fourth electrode 240x may be different from each other. For example, in FIG. 33B, the first electrode 210x and the first trace line 210t may be connected to each other at a lower portion of the sensing unit SU, and the third electrode 230x and the third trace line 230rt1 may be connected to each other at an upper portion of the sensing unit SU. The second electrode 220x and the second trace line 220t may be connected to each other at a right side of the sensing unit SU, and the fourth electrode 240x and the fourth trace line 240t may be connected to each other at a left side of the sensing unit SU.

An RLC resonant circuit of the pen PN may emit a magnetic field having a resonant frequency, while discharging charged electric charges. The first induced current Ia may be generated in the first electrode 210x, and the second induced current Ib may be generated in the second electrode 220x by the magnetic field provided by the pen PN. Also, the third induced current Ic may be generated in the third electrode 230x, and the fourth induced current Id may be generated in the fourth electrode 240x.

A first coupling capacitance Ccp1 may be provided between the first electrode 210x and the third electrode 230x, and a second coupling capacitance Ccp2 may be provided between the second electrode 220x and the fourth electrode 240x. The third induced current Ic may be transmitted to the first electrode 210x through the first coupling capacitance Ccp1, and the fourth induced current Id may be transmitted to the second electrode 220x through the second coupling capacitance Ccp2.

The sensor driver 200C may receive a first reception signal PRX1a based on the first induced current Ia and the third induced current Ic from the first electrode 210x, and a second reception signal PRX2a based on the second induced current Ib and the fourth induced current Id from the second electrode 220x. The sensor driver 200C may detect the input coordinates of the pen PN based on the first reception signal PRX1a and the second reception signal PRX2a.

The sensor driver 200C may receive the first reception signal PRX1a from the first electrode 210x and the second reception signal PRX2a from the second electrode 220x. In this case, all of the ends of the third electrode 230x and the fourth electrode 240x may be floated. Thus, a compensation for the sensing signal may be increased or maximized by the coupling between the first electrode 210x and the third electrode 230x, and the coupling between the second electrode 220x and the fourth electrode 240x.

Also, the other ends of the third electrode 230x and the fourth electrode 240x may be floated. Thus, the third induced current Ic and the fourth induced current Id may be sufficiently transmitted to the first electrode 210x and the second electrode 220x by the coupling between the first electrode 210x and the third electrode 230x and the coupling between the second electrode 220x and the fourth electrode 240x.

According to some embodiments of the present disclosure described above, not only the touch input but also the input by the pen may be sensed by using the sensor layer. Thus, because an additional component (e.g., a digitizer) for pen sensing may not be used or included in the electronic device, the electronic device may not have an increased thickness and weight, and may not have a decreased flexibility due to the addition of the additional component (e.g., the digitizer).

According to some embodiments of the present disclosure described above, the capacitance between the first electrode and the third electrode and the capacitance between the second electrode and the fourth electrodes may be adjusted as needed or desired, by adjusting the overlap area of the first electrode and the third electrodes and the overlap area of the second electrode and the fourth electrodes of the sensor layer. Thus, the sensor layer 200 having capacitances at an appropriate level in consideration of a desired touch sensitivity and a desired pen detection sensitivity may be provided. As a result, the electronic device 1000 (e.g., refer to FIG. 1A) having improved pen sensitivity and touch sensitivity may be provided.

According to some embodiments of the present disclosure described above, the first electrode may include the plurality of divided electrodes that are connected in parallel with each other. As the number of divided electrodes included in the first electrode is increased, the resistance of the first electrode may be decreased. As a result, the sensing sensitivity of the sensor layer may be improved. Also, the shape of each of the divided electrodes may be the same or substantially the same as (e.g., close to or similar to) the bar shape. In this case, the ratio of the area usable for the pattern design in the entire area of one sensing unit may be increased. Thus, the degree of freedom of the pattern design may be improved. Also, as the resistance path corresponding to the divided electrode is shortened, the resistance may be further reduced. In this case, a frequency range (e.g., a bandwidth) applicable to the signal provided to the sensor layer 200 may be more easily secured. Thus, the degree of freedom of the frequency selection may be improved.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. An electronic device comprising:
   a substrate;
   a circuit layer on the substrate, and comprising a transistor;
   a light emitting element layer on the circuit layer, and comprising a light-emitting element electrically connected to the transistor; and
   a sensor layer on the light emitting element layer, and comprising:
   first sensing electrodes extending in a first direction;
   second sensing electrodes extending in a second direction crossing the first direction; and
   first electrodes extending in the first direction,
   wherein one first sensing electrode among the first sensing electrodes comprises at least two adjacent first sub-electrodes electrically connected to each other,
   wherein another first sensing electrode among the first sensing electrodes comprises at least two other adjacent first sub-electrodes electrically connected to each other,
   wherein one first electrode among the first electrodes comprises at least four adjacent second sub-electrodes electrically connected to each other,
   wherein the at least two adjacent first sub-electrodes and the at least two other adjacent first sub-electrodes overlap with the at least four adjacent second sub-electrodes, and
   wherein the one first sensing electrode is electrically connected to a first pad, the another first sensing electrode is electrically connected to a second pad, and the one first electrode is electrically connected to a third pad.

2. The electronic device of claim 1, wherein the sensor layer further comprises:
   a first trace line electrically connected to the one first sensing electrode and the first pad;
   a second trace line electrically connected to the another first sensing electrode and the second pad; and
   a third trace line electrically connected to the at least four adjacent second sub-electrodes and the third pad.

3. The electronic device of claim 2, wherein the sensor layer further comprises a loop trace line electrically connected to all of the first electrodes.

4. The electronic device of claim 3, wherein the sensor layer further comprises:
   a fourth pad electrically connected to a first end of the loop trace line; and
   a fifth pad electrically connected to a second end opposite to the first end of the loop trace line.

5. The electronic device of claim 4, wherein the first pad, the second pad, and the third pad are located between the fourth pad and the fifth pad.

6. The electronic device of claim 4, wherein, in a charging driving mode, one of the third pad, the fourth pad, or the fifth pad is configured to receive a first signal, and another one of the third pad, the fourth pad, or the fifth pad is configured to receive a second signal.

7. The electronic device of claim 6, wherein the second signal has a reverse phase signal of the first signal.

8. The electronic device of claim 1, wherein the sensor layer further comprises fourth pads electrically connected to some of the second sensing electrodes, and fifth pads electrically connected to others of the second sensing electrodes.

9. The electronic device of claim 8, wherein the first pad, the second pad, and the third pad are located between the fourth pads and the fifth pads.

10. The electronic device of claim 8, wherein, in a mutual capacitance detection mode, the first pad is configured to receive a transmission signal, and the fourth pads and the fifth pads are configured to transmit a reception signal.

11. An electronic device comprising:
a substrate;
a circuit layer on the substrate, and comprising a transistor;
a light emitting element layer on the circuit layer, and comprising a light-emitting element electrically connected to the transistor; and
a sensor layer on the light emitting element layer, and comprising:
a first-first sensing electrode extending in a first direction;
a first-second sensing electrode spaced from the first-first sensing electrode in a second direction crossing the first direction, and extending in the first direction;
a second sensing electrode extending in the second direction, and crossing the first-first sensing electrode and the first-second sensing electrode; and
a first electrode extending in the first direction, and overlapping with the first-first sensing electrode and the first-second sensing electrode.

12. The electronic device of claim 11, wherein the first-first sensing electrode comprises first sub-electrodes, the first-second sensing electrode comprises second sub-electrodes, and the first electrode comprises third sub-electrodes, and
wherein a number of the third sub-electrodes is greater than a number of the first sub-electrodes.

13. The electronic device of claim 12, wherein the sensor layer further comprises:
a first trace line electrically connected to the first sub-electrodes;
a second trace line electrically connected to the second sub-electrodes; and
a third trace line electrically connected to the third sub-electrodes.

14. The electronic device of claim 13, wherein the sensor layer further comprises a loop trace line electrically connected to the third sub-electrodes, and
wherein the first trace line, the second trace line, and the third trace line are located between a first portion of the loop trace line and a second portion of the loop trace line.

15. The electronic device of claim 11, wherein the sensor layer further comprises a first dummy pattern insulated with the first-first sensing electrode and the first-second sensing electrode, wherein each of the first-first sensing electrode and the first-second sensing electrode comprises first patterns, and a first bridge pattern electrically connected to the first patterns,
wherein at least one first pattern of the first patterns comprises a first portion, a second portion opposite to the first portion, and a third portion connected to an end of the first portion and an end of the second portion,
wherein the first dummy pattern is located between the first portion and the second portion,
wherein the first electrode overlaps with the first dummy pattern, and the first and second portions of the at least one first pattern,
wherein the first electrode and the first bridge pattern are located at a first layer, and
wherein the first patterns, the second sensing electrode, and the first dummy pattern are located at a second layer different from the first layer.

16. The electronic device of claim 15, wherein the first dummy pattern is entirely surrounded by an opening defined by the first, second, and third portions of the at least one first pattern.

17. The electronic device of claim 15, wherein the first dummy pattern comprises patterns, and the patterns are entirely surrounded by one opening defined by the first, second, and third portions of the at least one first pattern.

18. The electronic device of claim 17, wherein the patterns are electrically floated to be electrically separated from each other.

19. An electronic device comprising:
a pen; and
a panel configured to detect an input provided by the pen, wherein the panel comprises:
a display layer; and
a sensor layer on the display layer, and comprising:
a first-first sensing electrode extending in a first direction;
a first-second sensing electrode spaced from the first-first sensing electrode in a second direction crossing the first direction, and extending in the first direction;
a second sensing electrode extending in the second direction, and crossing the first-first sensing electrode and the first-second sensing electrode; and
a first electrode extending in the first direction,
wherein the first-first sensing electrode comprises at least two adjacent first sub-electrodes electrically connected to each other,
wherein the first-second sensing electrode comprises at least two adjacent second sub-electrodes electrically connected to each other,
wherein the first electrode comprises at least four adjacent third sub-electrodes electrically connected to each other,
wherein the at least two adjacent first sub-electrodes and the at least two adjacent second sub-electrodes overlap with the at least four adjacent third sub-electrodes, and
wherein the first-first sensing electrode is electrically connected to a first pad, the first-second sensing electrode is electrically connected to a second pad, and the first electrode is electrically connected to a third pad.

20. The electronic device of claim 19, wherein the sensor layer further comprises: a first trace line electrically connected to the at least two adjacent first sub-electrodes and the first pad; a second trace line electrically connected to the at least two adjacent second sub-electrodes and the second pad; a third trace line electrically connected to the at least four adjacent third sub-electrodes and third pad; and a loop trace line electrically connected to the at least four adjacent third sub-electrodes, and wherein the first trace line, the second trace line, and the third trace line are located between a first portion of the loop trace line and a second portion of the loop trace line.

* * * * *